(12) United States Patent
Nakamura et al.

(10) Patent No.: US 7,101,440 B2
(45) Date of Patent: Sep. 5, 2006

(54) EJECTING METHOD AND EJECTING APPARATUS

(75) Inventors: Shinichi Nakamura, Okaya (JP); Yoshiaki Yamada, Shimasuwa-machi (JP); Tsuyoshi Kitahara, Matsumoto (JP); Satoru Katagami, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 128 days.

(21) Appl. No.: 10/301,917

(22) Filed: Nov. 22, 2002

(65) Prior Publication Data
US 2003/0151637 A1   Aug. 14, 2003

(30) Foreign Application Priority Data
Nov. 28, 2001   (JP)   ............................... 2001-362739

(51) Int. Cl.
B05C 5/02 (2006.01)
B41J 2/07 (2006.01)
B41J 2/145 (2006.01)
B05D 1/26 (2006.01)

(52) U.S. Cl. ...................... 118/663; 118/664; 118/665; 118/712; 118/315; 347/2; 347/13; 347/43; 347/47

(58) Field of Classification Search ................ 118/663, 118/664, 665, 712, 313, 315, 323; 347/2, 347/12, 13, 43, 47
See application file for complete search history.

(56) References Cited

U.S. PATENT DOCUMENTS 6,010,205 A   1/2000   Billet
6,145,981 A   11/2000  Akahira et al.
6,364,450 B1 *  4/2002  Yamaguchi et al. .......... 347/33
6,394,579 B1 *  5/2002  Boyd et al. .................... 347/47
6,419,746 B1 *  7/2002  Banno et al. ................ 118/323
6,645,029 B1 *  11/2003 Akahira ........................ 445/24
6,667,795 B1 *  12/2003 Shigemura ................... 349/187

FOREIGN PATENT DOCUMENTS

| EP | 0 832 745 A2 | 4/1998 |
| JP | A-09-039220 | 2/1997 |
| JP | A-9-49920 | 2/1997 |
| JP | A 9-300664 | 11/1997 |
| JP | A-10-260307 | 9/1998 |
| JP | A 2001-330720 | 11/2001 |
| KR | 202728 | 3/1999 |

* cited by examiner

Primary Examiner—Laura Edwards
(74) Attorney, Agent, or Firm—Oliff & Berridge, PLC

(57) ABSTRACT

In an ink jet apparatus for manufacturing a color filter 1, ink jet heads 22 having a plurality of nozzle 27 are disposed in a linear manner. Filter element member is ejected to a motherboard 12 from a plurality of nozzles 27 four times so as to form the filter element 3 in a predetermined thickness. By doing this, it is possible to prevent difference in the thickness in a plurality of the filter elements 3 and to equalize light transparency in planar manner. Thus, in an ejecting apparatus, a color filter can be formed in more common way at low cost and more efficiently. Also, it is possible to provide an ejecting apparatus which can equalize factors such as electrooptical characteristics of the electrooptical members, color displaying characteristics by the liquid crystal apparatuses, and illuminating characteristics by an EL surface.

23 Claims, 48 Drawing Sheets

STRIPE

MOSAIC

DELTA

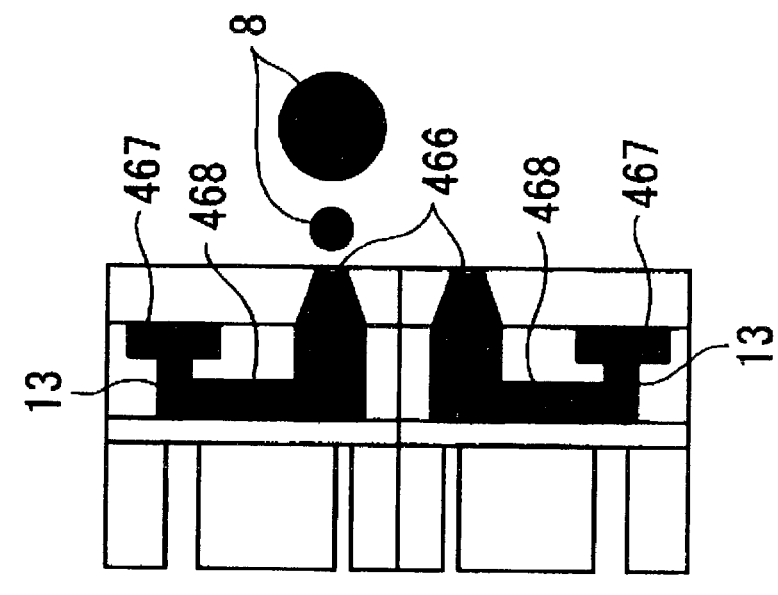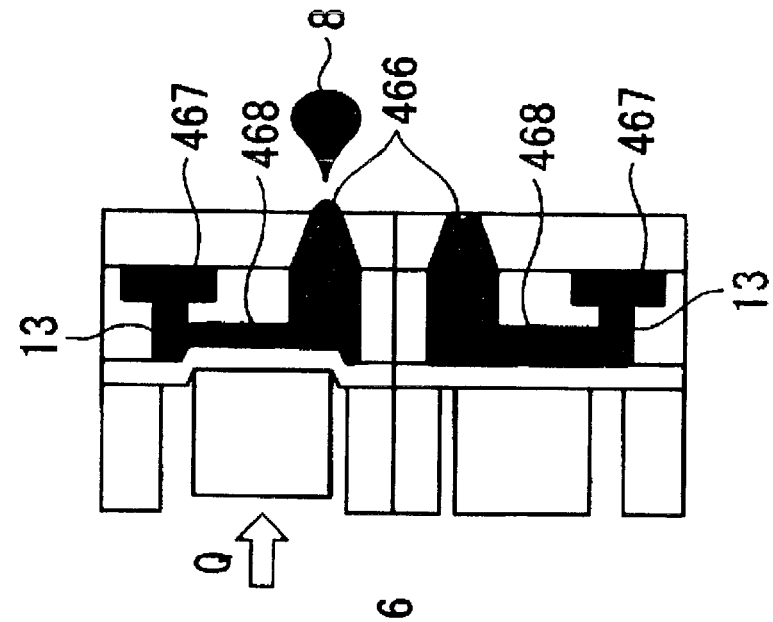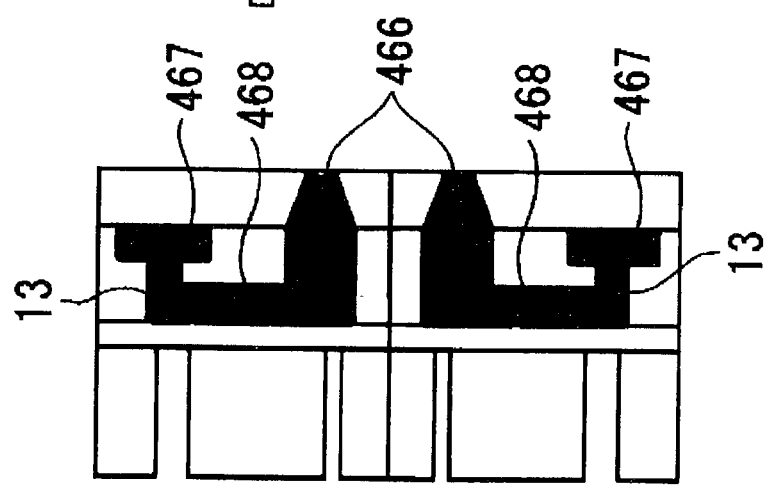

EJECTING METHOD AND EJECTING APPARATUS

BACKGROUND OF THE INVENTION

1. Field of the Invention

The present invention relates to an ejecting method for ejecting fluid liquid material and relates to an apparatus therefore. Also, the present invention relates to an electrooptical apparatus such as a liquid crystal apparatus, an electroluminescent apparatus (hereinafter called an EL apparatus), an electrophoretic apparatus, and a plasma display panel apparatus (hereinafter called a PDP apparatus). Also, the present invention relates to a manufacturing method for an electron emission apparatus for manufacturing electrooptical apparatuses and relates to a manufacturing apparatus therefore. Also, the present invention relates to a color filter which is used in electrooptical apparatus, and to a manufacturing method for the color filter, and to a manufacturing apparatus therefore. Furthermore, the present invention relates to an electrooptical member, a semiconductor apparatus, an optical member, a device having a base member such as a reagent inspection member, a manufacturing apparatus for the device having the base member, and the manufacturing apparatus therefore.

2. Description of Related Art

Recently, display apparatuses which are electrooptical apparatuses such as liquid display apparatuses, and an EL apparatuses are commonly used for display sections in electronic devices such as mobile phones, a mobile computers, etc. Also, recently, it is more common for full color display operation to be performed by the display apparatuses. For example, full color display operation by a liquid crystal apparatus is performed by passing a light which is modulated by a liquid crystal layer through a color filter. The color filter is formed by disposing color filter elements in a dot form, such as those of R (red), G (green), and B (blue), on a surface of a base board which is made from a glass member or a plastic member in a predetermined disposition method such as stripe-disposition, delta-disposition, and mosaic disposition.

Also, in full color display operation by an EL apparatus, EL luminescent layers such as those of R (red), G (green), and B (blue) in dot form are disposed on a surface of the base board made of a glass member or a plastic member in a predetermined disposition such as stripe-disposition, delta-disposition, and mosaic disposition. Consequently, these EL luminescent layers are sandwiched by a pair of electrodes; thus a picture element pixel is formed. By controlling voltage which is applied to these electrodes for each picture element pixel, these picture element pixels are illuminated in an intended color; thus, full color display operation is realized.

Conventionally, it has been known that photolithography methods may be used for performing a patterning operation on color filter elements such as those of R (red), G (green), and B (blue) of the color filter and a patterning operation for color picture element pixels such as those of R (red), G (green), and B (blue) of the EL apparatus. However, there were problems in that manufacturing processes of the photolithography method were complicated and large quantities of coloring materials and photoresist were consumed; thus, manufacturing cost increased.

In order to solve this problem, a method was proposed for forming a filament which is disposed in a dot array form and an EL luminescent layer by ejecting a filter element member and EL luminescent member in a dot form by an ink jet method.

Here, a method for forming a filament and an EL luminescent layer in dot form by an ink jet method is explained. Here, a plurality of filter elements 303 which are disposed in dot form as shown in FIG. 50B are formed in an inner region of a plurality of panel areas 302 which are disposed on a surface of a large base board which is made from a glass member or a plastic member such as a motherboard 301 as shown in FIG. 50A by ink jet method. In this case, as shown in FIG. 50C, for example, a plurality of main scanning operations (twice in FIG. 50C) are performed on one piece of panel area 302 by an ink jet head 306 as a liquid drop ejecting head having a nozzle array 305 containing a plurality of nozzles 304 in arrays as shown by arrows A1 and A2 in FIG. 50B. During the main scanning operation, by ejecting a filter material such as an ink from a plurality of nozzles selectively, a filter element 303 is formed in an intended position.

The filter element 303 is formed by disposing colors such as those of R, G, and B in a preferred disposition such as stripe-disposition, delta-disposition, and mosaic disposition as explained above. By doing this, in an ink ejecting process by an ink jet head 306 as shown in FIG. 50B, the ink jet head 306 for ejecting colors such as those of R, G, and B are provided for three colors in advance. Consequently, by using these ink jet heads 306 one by one, three-color disposition of R, G, and B is performed on one motherboard 301.

However, generally, the amount of ink which is ejected by a plurality of nozzles 304 contained in a nozzle array 305 of the ink jet head 306 varies among a plurality of nozzles. This is caused by ink ejection characteristics shown in FIG. 51A in which ink ejection amount is maximum in a position which corresponds to two ends of the nozzle array 305, and ink ejection amount is less in a middle position of the two ends of the nozzle array 305. Ink ejection amount is least in a positions between the two ends of the nozzle array 305 and the middle position thereof Therefore, as shown in FIG. 50B, when a filter element 303 is formed by an ink jet head 306, dense streaks are formed on positions P1 and/or P2 corresponding to both ends of the ink jet head 306 as shown in FIB. 51B. Thus, there is a problem in that planar translucency of the color filter becomes non-uniform.

On the other hand, a plurality of panel areas 302 is formed on the motherboard 301, and it is proposed that a filter element 303 can be formed efficiently when the ink jet head is disposed in an overall area in width dimension of the motherboard 301 crossing a main scanning direction of the ink jet head by using a longitudinal ink jet head. However, when a different size of motherboard 301 is used according to the panel area 302, an ink jet head having a different size is necessary for each of the cases; thus, the cost increases.

SUMMARY OF THE INVENTION

The present invention was made in consideration of the above-mentioned problems. An object of the present invention is to provide an ejecting method for forming filter elements efficiently with low manufacturing cost in a more common way by using a liquid drop ejecting head such as an ink jet, and an apparatus therefor, an electrooptical apparatus and manufacturing method therefor and a manufacturing apparatus therefor, a color filter and manufacturing method therefor and a manufacturing apparatus therefor, a device having a base member, and controlling method therefor and a manufacturing apparatus therefor.

(1) The ejecting apparatus is characterized in comprising:

a liquid drop ejecting head having a plurality of nozzles aligned for ejecting a fluid liquid material onto a substance to receive the ejection;

a holding member for holding a surface on which a plurality of the nozzles of the liquid drop ejecting head for ejecting the liquid material are disposed in line so as to face a surface of the substance to receive the ejection having a space between the surface which has the nozzles and the surface of the substance to receive the ejection; and a moving member which moves at least one of the holding member or the substance to receive the ejection relatively such that the liquid drop ejecting head is along the surface of the substance to receive the ejection, wherein an array of the nozzles which are disposed on each of the liquid drop ejecting heads are disposed in a direction which crosses the substance to receive the ejection diagonally to a direction of relative movement to the substance to receive the ejection.

In the present invention, a liquid drop ejecting head having a plurality of nozzles aligned for ejecting a fluid liquid material is moved relatively along a surface of a substance to receive the ejection such that a surface on which these liquid drop ejecting heads are disposed face a surface of the substance to receive the ejection having a space therebetween. The same liquid material is ejected to the substance to receive the ejection from each nozzle of a plurality of the liquid drop ejecting heads. The nozzle array which is disposed on each of the liquid drop ejecting head is disposed in a first direction which crosses a direction diagonally in which the nozzle array is moved relatively to the substance to receive the ejection By doing this, the same liquid material is ejected from nozzles of a plurality of the liquid drop ejecting head which are disposed in line. Therefore, it is possible to eject a liquid material in a wide range by using an ordinary and common specification liquid drop ejecting head. Therefore, it is possible to reduce costs by using conventional common specification liquid drop ejecting heads instead of a special design liquid drop ejecting head. In addition, by adjusting the number of the liquid drop ejecting heads which are supposed to be disposed in line, it is possible to set the liquid drop ejecting head according to the positions to which the liquid material is ejected. Thus, the liquid drop ejecting head can be used more commonly.

Also, in the present invention, it is preferable that a plurality of the liquid drop ejecting heads be disposed in a second direction which crosses the substance to receive the ejection diagonally to a direction of relative movement to the substance to receive the ejection. By doing this, a plurality of the liquid drop ejecting heads are disposed so as to be diagonal to a main scanning direction in which the liquid drop ejecting head is moved along a surface of the substance to receive the ejection. For example, when nozzles are disposed on a line, a pitch such as an interval at which the liquid material is ejected becomes narrower than a pitch between the nozzles. For example, the substance to receive the ejection to which a liquid material is ejected is used for a display apparatus, and the displaying condition becomes finer. Furthermore, an interference caused between neighboring liquid drop ejecting heads can be prevented; thus, it is possible to make the apparatus smaller.

Also, in the present invention, it is preferable that the shape of a plurality of the liquid drop ejecting heads be substantially the same as each other. By doing this, it is possible to make the liquid drop ejecting heads correspond to the area to which the liquid material is ejected. Thus, the structure of the apparatus becomes simpler, and the productivity increases, and the cost can be reduced.

In the present invention, it is preferable that each one of a plurality of the liquid drop ejecting heads have the same number of nozzles. By doing this, each of a plurality of the liquid drop ejecting heads has the same number of nozzles, ant it is therefore easy to delineate a predetermined pattern such as a stripe, a mosaic, and delta for a disposition pattern for a plurality of liquid drop ejecting heads.

In the present invention, it is preferred that each one of a plurality of the liquid drop ejecting heads have nozzles which are located at the same corresponding position. By doing this, it is preferable that a position in which nozzles of a plurality of the liquid drop ejecting head are formed in the same positions among the liquid drop ejecting heads. By doing this, it is easy to delineate a predetermined pattern such as a stripe, a mosaic, and delta for a disposition pattern for a plurality of liquid drop ejecting heads.

Furthermore, it is preferable that each of a plurality of the liquid drop ejecting heads have the nozzles aligned in an array in nearly and equal interval. By doing this, the nozzles of a plurality of the liquid drop ejecting head are aligned in an array in nearly equal interval. Therefore, it is easy to delineate a predetermined pattern such as a stripe, a mosaic, and a delta for a disposition pattern for a plurality of liquid drop ejecting heads.

Also, it is preferable that the liquid drop ejecting heads be formed in nearly a rectangular shape along a direction of the nozzles which are disposed. By doing this, the liquid drop ejecting head is formed in nearly a rectangular shape along a direction of the nozzles which are disposed; therefore, it is possible to realize a smaller liquid drop ejecting head, and reduce interference of the liquid drop ejecting head by other structures. Therefore, it is possible to realize a smaller liquid drop ejecting head more easily.

Also, in the present invention, it is preferable that a plurality of the liquid drop ejecting heads be disposed in the second direction which diagonally crosses a direction in which the substance to receive the ejection moves relatively such that the nozzles are disposed nearly parallel with each other. By doing this, a plurality of the liquid drop ejecting heads are moved relatively along a surface of the substance to receive the ejection so as to move along a direction in which the liquid drop ejecting head moves relatively along a surface of the substance to receive the ejection crosses diagonally a direction in which the nozzles are disposed nearly linearly. Therefore, the nozzles are disposed diagonally to a main scanning direction in which a plurality of the liquid drop ejecting heads moves along a surface of the substance to receive the ejection. Thus, a pitch with such an interval at which the liquid material is ejected becomes narrower than a pitch between the nozzles. For example, the substance to receive the ejection to which the liquid material is ejected is used for a display apparatus, and displaying condition becomes finer. Furthermore, an interference caused between neighboring liquid drop ejecting heads can be prevented; thus, it is possible to minimize the size of the apparatus.

Also, in the present invention, it is preferable that the array of the nozzles of a plurality of the liquid drop ejecting head be disposed in a direction which diagonally crosses a direction in which the nozzles move relatively to the substance to receive the ejection, and the array of the nozzles of a plurality of the liquid drop ejecting head are disposed so as to be parallel with each other. By doing this, a plurality of the liquid drop ejecting heads and the nozzles are disposed in a direction which crosses diagonally a direction in which the liquid drop ejecting heads are moved relatively along a surface of the substance to receive the ejection. Thus, a pitch at such an interval at which the liquid material is ejected becomes narrower than a pitch between the nozzles. For example, the substance to receive the ejection to which the liquid material is ejected is used for a display apparatus, and displaying condition becomes finer. Furthermore, an interference caused between neighboring liquid drop ejecting heads can be prevented; thus, it is possible to minimize the size of the apparatus. Also, a plurality of ejection areas to which the liquid material is ejected are formed easily in one region; therefore, liquid material ejecting efficiency is improved. Also, it is possible to eject the liquid material to one region in a multiple manner from the liquid drop ejecting head; thus, ejection amount can be equalized in the ejection area easily.

Also, in the present invention, it is preferable that a plurality of the liquid drop ejecting heads neighboring each other disposed in a direction of a relative movement to the substance to receive the ejection so that portions of the liquid drop ejecting heads overlaps each other. By doing this, the neighboring liquid drop ejecting head are disposed such that a portion of the liquid drop ejecting heads overlap each other to a main scanning direction in which the liquid drop ejecting heads are moved along a surface of the substance to receive the ejection. Therefore, interference caused between neighboring liquid drop ejecting heads can be reliably prevented; thus, it is possible to minimize the size of the apparatus.

Also, in the present invention, it is preferable that a plurality of the liquid drop ejecting heads be disposed in a staggered manner in a plurality of arrays. By doing this, the liquid drop ejecting heads neighboring each other do not interfere with each other; thus, there is no area to which the liquid material is not ejected between the liquid drop ejecting heads. Thus, it is possible to obtain desirable ejection of the liquid material in a continuous manner.

Also, in the present invention, it is preferable that the ejecting apparatus have an ejection detecting device for detecting the liquid material which is ejected from the nozzle. By doing this, by detecting the ejection of the liquid material from the nozzle by the ejection detecting device, it is possible to prevent uneven ejection of the liquid material so as to obtain desirable ejection of the liquid material stably.

Also, in the present invention, it is preferable that the ejection detecting device detect the ejection of the liquid material in at least one of the steps including a step for ejecting the liquid material from the nozzle to the substance to receive the ejection and a previous step, and a consecutive step. By doing this, by detecting the ejection of the liquid material in at least one of the steps including a step for ejecting the liquid material from the nozzle to the substance to receive the ejection and a previous step, and a consecutive step, it is possible to detect the ejection condition of the liquid material in at least one of the steps including a step for ejecting the liquid material from the nozzle to the substance to receive the ejection and a previous step, and a consecutive step. Therefore, it is possible to detect the ejection condition of the liquid material just before the ejection or immediately after the ejection. Therefore, it is possible to acknowledge the ejection condition of the liquid material.

(2) The present invention is preferable for manufacturing an electrooptical apparatus by using a liquid material containing an EL luminescent member as a liquid material to be ejected and ejecting the liquid material to a substance to receive the ejection such as a base board so as to form the EL luminescent layer.

(3) The present invention is preferable for manufacturing an electrooptical apparatus by using a liquid material such as a color filter member as a liquid material to be ejected and ejecting the liquid material to one of a pair of the base boards for sandwiching the liquid crystal as a substance to receive the ejection so as to form the color filter.

(4) The present invention is preferable for manufacturing a device having a base member by ejecting a fluid liquid material as the substance to receive the ejection.

According to the present invention, a plurality of liquid drop ejecting heads having a plurality of nozzles aligned for ejecting a liquid material is moved relatively along a surface of a substance to receive the ejection such that a surface on which these nozzles are disposed face a surface of the substance to receive the ejection having a space therebetween. The same liquid material is ejected to the substance to receive the ejection from each nozzle of a plurality of the liquid drop ejecting head. Therefore, it is possible to eject a liquid material in a wide range by using an ordinary and common specification liquid drop ejecting head. Therefore, it is possible to reduce cost by using a conventional common specification liquid drop ejecting head instead of a special design liquid drop ejecting head. In addition, by adjusting the number of the liquid drop ejecting heads which are supposed to be disposed in line, it is possible to set the liquid drop ejecting heads according to the positions at which the liquid material to be ejected. Thus, the liquid drop ejecting head can be used more commonly.

BRIEF DESCRIPTION OF THE DRAWINGS

FIG. 12A is a perspective view of an internal part of which is shown. FIG. 12B is a cross section viewed along a line J—J in FIG. 12A.

FIGS. 29A to 29C are showing ejecting movement of the filter element member by the ink jet head.

FIG. 33A is a plan view and FIG. 33B is a cross section viewed along a line X—X shown in FIG. 33A.

FIGS. 34S1 to 34S7 are cross sections for explaining the manufacturing processes for the color filter.

FIG. 41A is a plan view and FIG. 41B is a cross section viewed along a line B—B shown in FIG. 41A.

DETAILED DESCRIPTION OF THE INVENTION (Explanation 1 for a Manufacturing Method for a Color Filter and Apparatus Therefor).

Figure 5A:
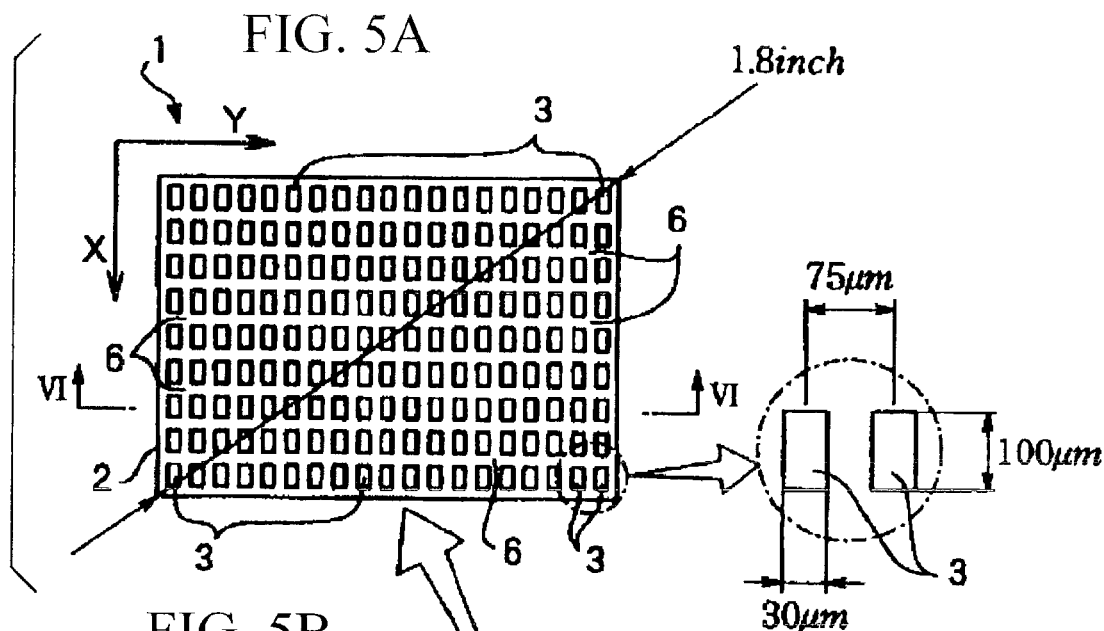
FIGS. 5A and 5B are plan views showing an embodiment of a color filter according to the present invention and an embodiment of a motherboard which is a base for the color filter.

Hereinafter, a basic manufacturing method for a color filter of the present invention and a manufacturing apparatus therefor are explained. Firstly, before explaining the manufacturing method and a manufacturing apparatus using thereof, a color filter which is manufactured by using the above-mentioned manufacturing method is explained. FIG. 5A is a plan view showing an embodiment of the color filter. Also, FIG. 6D is a cross section viewed along a line IV—IV on FIG. 5A.

In a color filter 1 according to the present embodiment, a plurality of filter elements 3 are formed on a surface of a square base board 2 (which can be called a "base member" in the present invention) which is made from a glass member or a plastic member in a dot pattern such as dot matrix condition in the present embodiment. Furthermore, as shown in FIG. 6D, the color filter 1 is formed by layering a protecting layer 4 on the filter element 3. Here, FIG. 5A is a plan view of the color filter 1 from which the protecting layer 4 is removed.

Figure 7A:
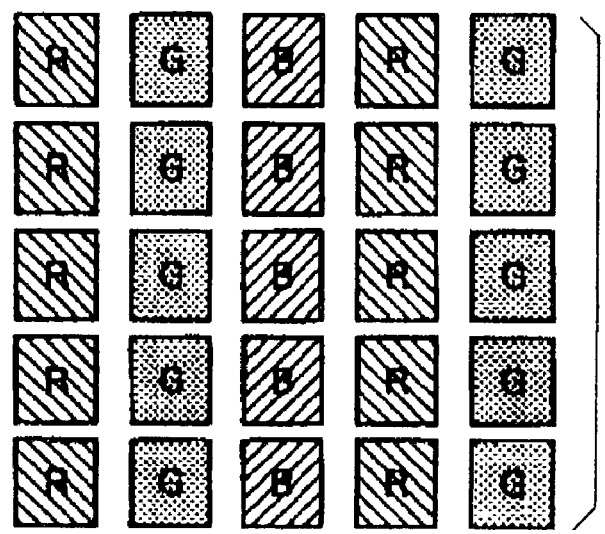
FIGS. 7A to 7C are views showing disposition examples of picture element pixels for three colors such as those of R, G, and B in the color filter.
Figure 7B:
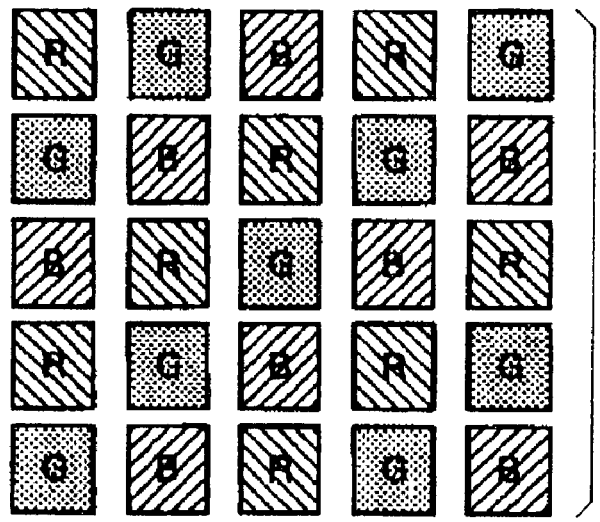
Figure 7C:
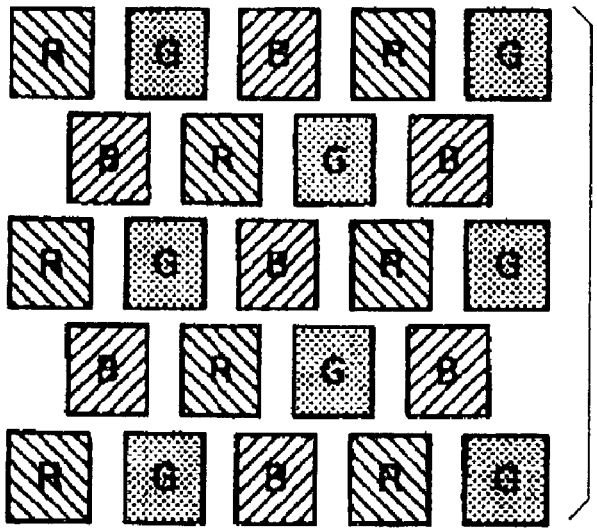

The filter element 3 is separated by a bulkhead 6 which has a grid pattern which is formed by a non-translucent resin member so as to bury a plurality of square regions which are disposed in a dot matrix manner by a color member. These filter elements 3 are one of the color members such as those of R (red), G (green), or B (blue), and filter elements 3 having each colors are disposed in a predetermined array arrangement. For such disposition, for example, stripe-disposition (shown in FIG. 7A), mosaic disposition (shown in FIG. 7B), and delta disposition (shown in FIG. 7C) are known. Here, a word "bulkhead" is used as a meaning of "bank". The bank indicates a side surface which protrudes from a surface of the base board in nearly orthogonal manner. It is acceptable if a side surface is disposed at more than 90 degrees or less than 90 degrees.

The stripe disposition is defined as a disposition in which color is the same in the vertical array of the matrix. The mosaic disposition is defined as a disposition in which three filter elements which are disposed on horizontal and vertical lines are three colors such as those of R, G, and B. Furthermore, the delta disposition is defined as a disposition in which the filter elements 3 are disposed in a staggered manner and any combination of the three filter elements which are randomly selected becomes a three color combination of R, G, and B.

Size of the color filter 1 is, for example, 4.57 cm (1.8 inch). Also the size of a piece of a filter element 3 is, for example, 30 μm×100 μm. Also, an element pitch such as an interval between each filter elements 3 is, for example, 75 μm.

When a color filter 1 according to the present embodiment is used for an optical element for performing full-color display operation, three filter elements containing colors such as those of R, G, and B forms a unit as one color pixel. By passing a beam through one of the filter elements such as those of R, G, and B contained in one color pixel or through combined filter elements selectively, the full-color display operation can be performed. In this time, the bulkhead 6 which is made from a not-translucent resin member acts as a black matrix.

Figure 5B:
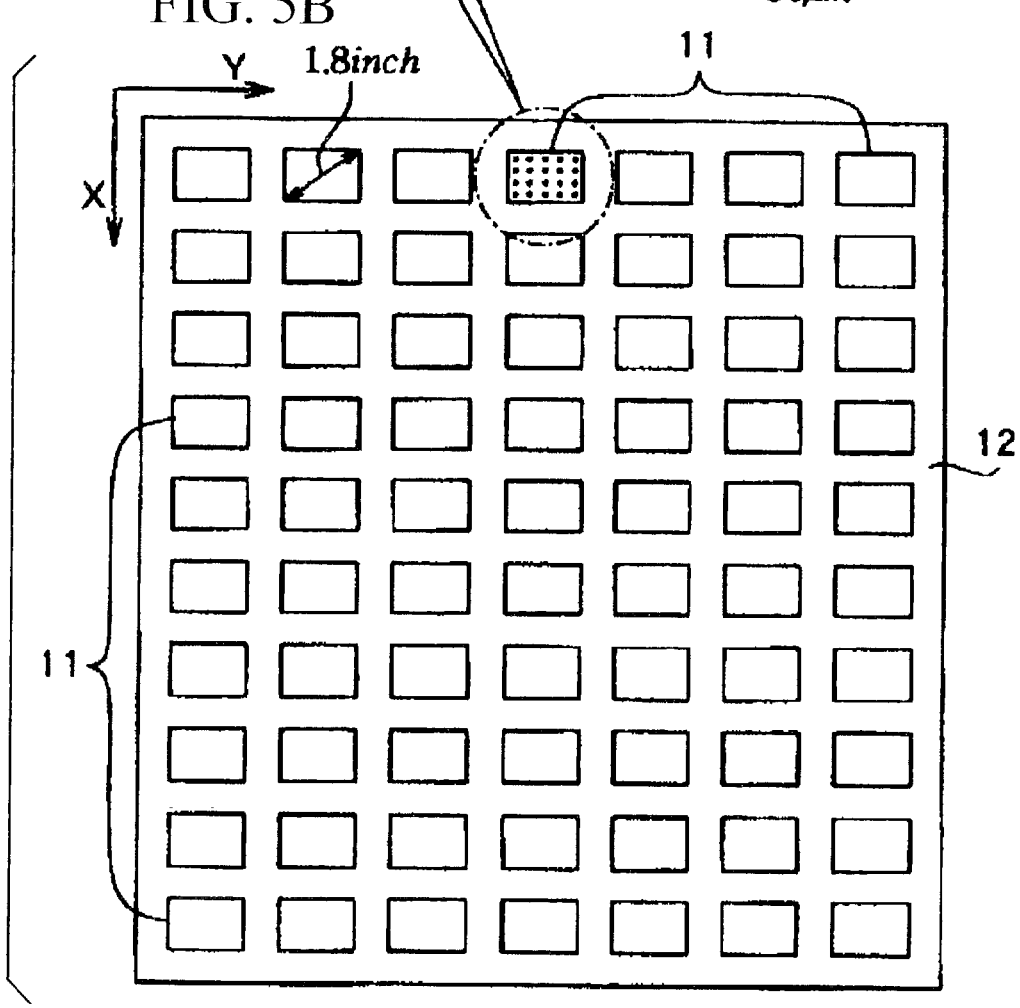

The above-mentioned color filter 1 is obtained by cutting a large area motherboard 12 shown in FIG. 5B into a little pieces. More specifically, a pattern which corresponds to one piece of the color filter 1 is formed on each surface of a plurality of the color filter forming area 11 which are disposed in the motherboard 12. Consequently, around the color filter forming areas 11, cutting grooves are formed. By cutting the motherboard 12 along the cutting grooves, the color filters 1 are cut into pieces.

Hereinafter, a manufacturing method for a color filter shown in 5A and a manufacturing apparatus therefor are explained.

FIGS. 6A to 6D are cross sections showing manufacturing steps according to the manufacturing method for the color filter 1. First, bulkheads 6 which are made from non-translucent resin member are formed on a surface of the motherboard 12 in a grid pattern viewed from an arrow B in the drawing. Hole areas 7 in the grid pattern is a filter element forming area in which the filter elements 3 are formed. Planar dimensions of each of the filter element forming areas 7 which are formed by the bulkheads 6 viewed in an arrow direction B is, for example, 30 μm to 100 μm.

The bulkheads 6 act to prevent the liquid material such as the filter element member 13 which is supplied to the filter element forming areas 7 from flowing and for performing as a black mask. Also, the bulkheads 6 are formed by any kinds of patterning method such as a photolithography method. If necessary, the bulkheads 6 are formed by performing a heating processing so as to sinter it.

Figure 6A:
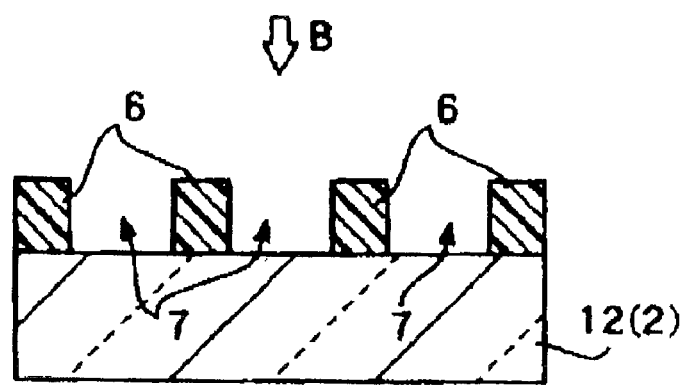
FIGS. 6A to 6D are cross sections graphically showing manufacturing processes for a color filter viewed along line VI—VI in FIG. 5A.
Figure 6B:
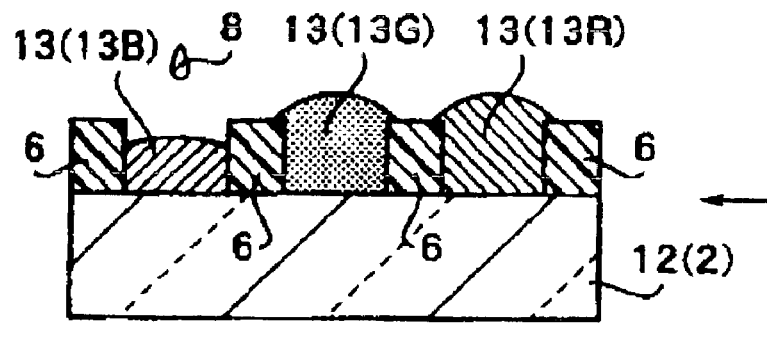

After the bulkheads 6 are formed, as shown in FIG. 6B, each filter element forming areas are buried by the filter element members 13 by supplying liquid drops 8 of the filter element member 13 to each filter element forming areas 7. In FIG. 6B, reference numeral 13R indicates a filter element member having a color of R (red). Reference numeral 13G indicates a filter element member having a color of G (green). Reference numeral 13B indicates a filter element member having a color of B (blue). Here, in the present invention, a liquid drop can also be called an "ink".

Figure 6C:
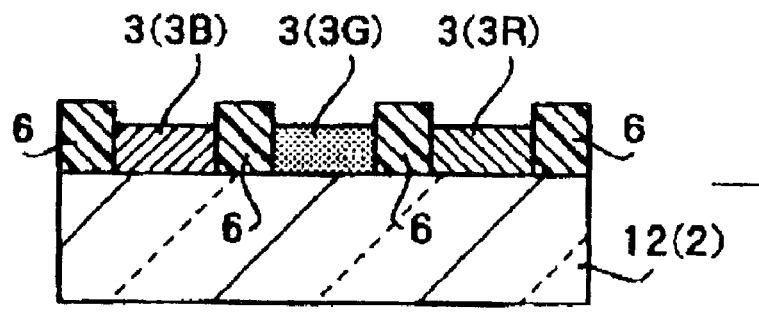
Figure 6D:
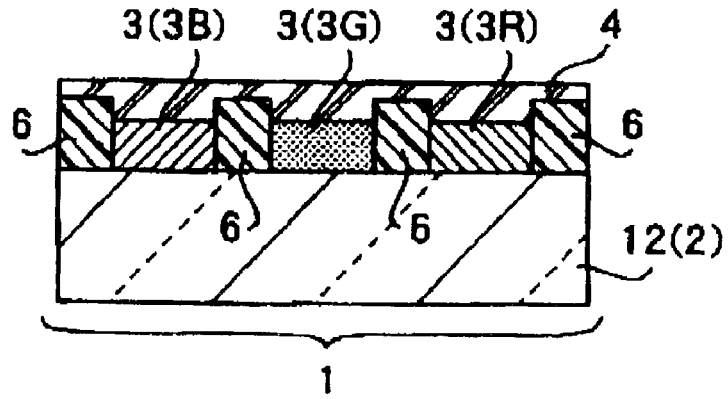

When a predetermined amount of the filter element member 13 is filled in each filter element forming areas 7, a solvent contained in the filter element member 13 is evaporated by heating the motherboard 12 to nearly 70° C. by a heater. By this evaporation, as shown in FIG. 6C, volume of the filter element member 13 decreases, and the filter element member 13 becomes flat. If the volume of the filter element member 13 decreases conspicuously, it is repeated that the liquid drop 8 of the filter element member 13 is supplied and the liquid drop 8 is heated until sufficient thickness is obtained for a color filter 1. By performing the above-explained operations, a solid part of the filter element member 13 remains and ultimately forms a substrate. By doing this, the filter element 3 having each desired color is formed.

After the filter element 3 is formed by the above-explained operations, a predetermined period of heating operation is performed in a predetermined temperature so as to desiccate the filter elements 3 completely. After that, a protecting layer 4 is formed by preferable methods such as spin-coat method, roll-coat method, or ink-jet method. The protecting layer 4 is formed for protecting the filter element 3 and flattening a surface of the color filter 1. Here, in embodiments according to the present invention, a non-translucent resin member for the bulkhead 6 is used for a black matrix. However, translucent resin member for the bulkhead 6 having a shading layer made of a metal such as chrome (Cr) beneath the translucent resin which is larger than the translucent resin is acceptable.

Figure 8:
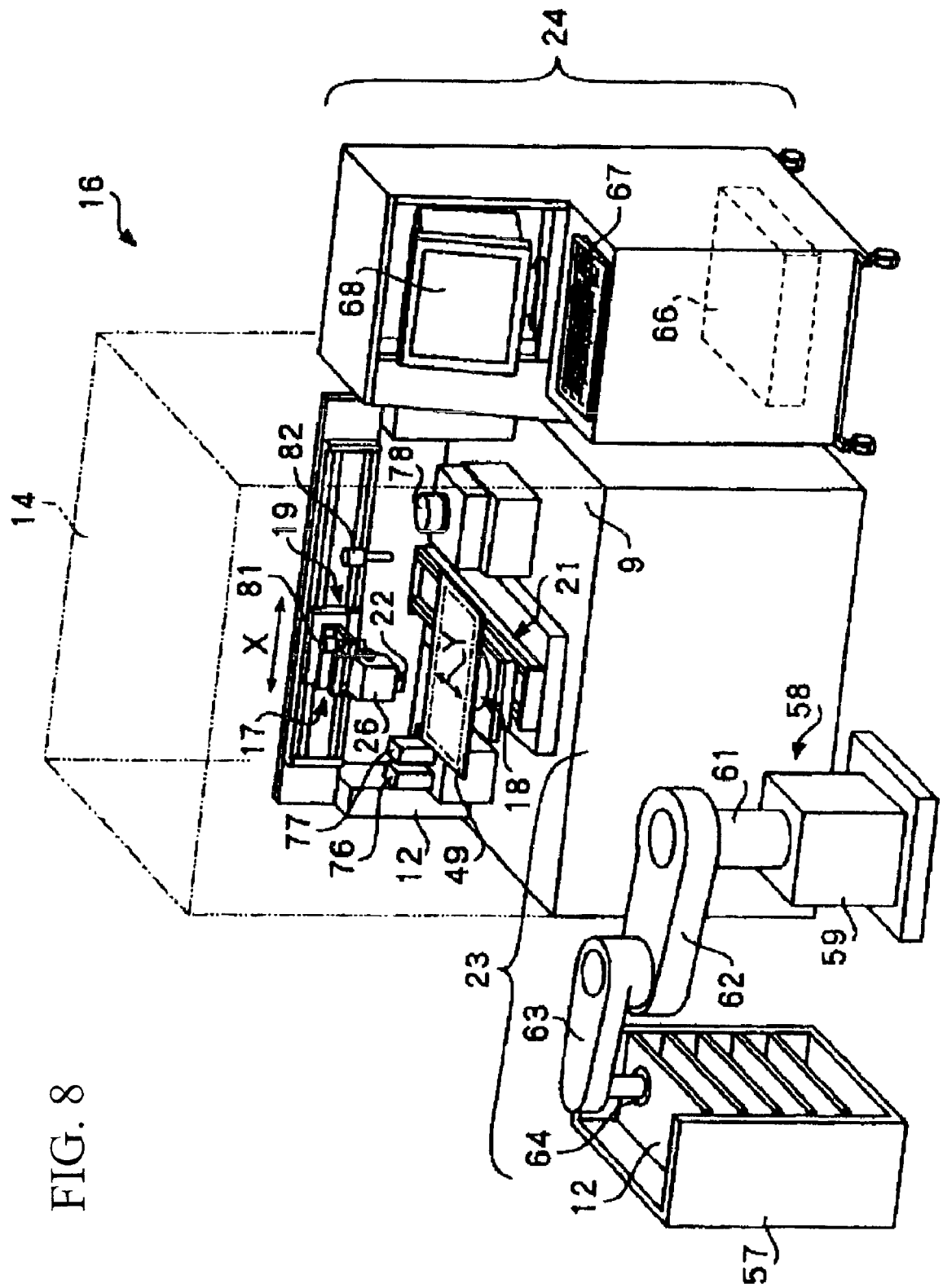
FIG. 8 is a perspective view showing an embodiment of the liquid drop ejecting apparatus which is an important part of a manufacturing apparatus such as the color filter according to the present invention, a manufacturing apparatus for the liquid crystal apparatus according to the present invention, and a manufacturing apparatus for an EL apparatus according to the present invention.

FIG. 8 shows an embodiment of the liquid drop ejecting apparatus for supplying the filter element member 13 as shown in FIG. 6B. The liquid drop ejecting apparatus 16 ejects one color member among R, G, and B, for example R as a liquid drop 8 of an ink onto a predetermined position in each color filter forming areas 11 in the motherboard 12 shown in FIG. 5B and allows them to be fixed thereon. A liquid drop ejecting apparatus for a filter element member 13 for G (green) and a liquid drop ejecting apparatus for a filter element member 13 for B (blue) are prepared respectively. Explanations for these structures are omitted because technical features of those structures are the same as shown in FIG. 8.

In FIG. 8, the liquid drop ejecting apparatus 16 comprises a head unit 26 which is provided with an ink jet head 22 which is used in a liquid drop ejecting head such as a printer, a head position controlling apparatus for controlling the position of the ink jet head 22, a base board position controlling apparatus 18 for controlling the position of the motherboard 12, a main scanning driving apparatus 19 for performing a main scanning movement of the ink jet head 22 to the motherboard 12, a sub-scanning driving apparatus 21 for performing a sub-scanning movement of the ink jet head 22 to the motherboard 12, a base board supplying apparatus 23 for supplying the motherboard 12 to a predetermined position in the liquid drop ejecting apparatus 16, and a controlling apparatus 24 for controlling the overall liquid drop ejecting apparatus 16.

The main scanning driving apparatus 19 for performing the main scanning operation of the head position controlling apparatus 17, a base board position controlling apparatus 18 and an ink jet head 22 to the motherboard 12 and a sub-scanning driving apparatus 21 are disposed on a base 9. Also, these apparatuses are covered by a cover 14 according to the necessity.

Figure 10:
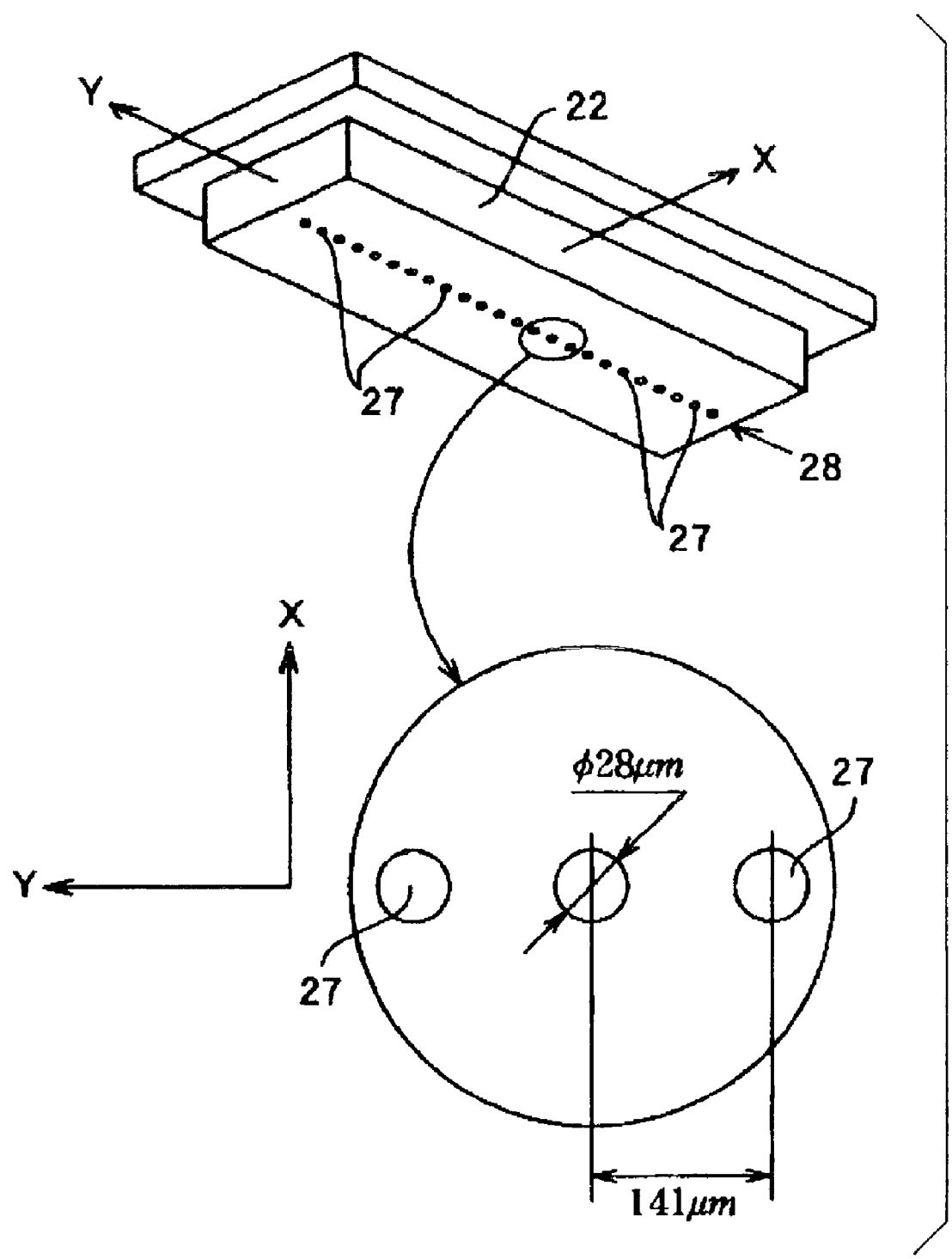
FIG. 10 is an enlarged perspective view showing an ink jet head which is an important part of the apparatus shown in FIG. 9.

For example, as shown in FIG. 10, the ink jet head 22 has a nozzle array 28 containing a plurality of nozzles 27 in an array manner. The number of the nozzles 27 is, for example, 180. Diameter of a hole of the nozzle 27 is 28 μm. Nozzle pitch between the nozzles 27 is, for example, 141 μm. In FIGS. 5A and 5B, a main scanning direction X to the color filter 1 and the motherboard 12 and a sub-scanning direction Y which crosses orthogonally to the main scanning direction X are set as shown in FIG. 10.

Position of the ink jet head 22 is set such that the nozzle array 28 extends in a direction which crosses the main scanning direction X. The filter element member 13 is applied and is fixed onto the predetermined position in the motherboard 12 (see FIG. 5B) by ejecting the ink as a filter element member 13 from a plurality of nozzles 27 selectively during the ink jet head 22 makes parallel movement in the main scanning direction X. Also, the position of the main scanning operation by the ink jet head 22 can be shifted with a predetermined interval by making a parallel movement of the ink jet head 22 in the sub-scanning direction Y by a predetermined interval.

Figure 12A:
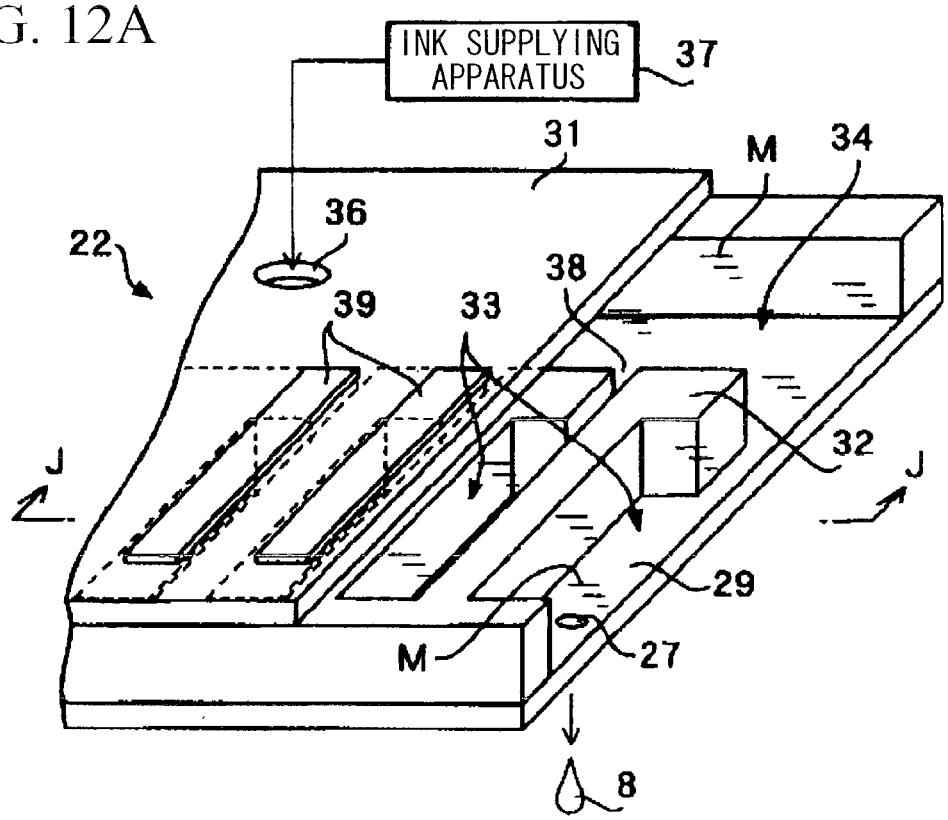
FIGS. 12A and 12B show the internal structure of the ink jet head.
Figure 12B:
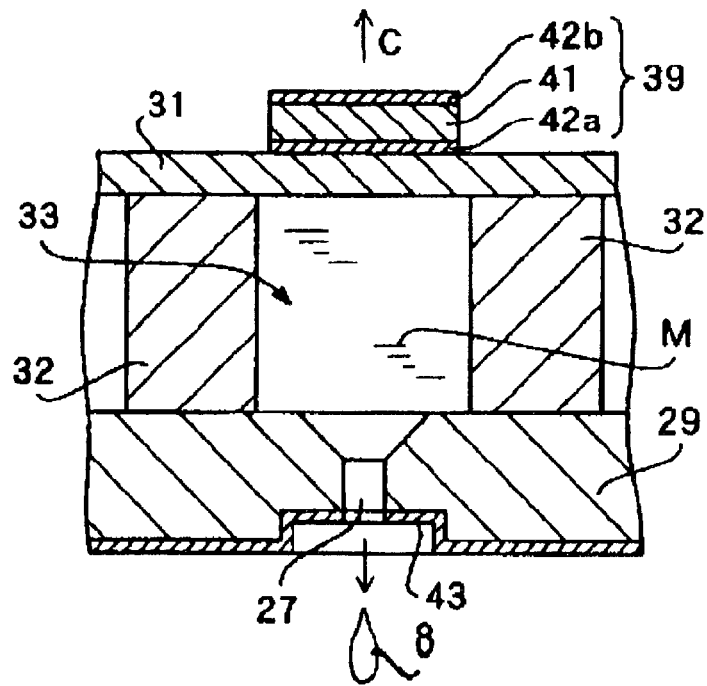

The internal structure of the ink jet head 22 is shown, for example, in FIGS. 12A and 12B. More specifically, the ink jet head 22 comprises a nozzle plate 29 made from a stainless-steel member, a vibrating plate 31 which faces the nozzle plate 29, and a plurality of separating member 32 which connects them. Between the nozzle plate 29 and the vibrating plate 31, a plurality of ink chamber 33 and a liquid pool 34 are formed by the separating members 32. A plurality of ink chambers 33 and the liquid pools 34 are connected via a path 38.

An ink supplying hole 36 is formed in an appropriate position of the vibrating plate 31. An ink supplying apparatus 37 is connected to the ink supplying hole 36. The ink supplying apparatus 37 supplies one color of filter element member M, for example R, G, and B to the ink supplying hole 36. The filter element member M which is supplied there fills the liquid pool 34, and then fills the ink chamber 33 by passing through the path 38.

A nozzle 27 which ejects the filter element member M from the ink chamber 33 in a jet manner is provided to the nozzle plate 29. An ink compressing member 39 is disposed on a surface the vibrating plate 31. On the opposite surface of the vibrating plate 31, the ink chambers 33 are formed. The ink compressing members 39 are formed so as to correspond to the ink chambers 33. As shown in FIG. 12B, the ink compressing member 39 has a piezoelectric element 41 and a pair of electrodes 42a and 42b for sandwiching the piezoelectric element 41. The piezoelectric element 41 makes a deflective transformation so as to protrude outside shown by an arrow C in the drawing by an electric connection between the electrode 42a and the electrode 42b. By doing this, the cubic capacity of the ink chamber 33 increases. Consequently, the filter element member M which corresponds to the increased volume of the ink chamber 33 passes through the path 38 from the liquid pool 34 so as to flow in the ink chamber 33.

Next, when the electric connection to the piezoelectric element 41 is disconnected, the shape of the piezoelectric element 41 and the vibrating plate 31 recovers to an initial shape. By doing this, the cubic capacity of the ink chamber 33 is reset to the initial capacity. Thus, pressure of the filter element member M inside the ink chamber 33 increases and the filter element member M is ejected from the nozzle 27 to the motherboard 12 (see FIG. 5B) in a liquid drop condition. Here, around the nozzle 27, an ink-repellent layer 43 such as Ni-tetrafluoroethylene eutectoid plating layer is formed for preventing flying drop of the liquid drop 8 and preventing the hole of the nozzle 27 from being clogged.

Figure 9:
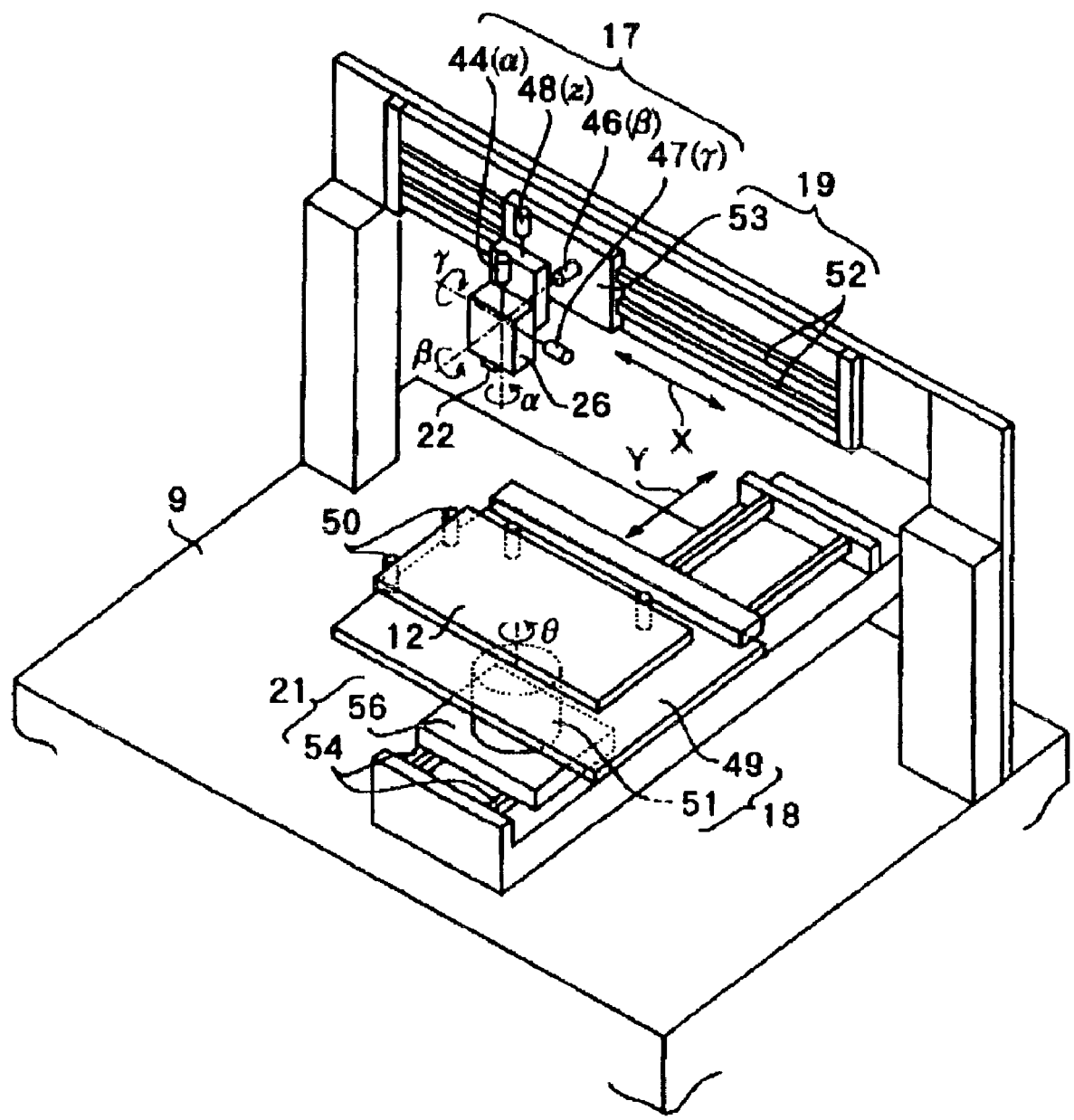
FIG. 9 is an enlarged perspective view showing an important part of the apparatus shown in FIG. 8.

In FIG. 9, a head position controlling apparatus 17 comprises an α motor for rotating the ink jet head 22, β motor 46 for shaking and rotating the ink jet head 22 around an axis which is parallel with the sub-scanning direction Y, a γ motor 47 for shaking and rotating the ink jet head 22 around an axis which is parallel with the main scanning direction X, and a Z motor 48 for making a parallel movement of the ink jet head 22 vertically.

As shown in FIGS. 8 and 9, the base board position controlling apparatus 18 comprises a table 49 for having a motherboard 12 thereon and a θ motor 51 for performing an in-plane rotation of the table 49 as indicated by an arrow θ. Also, as shown in FIGS. 8 and 9, the main scanning driving apparatus 19 comprises an X guide rail 52 which extends in the main scanning direction X and an X slider 53 which contains a linear motor which is driven in a pulsed manner. The X slider 53 makes a parallel movement in the main scanning direction X along the X guide rail 52 when a built-in linear motor is operated.

Also, as shown in FIGS. 8 and 9, the sub-scanning driving apparatus 21 comprises a Y guide rail 54 which extends in the sub-scanning direction Y and a Y slider 56 which contains a linear motor which is driven in a pulse manner. The Y slider 56 moves in a parallel movement in the sub-scanning direction Y along the Y guide rail 54 when a built-in linear motor is operated.

A linear motor which is driven in pulsed manner in the X slider 53 and the Y slider 56 can control rotating angle of the output axis precisely by a pulse signal which is supplied to the motors. Therefore, it is possible to control a position of the ink jet head 22 which is supported by the X slider 53 in the main scanning direction X and a position of the table 49 in the sub-scanning direction Y very precisely. Here, the position of the ink jet head 22 and the table 49 can be controlled not only by a controlling method which uses a pulse motor but also by a feed-back controlling method which uses a servo-motor or any kind of controlling method.

A base board supplying apparatus 23 which is shown in FIG. 8 comprises a base board containing section 57 for containing the motherboard 12 and a robot 58 for transporting the motherboard 12. The robot 58 comprises a base stand 59 which is put on the base surface such as a floor and the ground, a raising/lowering axis 61 on which the base stand 59 is raised and lowered, a first arm 62 which rotates around the raising/lowering axis 61, a second arm 63 which rotates on the first arm 62, and an adhesion pad 64 which is disposed beneath the tip of the second arm 63. The adhesion pad 64 can adhere the motherboard 12 by an absorbing method such as an air-sucking method, or the like.

In FIG. 8, a capping apparatus 76 and a cleaning apparatus 77 are disposed under a moving track of the ink jet head 22 which is driven by the main scanning driving apparatus 19 so as to produce the main scanning movement. This position is in either side of the sub-scanning driving apparatus. On the other side, a electronic balance 78 is disposed. The cleaning apparatus 77 cleans the ink jet head 22. The electronic balance measures the weight of the liquid drop of the ink which is ejected from the nozzle 27 (see FIG. 10) in the ink jet head 22 according to each nozzle. In addition, the capping apparatus 76 prevents the nozzle 27 (see FIG. 10) from being desiccated while the ink jet head 22 is in a waiting condition.

A head camera 81 is disposed near the ink jet head 22 so as to move uniformly with the ink jet head 22. Also, a base stand camera 28 which is supported by a supporting device (not shown in the drawing) which is disposed on the base 9 is disposed in a position from which the picture of the motherboard 12 can be taken.

A controlling apparatus 24 which is shown in FIG. 8 comprises a computer unit 66 which contains a processor, a keyboard as an inputting interface 67, and a CRT (cathode ray tube) display 68 as a display apparatus. The above-mentioned processor comprises a CPU (central processing unit) 69 for performing a calculating operation and an information storing media 71 such as a memory for storing various information as shown in FIG. 14.

Figure 14:
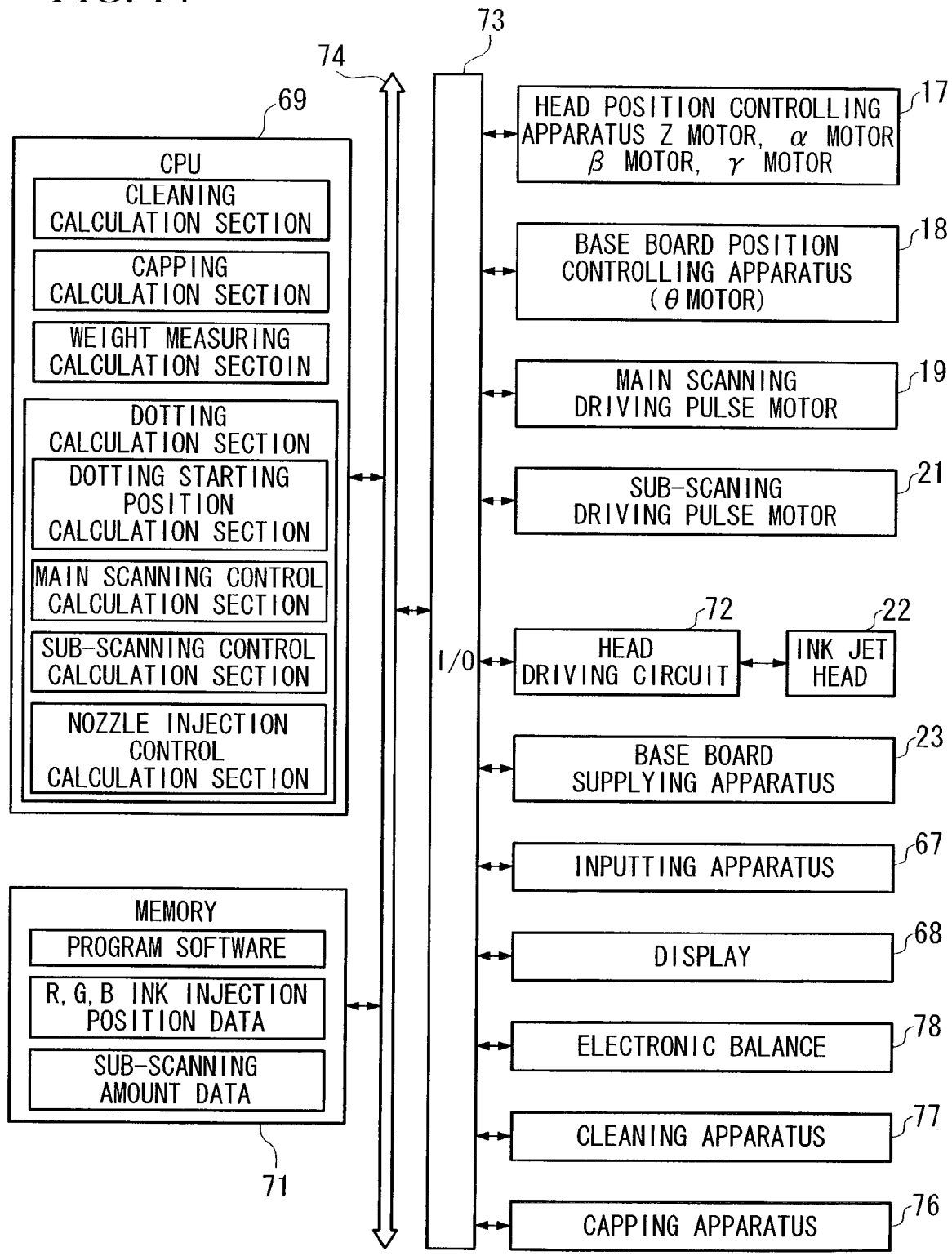
FIG. 14 is a block diagram showing an electric controlling system which is used for the ink jet head shown in FIG. 8.

The head position controlling apparatus 17, the base board position controlling apparatus 18, the main scanning driving apparatus 19, the sub-scanning driving apparatus 21, and a head driving circuit 72 for driving the piezoelectric element 41 (see FIG. 12B) in the ink jet head 22 shown in FIG. 8 are connected to the CPU 69 via an input/output interface 73 and a bus 74 as shown in FIG. 14. Also, the base board supplying apparatus 23, an inputting apparatus 67, the CRT display 68, the electronic balance 78, the cleaning apparatus 77, and the capping apparatus are connected to the CPU 69 via the input/output interface 73 and the bus 74.

Memory such as an information storing medium 71 includes a semiconductor memory such as those of RAM (random access memory) and ROM (read only memory) and an external storing apparatus such as a harddisk drive, CD-ROM (compact disk read only memory) reading apparatus, and a disk storing medium. In these memories, from a functional point of view, a memory area for storing a program which contains a controlling process of the movement of the liquid drop ejecting apparatus 16, a memory area for storing a coordinate data for ejecting position of a color element among R, G, and B to the motherboard 12 (see FIG. 5) so as to realize R-G-B disposition shown in FIGS. 7A to 7C, a memory area for storing an amount of the sub-scanning movement of the motherboard 12 in the sub-scanning direction Y in FIG. 9, an area which functions as a work area of the CPU 69 or a temporary file, and various storing areas are disposed.

The CPU 69 controls the ejection of the filter element member 13 such as ink onto a predetermined position of a surface of the motherboard 12 according to the program software which is stored in a memory as the information storing medium 71. More specifically, the CPU 69 has a cleaning calculation section for performing calculations for realizing the cleaning processing, a capping calculation section for realizing the capping processing, a weight measurement calculating section for performing calculations for realizing the weight measurement by using the electronic balance 78 (see FIG. 8), and a delineating calculating section for performing calculations for delineating the filter element member 13 by ejecting the liquid drop so as to realize functions of the CPU 69.

In detail, the delineating calculating section has various functional calculating sections such as a delineation starting position calculating section for setting the ink jet head 22 to an initial position for delineation, a main scanning controlling calculating section for performing calculation so as to control such that the ink jet head 22 makes a scanning movement in the main scanning direction X at a predetermined speed, a sub-scanning control calculating section for performing calculation so as to control the shift of the motherboard 12 by a predetermined sub-scanning amount in the sub-scanning direction Y, and a nozzle ejection control calculating section for performing calculation so as to control the ejection of the filter element member such as ink by determining which nozzle to operate among a plurality of nozzles in the ink jet head 22.

Here, in embodiments of the present invention, the above-mentioned functions are realized by using the software program which is contained in the CPU 69. If such functions can be realized by a single electric circuit which does not use the CPU 69, such an electric circuit can be used.

Hereinafter, operation of the liquid drop ejecting apparatus 16 having the above-mentioned structures is explained according to a flow chart shown in FIG. 15 as follows.

When the liquid drop ejecting apparatus 16 is started by turning power on by an operator, an initial setting is executed in a step S1. More specifically, devices such as a head unit 26, a base board supplying apparatus 23, and a control apparatus 24 are set to be in a predetermined initial setting condition.

Next, when the weight measurement timing comes (YES in step S2), the head unit 26 in the FIG. 9 is moved (step S3) to the electronic balance 78 shown in FIG. 8 by the main scanning driving apparatus 19. The amount of ink which is ejected from the nozzle 27 is measured by the electronic balance 78 (step S4). Consequently, voltage which is charged to the piezoelectric element 41 which corresponds to each nozzle 27 is adjusted according to the ink ejecting performance of the nozzle 27 (step S5).

After that, when the cleaning timing comes (YES in step S6), the head unit 26 is moved to the cleaning apparatus 77 by the main scanning driving apparatus 19 (step S7). The ink jet head 22 is cleaned by the cleaning apparatus 77 (step S8).

If the weight measuring timing and the cleaning timing do not come (No in steps S2 and S6), or when these processings are completed, the base board supplying apparatus 23 is operated so as to supply the motherboard 12 to the table 49. More specifically, the motherboard 12 inside the base board containing section 57 is held by the adhesion pad 64 so as to be retained. Next, an raising/lowering axis 61, the first arm 61, and the second arm 63 move so as to transport the motherboard 12 to the table 49. Furthermore, the table 49 is pushed to a positioning pin 50 (see FIG. 9) which is disposed in an appropriate position on the table 49 in advance. Here, for a purpose of preventing the position shift of the motherboard 12 which is disposed on the table 49, it is preferable that the motherboard 12 be fixed on the table 49 by using a device such as an air-suction device.

Next, the motherboard 12 is observed by the base board camera 82 which is shown in FIG. 8, and the output axis of the θ motor 51 shown in FIG. 9 is rotated by a very fine angle unit. By doing this, in-plane rotation of the table 49 is performed in a very fine angle unit so as to position the motherboard 12 (step S10). After that, while the motherboard 12 is observed by the head camera1 81 shown in FIG. 8, a starting position of the delineation by the ink jet head 22 is determined by a calculation (step S11). Consequently, the main scanning driving apparatus 19 and the sub-scanning driving apparatus 21 are appropriately operated so as to move the ink jet head 22 to the delineation starting position (step S12).

At this time, the nozzle array 28 of the ink jet head 22 is disposed so as to be diagonal to the sub-scanning direction Y of the ink jet head 22 by an angle θ. In the case in which an ordinary liquid drop ejecting apparatus 16 is used, it is common for the pitch between the nozzles as an interval between the neighboring nozzles 27 and the element pitch which is an interval between the filter element forming areas 7 such as neighboring filter elements 3 to be different. This disposition is made so as to equalize a dimensional component of the sub-scanning direction Y between the pitch between nozzles and the element pitch geometrically when the ink jet head 22 is moved in the main scanning direction X.

Figure 1:
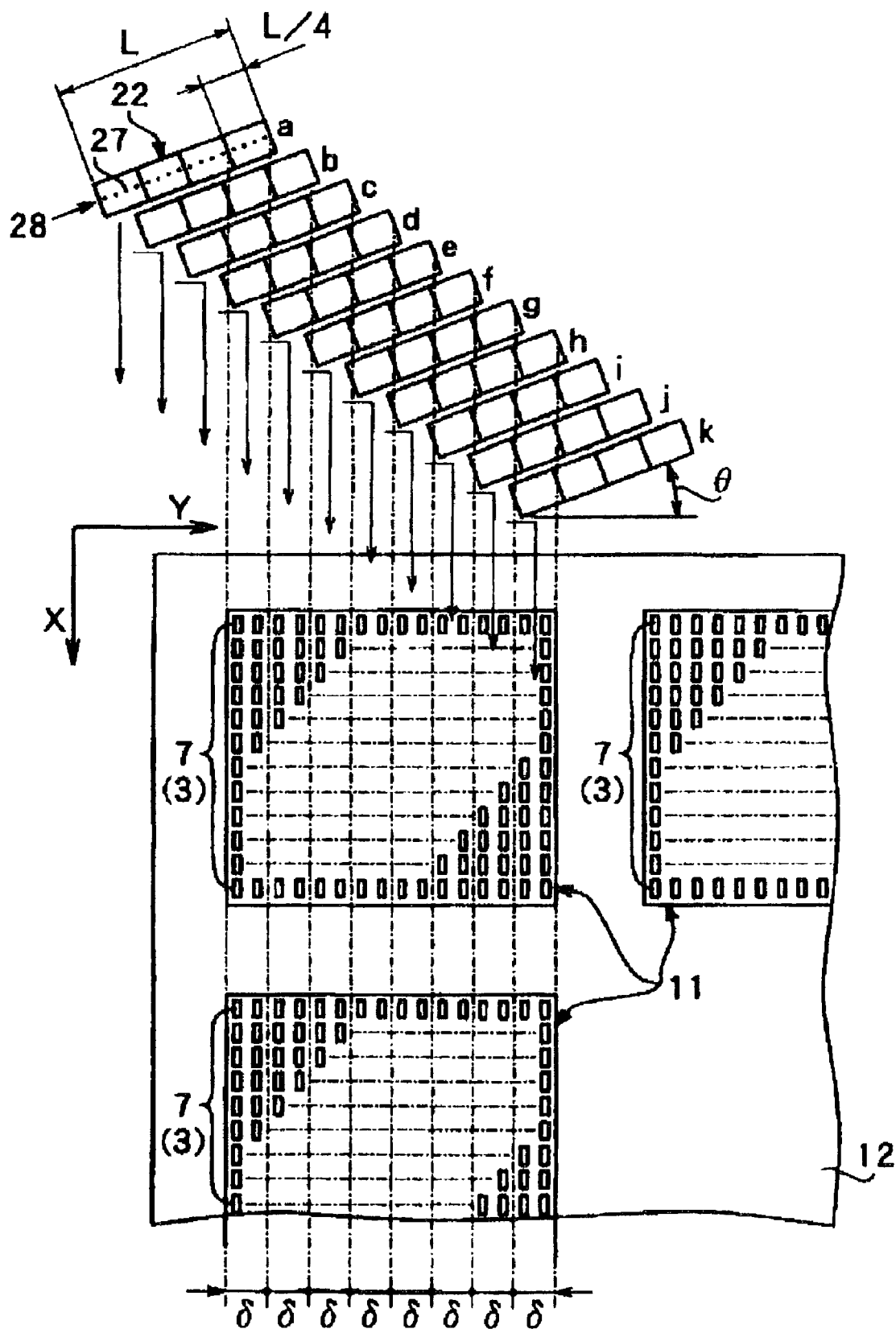
FIG. 1 is a plan view graphically showing important processes in an embodiment of a manufacturing method for a color filter according to the present invention.
Figure 15:
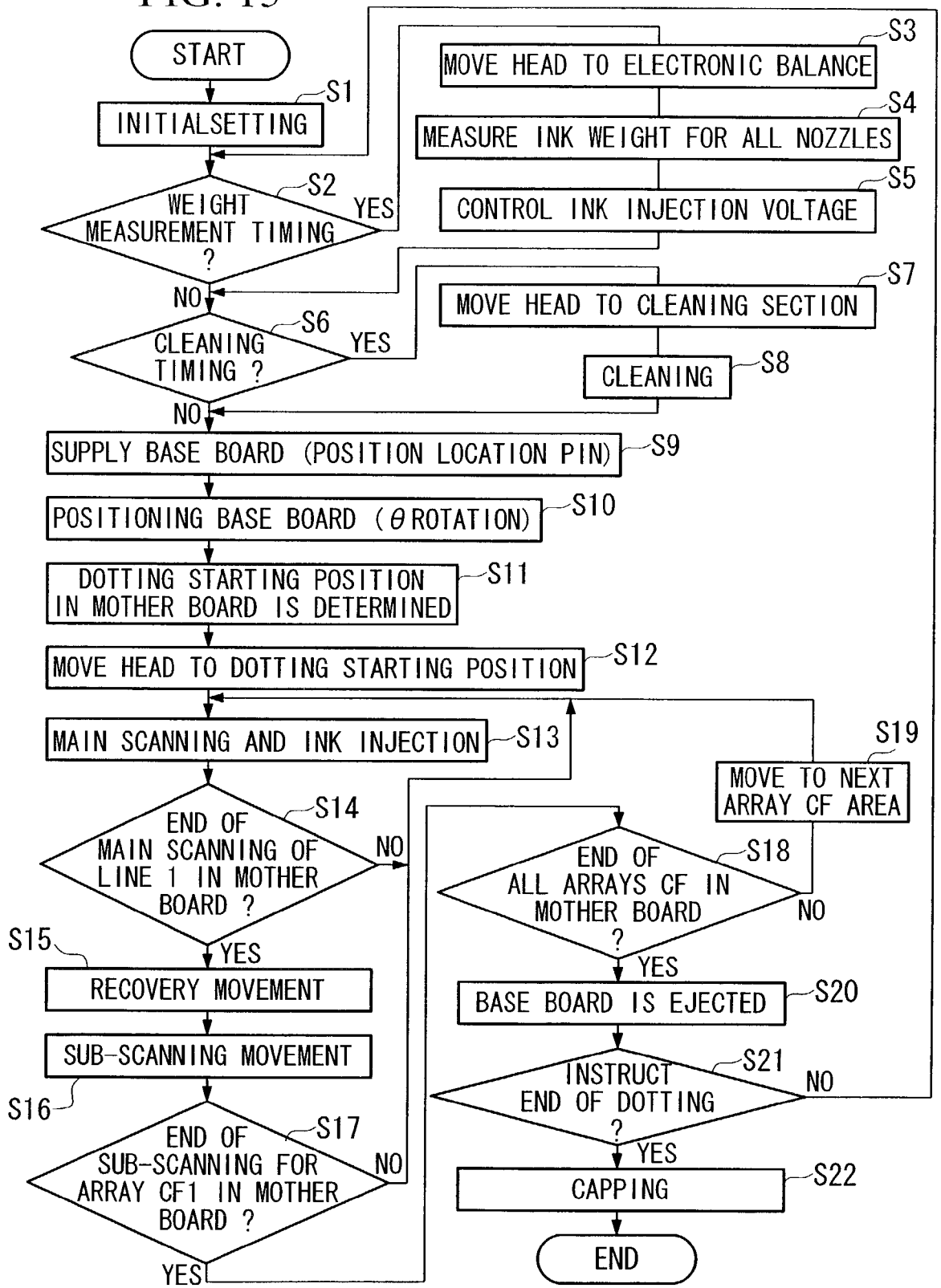
FIG. 15 is a flow chart showing controlling processes which are executed by the controlling system shown in FIG. 14.

In the step S12 shown in FIG. 15, when the ink jet head 22 is positioned in the delineation starting position, the ink jet head 22 is disposed in a position (a) shown in FIG. 1. After that, in step S13 shown in FIG. 15, the main scanning operation in the main scanning direction X starts, and the ink ejection starts at the same time. More specifically, the main scanning driving apparatus 19 shown in FIG. 9 is operated and the scanning movement of the ink jet head 22 is performed in the main scanning direction X shown in FIG. 1 in an uniform speed in a linear manner. During the scanning movement, when the nozzle 27 which corresponds to the filter element forming areas 7 to which the ink is supposed to be supplied comes, the filter element member such as ink is ejected from the nozzle 27.

Here, the ink ejection amount at this time is not an amount which fulfills the overall cubic volume of the filter element forming areas 7. The ink ejection amount at this time is an amount which fulfills a fraction of the cubic volume thereof. In the present embodiment, the amount is one-fourth of the overall cubic volume thereof. The each of the filter element forming areas 7 are not buried in one time of ink ejection from the nozzle 27 as explained later. This is because the overall cubic volume is buried by a plurality of multiple ejections. In the present embodiment, the overall cubic volume is buried by a four ejections.

When the main scanning for one line of the mother board 12 is finished (YES in step S14), the ink jet head 22 makes a reverse movement back to the initial position (a) (step S15). Furthermore, the ink jet head 22 is driven by the sub-scanning driving apparatus 21 so as to move in the sub-scanning direction Y by a predetermined sub-scanning amount δ (step S16).

In embodiments according to the present invention, the CPU 69 divides a plurality of nozzle 27 which form the nozzle array 28 of the ink jet head 22 into a plurality of groups n in FIG. 1 conceptually. The present embodiment is under condition that n=4, that is, the nozzle array 28 having length L contains 180 nozzles 27 which are considered to be divided into four groups. By doing this, one nozzle group is determined to contain 45 (=180/4) nozzles 27 and its length is determined to be L/n such as L/4 in the present embodiment. The above-mentioned sub-scanning amount δ is a length of the nozzle group having L/4 in the sub-scanning direction, which can be represented by a formula such as $(L/4)\cos\theta$.

Therefore, after finishing the main scanning for one line and returns to the initial position (a), the ink jet head 22 makes a parallel movement in the sub-scanning direction Y shown in FIG. 1 by a distance δ so as to move to a position (b). In FIG. 1, the position (a) and the position (b) are described so as to be slightly shifted in the main scanning direction X. This is for the purpose of better understanding of the explanation. Actually, the position (a) and the position (b) are the same in the main scanning direction X.

The ink jet head 22 which made the sub-scanning movement to the position (b) performs the main scanning movement and the ink ejection repetitively in step S13. In this main scanning movement, a line in a second row in the color filter forming area 11 on the motherboard 12 receives the ink ejection by the top nozzle group. A first line receives a second ink ejection by a second nozzle group.

After that, while the ink jet head 22 repeats the sub-scanning movement from a position (c) to a position (k), the ink jet head 22 repeats the main scanning movement and the ink ejection (steps S13 to S16). By doing this, an ink fixing process for one array of the color filter forming area 11 of the motherboard 12 is completed. In embodiments according to the present invention, the sub-scanning amount δ is determined by dividing the nozzle array 28 into 4 groups. Therefore, when the main scanning and the sub-scanning for one array of the above-mentioned color filter element forming area 11 are completed, each filter element forming area 7 receives one ink ejection by a nozzle group. In total each filter element forming area 7 receives ink ejection four times. A predetermined amount of the filter element member such as ink is supplied to fulfill the overall cubic volume of the filter element forming area.

By doing this, the ink ejection for one array of the color filter forming area 11 is completed, the ink jet head 22 is driven by the sub-scanning driving apparatus 21 so as to be transported to the initial position in the next array of the color filter forming area 11 (step S19). Consequently, the main scanning operation, the sub-scanning operation, and the ink ejection are performed repeatedly to the color filter forming area 11 which is disposed in the present array so as to form the filter element in the filter element forming area 7 (steps S13 to S16).

After that, when a filter element 3 having one color such as those of R among three colors or R, G, and B is formed in all of the color filter forming area 11 in the motherboard 12 (YES in step S18), the motherboard 12 which is processed is extracted to the outside by the base board supplying apparatus 23 or other transporting apparatuses in step S20. Consequently, unless the operator gives a command for finishing the processes (NO in step S21), the process returns to the step S2 and ink absorbing operation for a color such as those of R is repeated to the motherboard 12.

When the operator gives a command for finishing the processes (YES in step S21), the CPU 69 transports the ink jet head 22 to the capping apparatus 76 as shown in FIG. 8. The capping apparatus 76 performs the capping process to the ink jet head 22 (step S22).

By doing this, the patterning process for one color such as those of R among three colors such as those of R, G, and B which are contained in the color filter 1 is completed. After that, the motherboard 12 is transported to the liquid drop ejecting apparatus 16 which uses the filter element member such as G as a second color among two colors such as G and B so as to perform the patterning process for G color. Furthermore, the motherboard 12 is transported to the liquid drop ejecting apparatus 16 which uses the filter element member such as B as a third color among three colors such as those of R, G, and B finally so as to perform the patterning process for B color. By doing this, the motherboard 12 having a plurality of color filters 1 which has desirable dot disposition of R, G, and B such as the stripe disposition shown in FIG. 5A is produced. By cutting the motherboard 12 according to the color filter forming area 11, a plurality of the color filters 1 can be produced.

Here, if the color filter 1 is used for a purpose of performing the color-display operation in the liquid crystal apparatus, more structures such as electrodes and oriented films are layered on a surface of the color filter 1. In such a case, if the motherboard 12 is cut into a plurality of the color filters 1 before forming the electrodes and the oriented films, it is difficult to form the electrodes and the like. Therefore, the motherboard 12 should not be cut before forming the electrodes and the oriented films and the motherboard 12 should be cut after finishing necessary processes such as forming the electrodes and the oriented films.

As explained above, according to manufacturing method for a color filter and a manufacturing apparatus in embodiments of the present invention, it is not that each of filter elements 3 in the color filter shown in FIG. 5A is formed by performing the main scanning X of the ink jet head 22 in one time. Each of filter element 3 in the color filter shown in FIG. 5A is formed by a predetermined thickness by performing multiple ink ejection n times by a plurality of nozzles 27 which belong to different nozzle groups. In the present embodiment, the ink ejection is performed 4 (four) times. By doing this, if the ink ejection amount differs among a plurality of the nozzles 27, it is possible to prevent the ink ejection amount from being different among a plurality of the filter elements 3. Therefore, it is possible to equalize the translucency on a plane of the color filter 1.

In the present embodiment of the manufacturing method according to the present invention, the filter element 3 is formed by ejecting the ink using the ink jet head 22. Therefore, certainly, it is not necessary to arrange a complicated manufacturing process such as photolithography method. Therefore, members and materials for manufacturing the filter element can be reduced.

In the explanation of the FIG. 36A, it has been explained that distribution of the ink ejection amount from a plurality of nozzles 27 which form the nozzle array 28 of the ink jet head 22 is not uniform. Also, it has been explained that the ink ejection amount which is ejected from several pieces of nozzle 27 in the nozzle array 28 is large. For example, 10 pieces of nozzle 27 which are disposed on both end of the nozzle array respectively ejects more ink than the other nozzles. As explained above, it is not preferable that nozzles 27 which eject more ink than the other nozzles 27 be used from a point of view for obtaining uniform thickness of the filter element 3 such as ejected ink.

Figure 13:
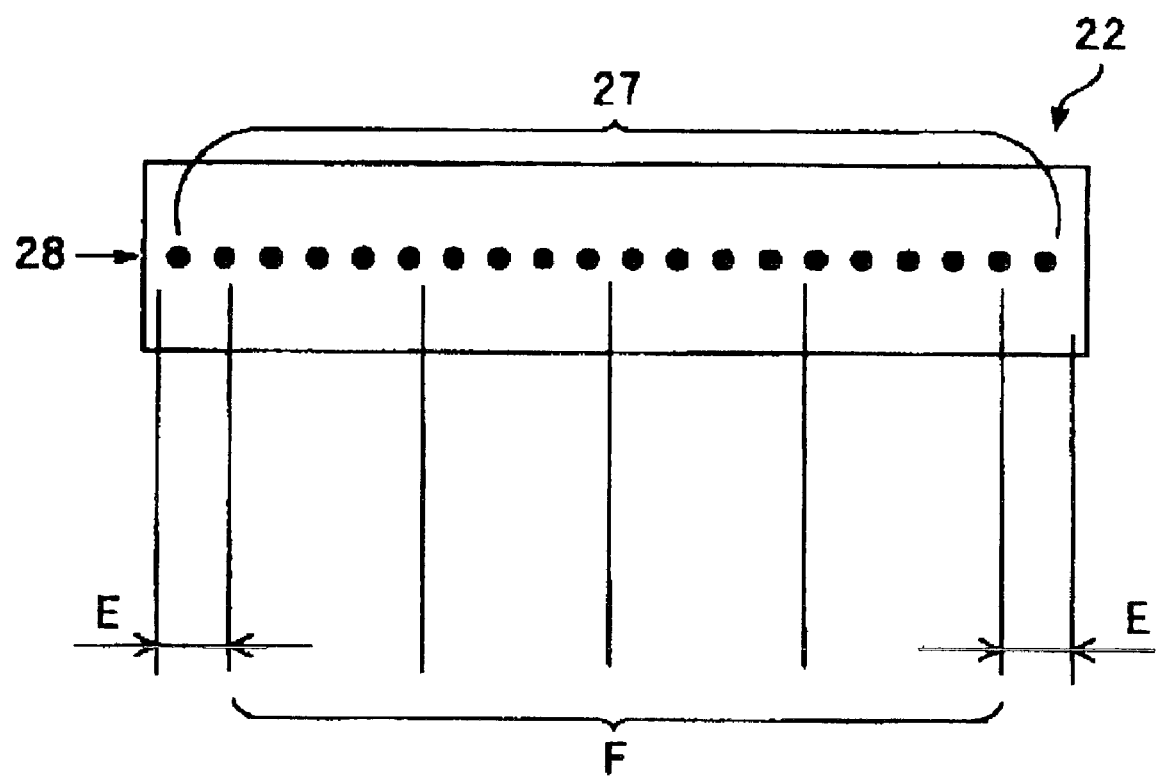
FIG. 13 is a plan view showing other modified examples of the ink jet head.

Therefore, as shown in FIG. 13, it is preferable that several pieces of nozzle 27 which are disposed on both ends section of the nozzle array 28 for forming the nozzle array 28 are set not to eject ink in advance, and a plurality of nozzles 27 which exist on the rest of the nozzle array 28 are divided into a plurality of groups such as 4 (four) groups so as to perform the sub-scanning movement according to the nozzle group unit.

In the present embodiment, a non-translucent resin member is used for a bulkhead 6. It is certain that a translucent resin member can be used for a translucent bulkhead 6. In such a case, extra members such as translucent metal films or resin members are disposed in positions corresponding to the filter element 3 such as on the bulkhead 6 or under the bulkhead 6 so as to dispose them as a black mask. Also, it is acceptable that the bulkhead 6 is formed by the translucent resin member so as not to make it as a black mask.

Also, in the present embodiment, R, G, and B are used for the filter element 3. It is certain that the filter element 3 is not limited to R, G, and B. For example, C (cyan), magenta (M), and yellow (Y) can be used. In such a case, the filter element member containing C, M, and Y can be used instead of the filter element member containing R, G, and B.

Furthermore, in the present embodiment, the bulkhead 6 is formed by the photolithography method. The bulkhead 6 can be formed by the ink jet method as well as the color filter 1.

(Explanation 2 for a Manufacturing Method for a Color Filter and Apparatus Therefor).

Figure 2:
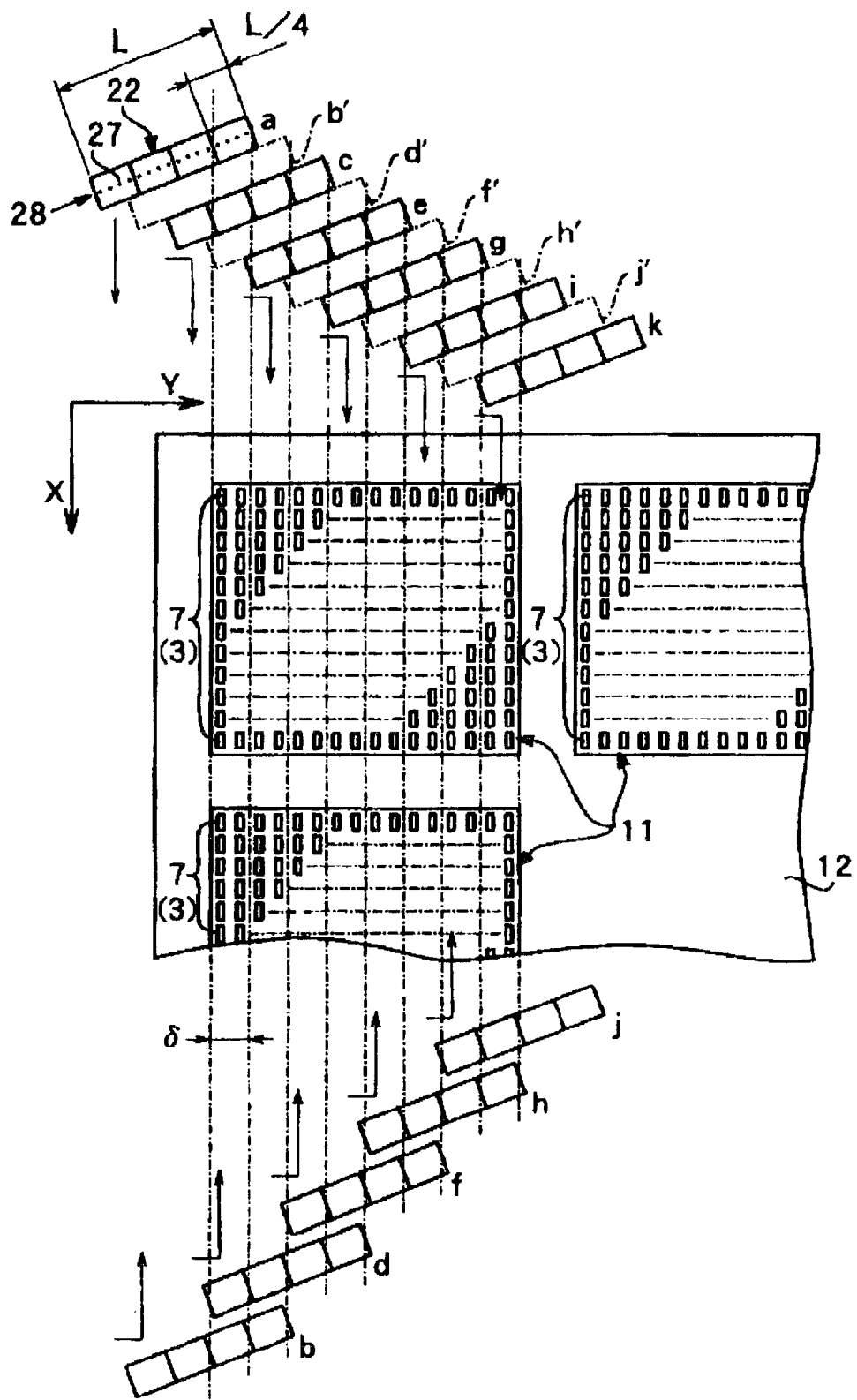
FIG. 2 is a plan view graphically showing important processes in another embodiment of a manufacturing method for a color filter according to the present invention.

FIG. 2 is a view for explaining a manufacturing method for a color filter according to the present invention which is explained above and a modified form of a manufacturing apparatus therefor. In FIG. 2, it is graphically shown that the filter element member 13 such as an ink is ejected to be supplied to each of the filter element forming areas 7 in the color filter forming areas 11 in the motherboard 12 by using the ink jet head 22.

Processes which are performed in the present embodiment are generally the same as the processes which are shown in FIG. 6. Also, the liquid drop ejecting apparatus for ejecting ink is the same as the apparatus shown in FIG. 8 from a structural point of view. Also, the CPU 69 which divides a plurality of nozzles 27 for forming the nozzle array 28 as n pieces of conceptual groups, for example, 4 groups, and make them correspond to the length of each of nozzle groups L/n or L/4 so as to determine the sub-scanning amount δ is the same as the case which is shown in FIG. 1.

The present embodiment is different from the previous embodiment which is shown in FIG. 1 in that a program software which is stored in a memory as an information storing media 71 in FIG. 14 is modified. More specifically, the main scanning controlling calculation and the sub-scanning controlling calculation which are performed by the CPU 69 are modified.

More specifically, in FIG. 2, the ink jet head 22 is controlled such that the ink jet head 22 does not return to the initial position after finishing the scanning movement in the main scanning direction X and the ink jet head 22 moves over a moving amount of δ which is equivalent to one nozzle group in the sub-scanning direction to a position (b) immediately after finishing the main scanning movement in one direction, and after that, the ink jet head 22 performs the scanning movement in an opposite direction to the above one direction of the main scanning direction X and returns to a position (b') which is shifted by a distance δ in the sub-scanning direction from the initial position (a). It is certain that the ink is selectively ejected from a plurality of nozzles 27 during a main scanning period between the position (a) and the position (b) and a main scanning period between the position (b) and the position (b').

That is, in the present embodiment, the main scanning operation and the sub-scanning operation of the ink jet head 22 are performed alternately and continuously without the returning operation. By doing this, a time necessary for the returning operation can be omitted so as to shorten the operating time.

(Explanation 3 for a Manufacturing Method for a Color Filter and Apparatus Therefor).

Figure 3:
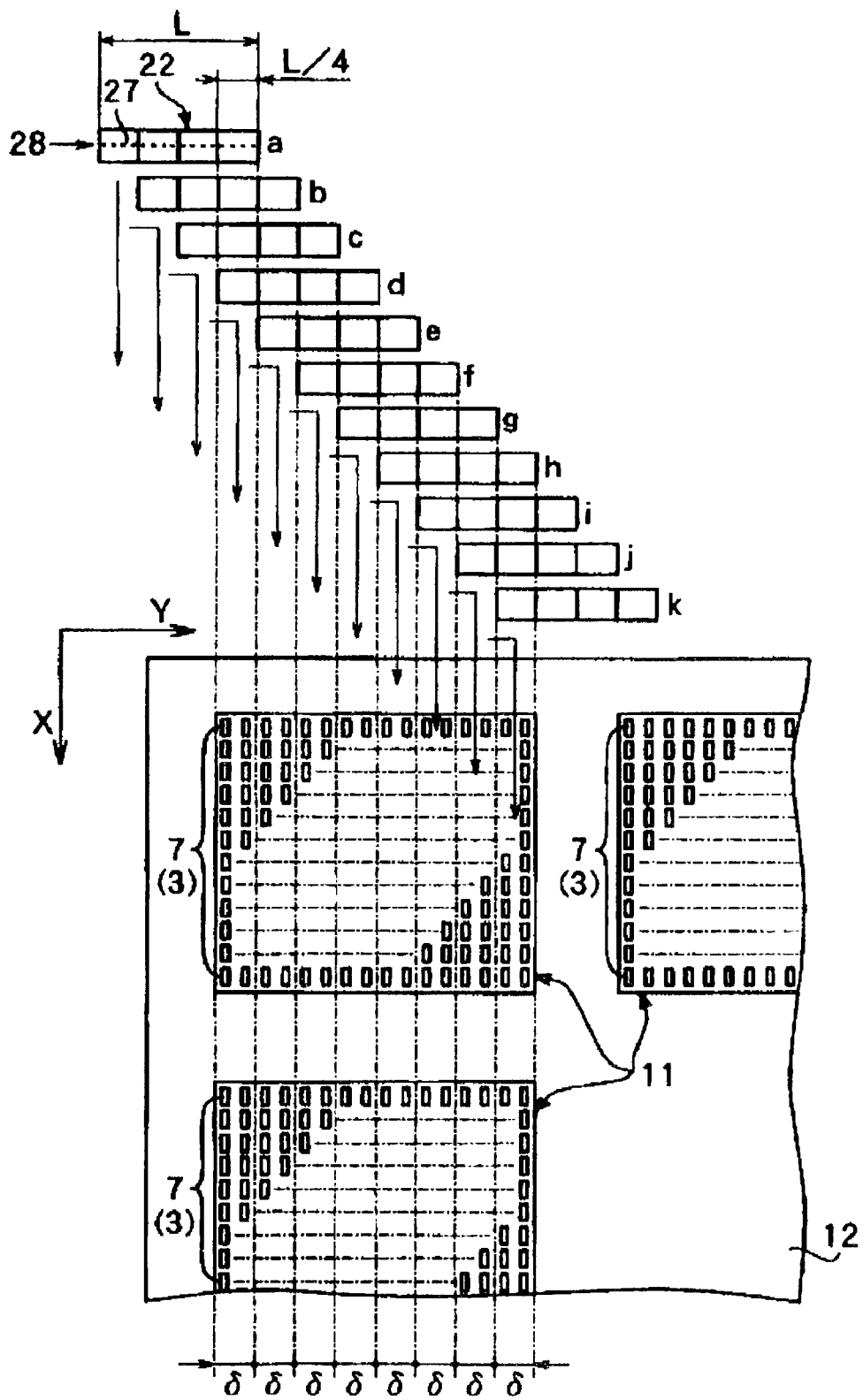
FIG. 3 is a plan view graphically showing important processes in another embodiment of a manufacturing method for a color filter according to the present invention.

FIG. 3 is a view for explaining a manufacturing method for a color filter according to the present invention which is explained above and a modified form of a manufacturing apparatus therefor. In FIG. 3, it is graphically shown that the filter element member 13 such as an ink is ejected to be supplied to each of the filter element forming areas 7 in the color filter forming areas 11 in the motherboard 12 by using the ink jet head 22.

Processes which are performed in the present embodiment are generally the same as the processes which are shown in FIG. 6. Also, the liquid drop ejecting apparatus for ejecting ink is the same as the apparatus shown in FIG. 8 from a structural point of view. Also, the CPU 69 which divides a plurality of nozzles 27 for forming the nozzle array 28 into n pieces of conceptual groups, for example, 4 groups and make them correspond to the length of each of nozzle groups L/n or L/4 so as to determine the sub-scanning amount δ is the same as the case which is shown in FIG. 1.

The present embodiment is different from the previous embodiment shown in FIG. 1 in that an expanding direction of the nozzle 28 of the ink jet head 22 is parallel with the sub-scanning direction Y as shown in the position (a) in FIG. 3 when the ink jet head 22 is set at the delineation starting position on the motherboard 12 in a step S12 shown in FIG. 15. Such nozzle disposition is advantageous in a case in which the pitch between the nozzle of the ink jet head 22 and the pitch between the elements of the motherboard 12 are equal.

In the present embodiment, too, while the ink jet head 22 repeats the scanning movement in the main scanning direction X, the returning movement to the initial position, and the sub-scanning movement in the sub-scanning direction Y over the moving amount δ from the initial position (a) to the end position (k), the ink jet head 22 ejects the filter element member such as ink from a plurality of nozzles 27 selectively during a period of the main scanning movement. By doing this, the filter element member is fixed in the filter element forming area 7 in the color filter element forming area 11 of the motherboard 12.

Here, in embodiments of the present invention, the nozzle array 28 is disposed in parallel with the sub-scanning direction Y By doing this, the sub-scanning movement amount δ is set to be equal to the length of the divided nozzle group such as L/n, that is, L/4.

(Explanation 4 for a Manufacturing Method for a Color Filter and Apparatus Therefor).

Figure 4:
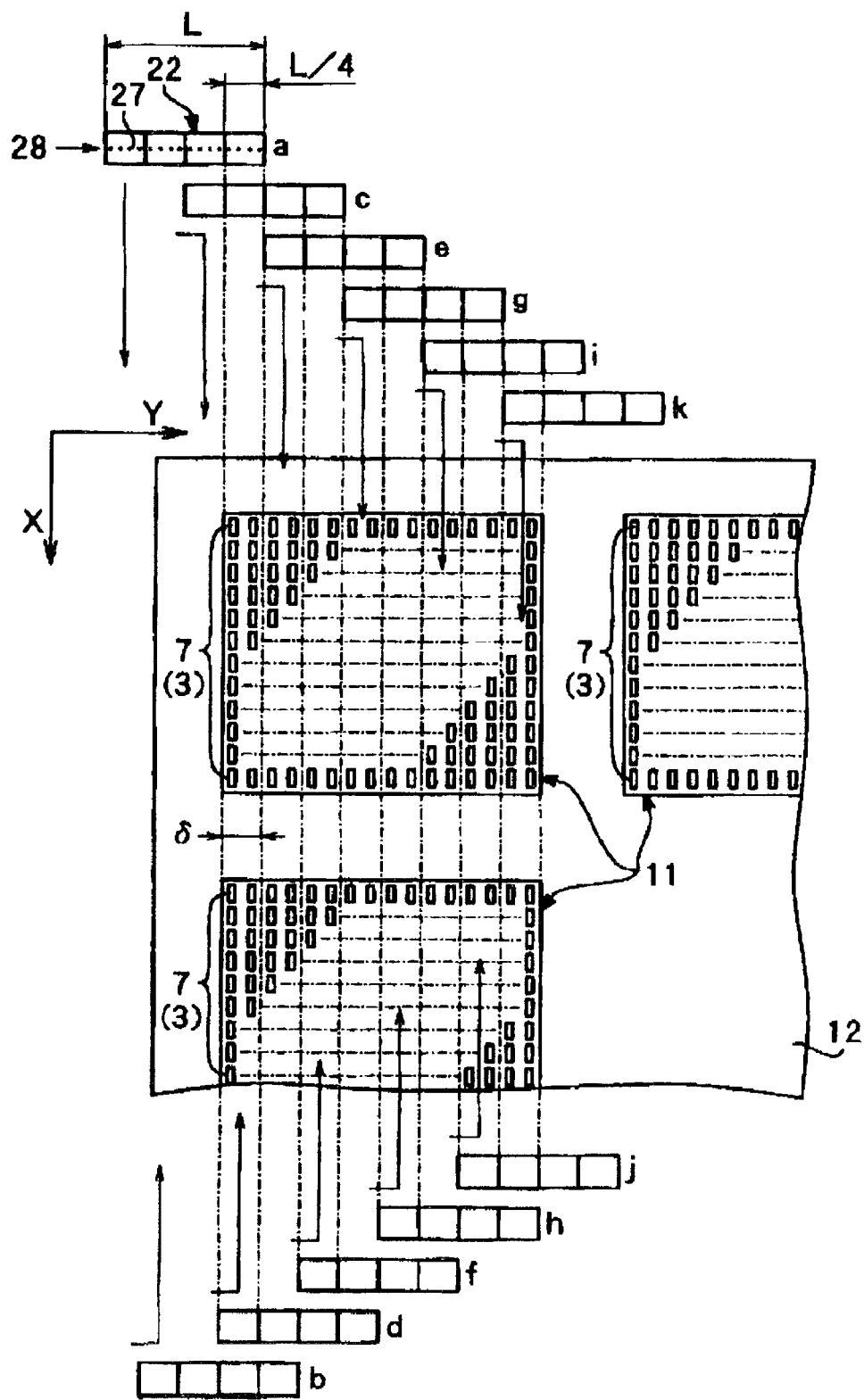
FIG. 4 is a plan view graphically showing important processes in another embodiment of a manufacturing method for a color filter according to the present invention.

FIG. 4 is a view for explaining a manufacturing method for a color filter according to the present invention which is explained above and a modified form of a manufacturing apparatus therefor. In FIG. 4, it is graphically shown that the filter element member 13 such as an ink is ejected to be supplied to each of the filter element forming areas 7 in the color filter forming areas 11 in the motherboard 12 by using the ink jet head 22.

Processes which are performed in the present embodiment are generally the same as the processes which are shown in FIG. 6. Also, the liquid drop ejecting apparatus for ejecting ink is the same as the apparatus shown in FIG. 8 from a structural point of view. Also, the CPU 69 which divides a plurality of nozzles 27 for forming the nozzle array 28 into n conceptual groups, for example, 4 groups and make them correspond to the length of each of nozzle groups L/n or L/4 so as to determine the sub-scanning amount δ is the same as the case which is shown in FIG. 1.

The present embodiment is different from the previous embodiment shown in FIG. 1 in that an expanding direction of the nozzle 28 of the ink jet head 22 is parallel with the sub-scanning direction Y as shown in the position (a) in FIG. 4 when the ink jet head 22 is set at the delineation starting position on the motherboard 12 in a step S12 shown in FIG. 15, and the main scanning operation and the sub-scanning operation of the ink jet head 22 are performed continuously and alternately without returning movement as well as the embodiment shown in FIG. 2.

Figure 11:
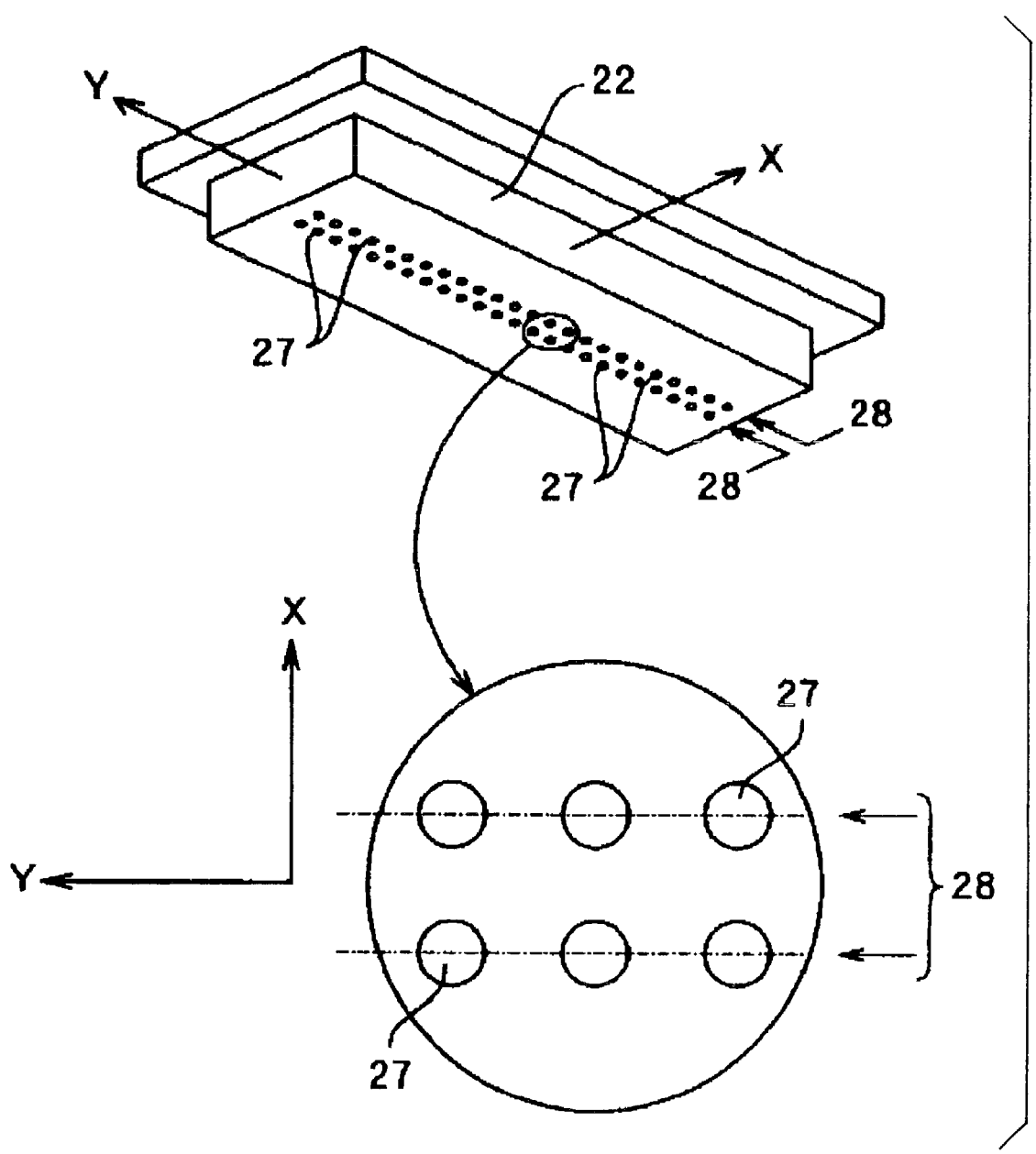
FIG. 11 is an enlarged perspective view showing a modified example of the ink jet head.

Here, in the present embodiment shown in FIG. 4 and in the previous embodiment shown in FIG. 3, the main scanning direction X is orthogonal to the nozzle array 28. Therefore, by disposing two arrays of nozzle array 28 along the main scanning direction X as shown in FIG. 11, it is possible to supply the filter element member 13 to one filter element forming area 7 by two nozzles 27 which are disposed on the same main scanning line.

(Explanation 5 for a Manufacturing Method for a Color Filter and Apparatus Therefor)

Figure 16:
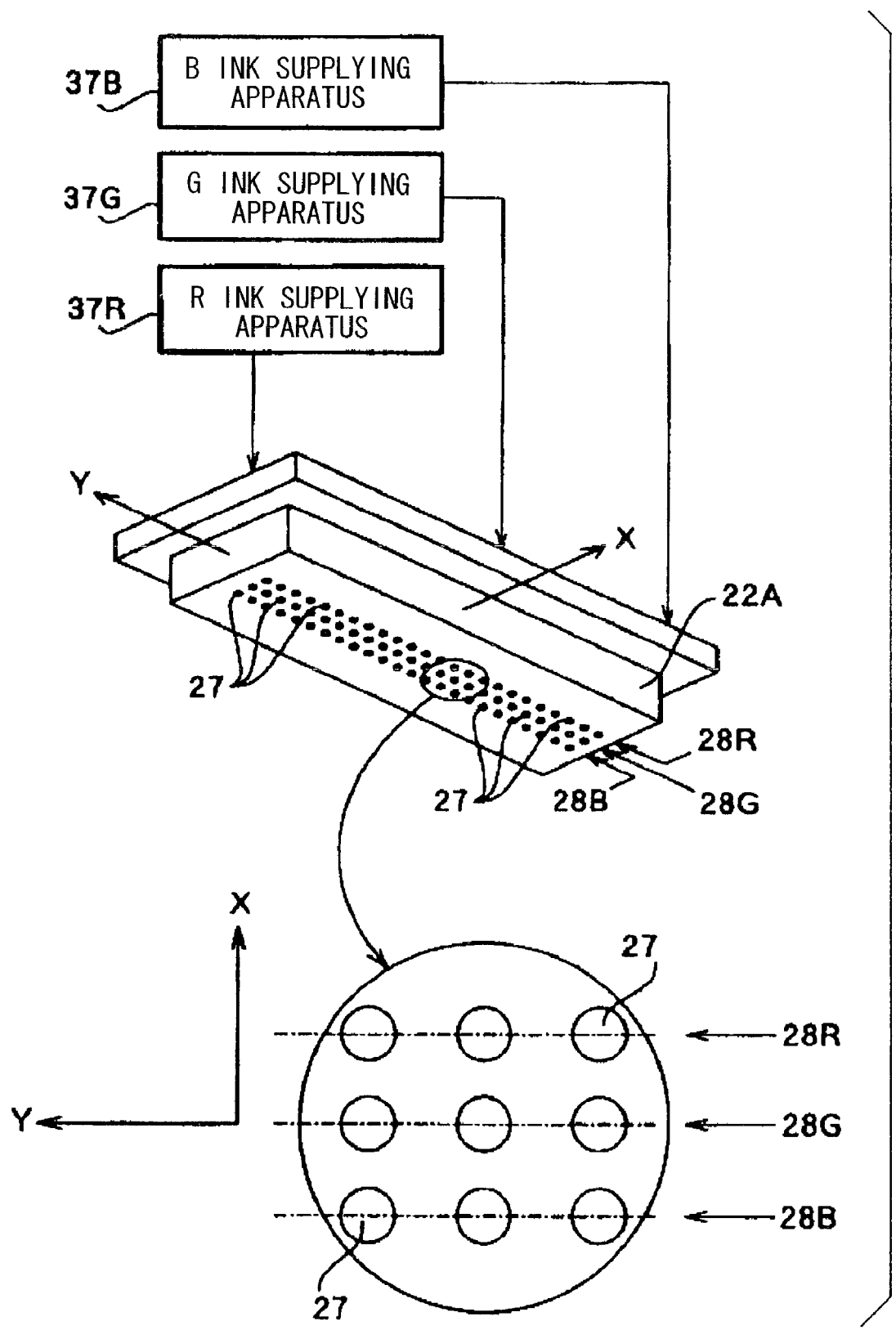
FIG. 16 is a perspective view showing a further modified example of the ink jet head.

FIG. 16 is a view for explaining a manufacturing method for a color filter according to the present invention which is explained above and a modified form of a manufacturing apparatus therefor. FIG. 16 is showing an ink jet head 22A. The ink jet head 22A is different from the ink jet head 22 shown in FIG. 10 in that nozzle arrays containing three nozzle arrays such as the nozzle array 28R for ejecting an R color ink, the nozzle array 28G for ejecting a G color ink, and the nozzle array 28B for ejecting B color are formed in one unit such as an ink jet head 22A. The ink ejection system shown in FIGS. 12A and 12B are provided to each of the three nozzle arrays. An R ink supplying apparatus 37R is connected to the ink ejection system which corresponds to the R color nozzle array 28R. A G ink supplying apparatus 37G is connected to the ink ejection system which corresponds to the G color nozzle array 28G. A B ink supplying apparatus 37B is connected to the ink ejection system which corresponds to the B color nozzle array 28B.

Processes which are performed in the present embodiment are generally the same as the processes which are shown in FIG. 6. Also, the liquid drop ejecting apparatus for ejecting ink is the same as the apparatus shown in FIG. 8 from a structural point of view. Also, the CPU 69 which divides a plurality of nozzles 27 for forming the nozzle array 28 into n pieces of conceptual groups, for example, 4 groups and make them correspond to the length of each of nozzle groups L/n or L/4 so as to determine the sub-scanning amount δ is the same as the case which is shown in FIG. 1.

In the embodiment shown in FIG. 1, only one kind of nozzle array 28 is provided to the ink jet head 22. Therefore, when a color filter 1 is formed by three colors such as those of R, G, and B, it is necessary to prepare the ink jet head 22 shown in FIG. 8 for each of three colors such as those of R, G, and B. In contrast, when the ink jet head 22A shown in FIG. 16 is used, three colors such as those of R, G, and B can be fixed onto the motherboard 12 simultaneously by just one main scanning operation by the ink jet head 22A in the main scanning direction X. Therefore, it is sufficient to prepare one ink jet head 22. Also, by synchronizing the interval between the nozzle arrays 28 of each color to the pitch of the filter element forming area 7 of the motherboard 12, it is possible to eject three colors such as those of R, G, and B simultaneously.

(Explanation for Manufacturing Method for an Electrooptical Apparatus Using Color Filter and a Manufacturing Apparatus Therefor)

Figure 17:
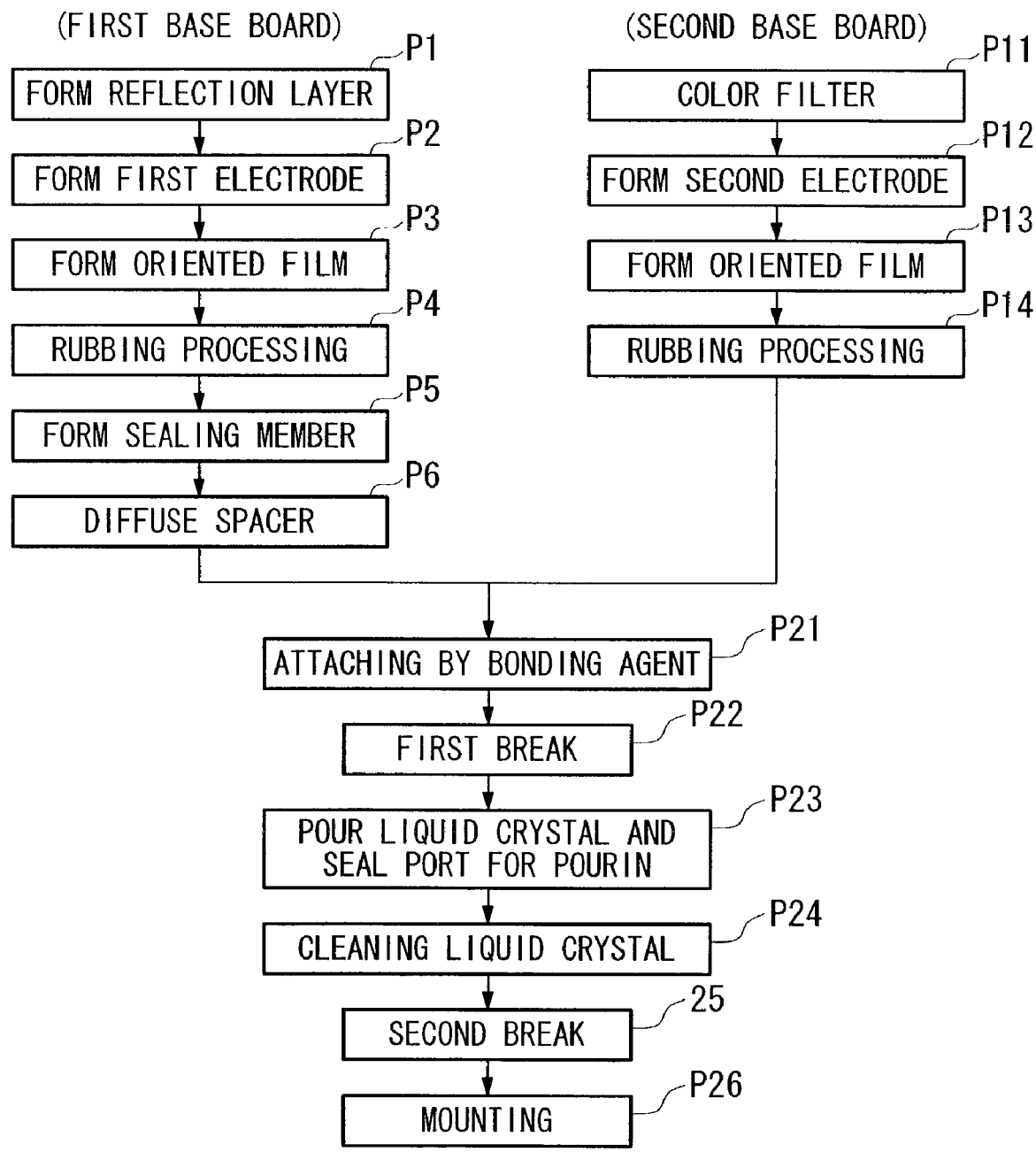
FIG. 17 is a process chart showing an embodiment of a manufacturing method for the liquid crystal apparatus according to the present invention.
Figure 18:
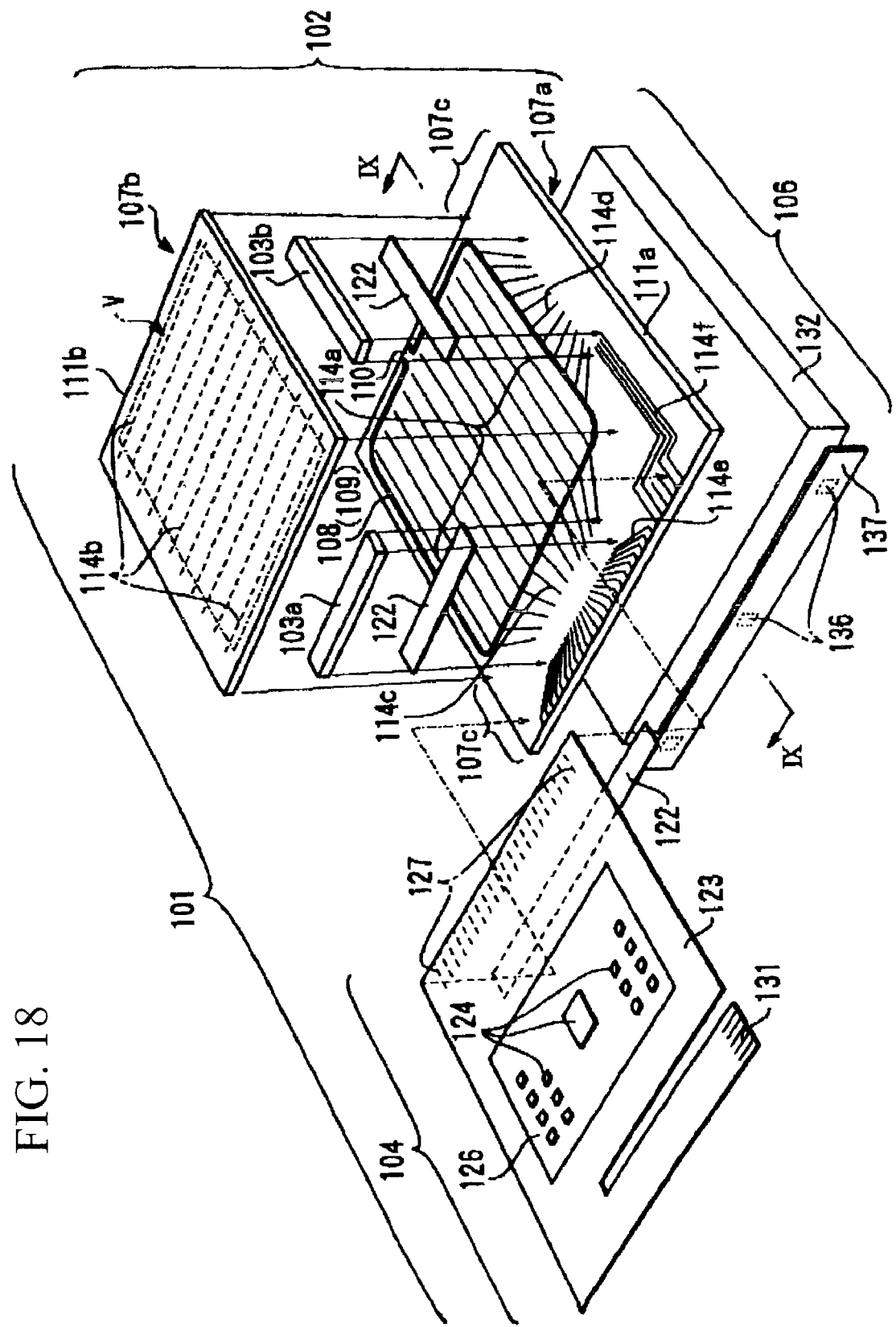
FIG. 18 is a perspective view of an example of the liquid crystal apparatus which is manufactured by the manufacturing method for the liquid crystal apparatus according to the present invention in a disassembled manner.
Figure 19:
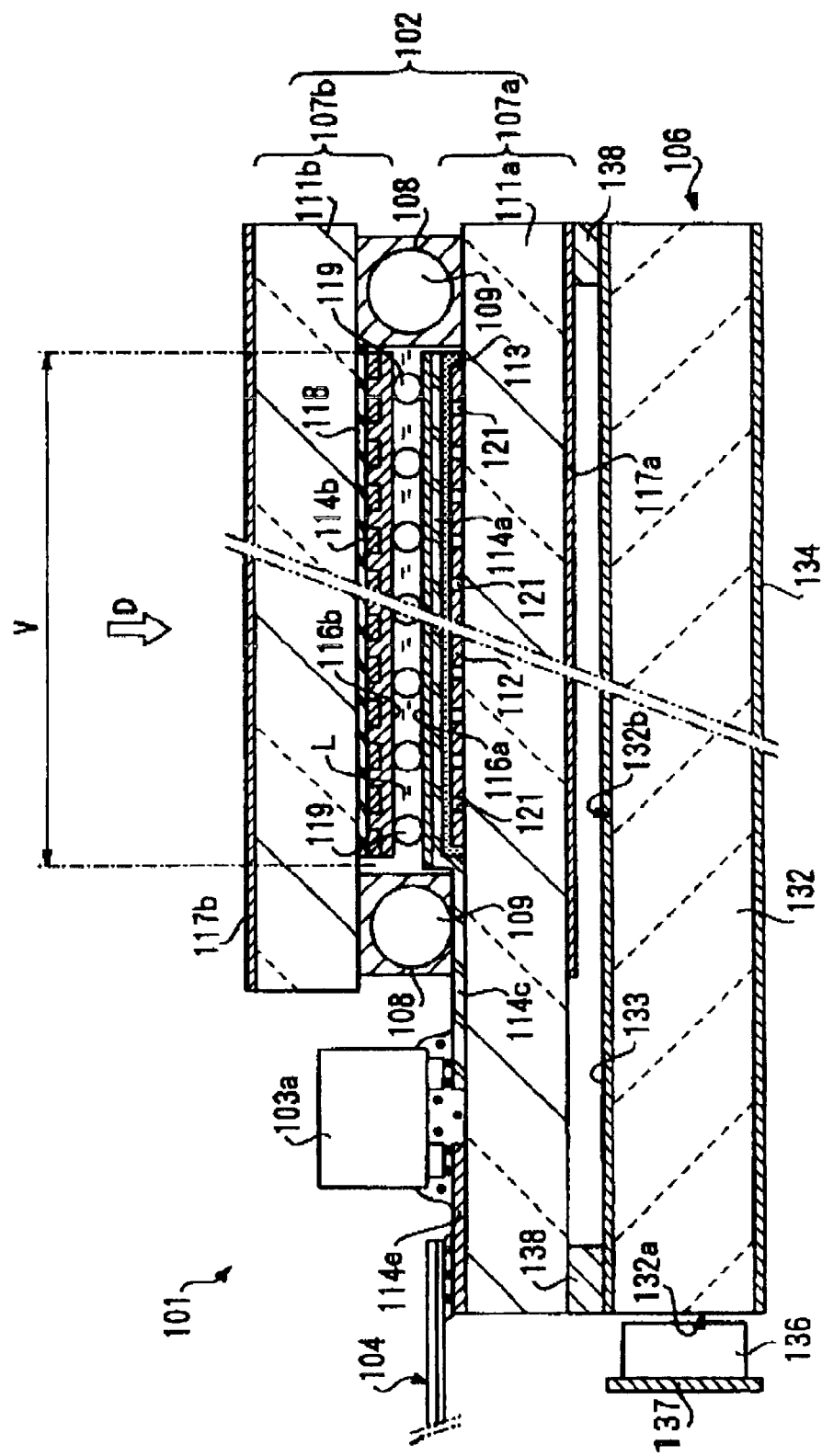
FIG. 19 is a cross section showing a cross sectional structure of the liquid crystal apparatus viewed along line IX—IX shown in FIG. 18.

FIG. 17 shows an embodiment of manufacturing method for a liquid crystal apparatus as an example of the electrooptical apparatus according to the present invention. Also, FIG. 18 shows an embodiment of a liquid crystal apparatus which is manufactured by the above-mentioned manufacturing method. Also, FIG. 19 is a cross section of the liquid crystal apparatus shown in FIG. 18 viewed along a line IV—IV Before explaining manufacturing method for a liquid crystal apparatus and a manufacturing apparatus therefor, an example of the liquid crystal apparatus which is manufactured by the manufacturing method is explained. Here, the liquid crystal apparatus according to the present embodiment is a semi-translucent reflecting liquid crystal apparatus in which the full-color display operation is performed by a simple matrix method.

In FIG. 18, a liquid crystal apparatus 101 mounts a liquid crystal driving IC (integrated circuit) 103 as a semiconductor chip and a liquid crystal driving IC 103b on a liquid crystal panel 102 and connects an FPC (Flexible Printed Circuit) 104 as a wiring connecting element to the liquid crystal panel 102. Furthermore, the liquid crystal apparatus 101 is formed by providing a lighting apparatus 106 as a back light on a back surface of the liquid crystal panel 102.

The liquid crystal panel 102 is formed by attaching a first base board 107a and a second base board 107b by a sealing member 108. The sealing member 108 is formed by fixing an epoxy resin on an inner surface of the first base board 107a or the second base member 107b in a circular manner, for example, by screen printing method. Also, a conducting member 109 which is made from a conductive member formed spherically or cylindrically is contained in the sealing member 108 in a dispersed manner as shown in FIG. 19.

In FIG. 19, the first base board 107a has a planar base member 111a which is made from a translucent glass or a translucent plastic member. In an inner surface of the base member 111a (a top surface in FIG. 19), a reflecting layer is formed. An insulating layer 113 is layered thereon, and a first electrode 114a is formed thereon in a striped manner (see FIG. 18) viewed in an arrow direction D. Furthermore, an oriented film 116a is formed thereon. Also, on an outer surface (bottom surface in FIG. 19) of the base member 111a, a polarizing plate 117a is attached by an adhesion method or the like.

In FIG. 18, intervals between stripes are shown larger than they actually are for the purpose of better understanding the array arrangement of the first electrode 114a. Therefore, fewer first electrodes 114a are shown than the actual number of the first electrode 114a. However, more number of the first electrodes 114a are disposed on the base member 111a than appears in the drawing.

In FIG. 19, the second base board 107b has a planar base member 111b which is made from a translucent glass or a translucent plastic member. In an inner surface of the base member 111b (a bottom surface in FIG. 19), a color filter 118 is formed. A second electrode 114b is formed in a direction orthogonal to the first electrode 114a in a striped manner (see FIG. 18) viewed in an arrow direction D. Furthermore, an oriented film 116b is formed thereon. Also, on an outer surface (top surface in FIG. 19) of the base member 111b, a polarizing plate 117b is attached by an adhesion method or the like.

In FIG. 18, intervals between stripes are shown larger than they actually are for the purpose of better understanding the array arrangement of the second electrode 114b as well as the first electrode 114a. Therefore, fewer second electrodes 114b are shown than the actual number of the second electrodes 114b. However, more of the second electrodes 114b are disposed on the base member 111b than appears in the drawing.

In FIG. 19, in a space such as a cell gap which is surrounded by the first base board 107a, the second base board 107b, and the sealing member 108, a liquid crystal L such as STN (Super Twisted Nematic) liquid crystal is sealed. On an inner surface of the first base board 107a or the second base board 107b, numerous fine spherical spacers 119 are dispersed. By disposing the spacers 119 in the cell gap, the thickness of the cell gap is maintained in uniform thickness.

The first electrode 114a and the second electrode 114b are disposed in an orthogonal manner. The crossing point of the above-mentioned electrodes is disposed in a dot-matrix manner viewed in an arrow direction D shown in FIG. 19. Each of the crossing points in dot matrix manner is one picture element pixel. The color filter 118 is formed by disposing each of the color elements such as those of R (red), G (green), and B (blue) in a predetermined pattern viewed from an arrow direction D such as striped disposition, delta disposition, and mosaic disposition. One picture element pixel corresponds to each color such as those of R, G, and B. Picture element pixels containing three colors such as those of R, G, and B is one unit so as to form one pixel.

By illuminating a plurality of picture element pixel such as pixels which are disposed in dot matrix manner selectively, images such as a letter and numerals are displayed on outside of the second base board 107b of the liquid crystal panel 102. Such an area in which the images are displayed is an effective pixel area. A planar rectangle area which is indicated by an arrow V in FIGS. 18 and 19 is the effective display area.

In FIG. 19, the reflecting film 112 is formed by an optical reflecting member such as APC alloy (Silver-Palladium-Copper alloy) or Al (aluminum). An opening section 121 is formed in a position which corresponds to each picture element pixel which is a crossing point of the first electrode 114a and the second electrode 114b. As a result, the opening section 121 is disposed in a dot matrix manner as well as the picture element pixel when viewed in an arrow direction D shown in FIG. 19.

The first electrode 114a and the second electrode 114b are formed by, for example, a translucent conductive member such as an ITO (Indium-Tin Oxide). Also, the oriented film 116a and 116b are formed by applying a polyimide group resin in a uniform thickness film. By rubbing the oriented films 116a and 116b, an initial disposition of the liquid crystal molecules on a surfaces of the first base board 107a and the second base board 107b are determined.

In FIG. 18, the first base board 107a is formed so as to be larger than the second base board 107b. When these base boards are attached by the sealing member 108, the first base board 107a has a base board expanding section 107c which expands to outside of the second base board 107b. Consequently, on the base board expanding section 107c, various wiring members such as an extended wiring 114c which extends from the first electrode 114a, an extended wiring 114d which conducts the second electrode 114b on the second base board 107b via an conductive member 109 (see FIG. 19) which exists inside the sealing member 108, a metal wiring 114e which is connected to an input bump such as an input terminal of the liquid crystal driving IC 103a, and a metal wire 114f which is connected to an input bump of the liquid crystal driving IC 103b are formed in appropriate patterns.

In embodiments according to the present invention, the extended wiring 114c which extends from the first electrode 114a and the extended wiring 114d which leads to the second electrode 114b are formed by an ITO which is made from the same member as the electrodes such as a conducting oxide. Also, the metal wirings 114e and 114f which are wirings for inputting ends of the liquid crystal ICs 103a and 103b are made from a low electric resistance metal member such as an APC alloy. The APC alloy contains mainly Ag in addition to alloy containing Pd and Cu such as an alloy containing 98% of Ag, 1% of Pd, and 1% of Cu.

The liquid crystal driving ICs 103a and 103b are adhered on a surface of the extended base board section 107c by an ACF (Anisotropic Conductive Film) 122 so as to be mounted thereon. That is, in the present embodiment, the liquid crystal panel is formed as a COG (chip on glass) liquid crystal display in which semiconductor chips are mounted on the base board directly. In the mounting structure of the COG method, the inputting bumps of the liquid crystal driving ICs 103a and 103b and the metal wirings 114e and 114f are connected conductively by conductive grains which are contained inside the ACF 122. Also, the outputting bumps of the liquid crystal driving ICs 103a and 103b and the extended wirings 114c and 114d are conductively connected.

In FIG. 18, the FPC 104 comprises a flexible resin film 123, a circuit 126 containing a chip member 124, and a metal wiring terminal 127. The circuit 126 is mounted on a surface of the resin film 123 directly by a conductive connecting method such as a soldering method or the like. Also, the metal wiring terminal 127 is formed by a conductive member such as an APC alloy, Cr, Cu, or the like. A portion of the FPC 104 in which the metal wiring terminal 127 is formed is connected to a portion of the first base board 107a in which the metal wirings 114e and 114f are formed by the ACF 122.

In a peripheral area which is opposite to the FPC 104, an external connecting terminal 131 is formed. The external connecting terminal 131 is connected to an external circuit which is not shown in the drawing. The liquid crystal driving ICs 103a and 103b are driven by signals which are transmitted from the external circuit. The scanning signal is supplied to either one of the first electrode 114a or the second electrode 114b, and the data signal is supplied to the other one of the above-mentioned electrodes. By doing this, voltage of each of the picture element pixels in dot matrix manner which are disposed inside the effective displaying area V are controlled. As a result, the orientation of the liquid cryatal L is controlled according to each picture element pixel.

In FIG. 18, a lighting apparatus 106 which works as a backlight comprises a light introducing member 132 which is made from an acrylic resin, a dispersing sheet 133 which is provided on a light emitting surface 132b of the light introducing member 132, a reflecting sheet 134 which is provided on an opposite surface of the light emitting surface 132b of the light introducing member 132, and an LED (light emitting diode) as a illuminating source as shown in FIG. 19.

The LED 136 is supported by an LED base board 137. The LED base board 137 is mounted on the supporting member (not shown in the drawing) which is formed integrally with, for example, the light introducing member 132. By disposing the LED base board 137 in a predetermined position in the supporting member, the LED 136 is disposed in a position which faces a light collecting surface 132a which is a vertical surface of the light introducing member 132. Here, reference numeral 138 indicates a buffering member for buffering impacts which are given to the liquid crystal panel 102.

When the LED 136 illuminates, the light is collected by the light collecting surface 132a so as to be introduced inside the light introducing member 132. Consequently, the light is emitted to the outside from the light emitting surface 132b via the dispersing sheet 133 while the light is reflected by a wall surface of the reflecting sheet 134 and the light introducing member 132.

The liquid crystal apparatus 101 according to the present embodiment is made as explained above. When external light such as sunlight or room light is sufficiently bright, in FIG. 19, the external light is collected inside the liquid crystal panel 102 via the second base board 107b. After the light passes the liquid crystal L, the light is reflected by the reflecting film 112 so as to be supplied to the liquid crystal L again. The orientation of the liquid crystal L is controlled by electrodes 114a and 114b which sandwich the liquid crystal L according to picture element pixels such as those of R, G, and B. Accordingly, the light which is supplied to the liquid crystal L is modulated according to each of the picture element pixels; and thus, by the modulation, images such as a letter and a numeral are displayed on an external surface of the liquid crystal panel 102 by combination of the light which is transmitted through the polarizing plate 117b and the light which does not transmit therethrough.

On the other hand, when the external light is not collected sufficiently, the LED 136 illuminates so as to emit a plane light from the light emitting surface 132b of the light introducing member 132. The light is supplied to the liquid crystal L via the opening section 121 which is formed on the reflecting film 112. At this time, similarly to the a case of the display operation according to the reflecting method, the supplied light is modulated by the liquid crystal L in which the orientation is controlled according to the picture element pixel. By doing this, the images are displayed toward the outside; thus, the display operation according to the transmitting method is performed.

The liquid crystal apparatus 101 having the above-explained structure is manufactured according to manufacturing method shown in, for example, FIG. 17. In the manufacturing method, the first base board 107a is manufactured by a series of process P1 to P6. The second base board 107b is manufactured by a series of process P11 to P14. It is common for the processes for manufacturing the first base board and the processes for manufacturing the second base board to be performed independently.

The processes for manufacturing the first base board is explained as follows. The reflecting film which corresponds to a plurality of liquid panel 102 is formed on a surface of a large area motherboard material which is made from the translucent glass member or translucent plastic member according to photolithography methods or the like. Furthermore, the insulating layer 113 is formed thereon by using common film forming method (process P1). Next, the first electrode 114a, the extended wirings 114c and 114d, the metal wirings 114e and 114f are formed by using the photolithography method or the like (process P2).

After that, the oriented film 116a is formed on the first electrode 114a by an applying method or a printing method (process P3). Furthermore, an initial orientation of the liquid crystal is determined by performing a rubbing operation on the oriented film 116a (process P4). Next, the sealing member 108 is formed in a circular manner by a screen printing method or the like (process P5). Furthermore, a spherical spacer 119 is dispersed thereon (process P6). By doing this, a large area first motherboard having a plurality of panel patterns of the first base board 107a of the liquid panel 102 is formed.

Apart from the above-explained processes for manufacturing the first base board, the processes for manufacturing the second base board are performed (processes P11 to P14 in FIG. 17). First, a large area motherboard material member which is made from a translucent glass member or a translucent plastic member is prepared. A color filter 118 which is equal to a plurality of the liquid crystal panels 102 is formed on a surface of the motherboard material member (process P11). Processes for forming the color filter 118 are shown in the manufacturing method shown in FIG. 6. Each color filter element such as those of R, G, and B in the manufacturing method is made by using the liquid drop ejecting apparatus 16 shown in FIG. 8 according to a controlling method for the ink jet head 22 as shown in FIGS. 1 to 4. Technical features of the manufacturing method for the color filter and the controlling method for the ink jet head 22 are the same as those described previously in the specification; therefore, explanation is omitted.

As shown in FIG. 6D, when a color filter 1 such as a color filter 118 is formed on the motherboard 12 such as the motherboard material member, the second electrode 114b is subsequently formed thereon consequently by a photolithography method (process P12). Furthermore, the oriented film 116b is formed by an applying method or a printing method (process P13). Next, rubbing process is performed on the oriented film 116b; thus, the initial orientation of the liquid crystal is determined (process P14). By doing this, a large area second motherboard having a plurality of panel patterns of the liquid crystal panel 102 on the second base board 107b is formed.

As explained above, after a large area first motherboard and a large area second motherboard are formed, these motherboards are sandwiched between the sealing members 108. Furthermore, after the positions of these boards are aligned, these motherboards are attached (process P 21). By doing this, an empty panel containing a panel member in which the liquid crystal which is equal to a plurality of the liquid crystals is contained and no liquid crystal is poured thereinto is formed.

Next, a scribed groove as a cutting groove is formed in a predetermined position on the finished empty panel structure member. Furthermore, the panel structure member is cut by the scribed groove as a cutting reference (process P22). By doing this, an empty panel structure member with a slit in which the liquid crystal pouring mouth 110 (see FIG. 18) of the sealing member 108 on each liquid crystal panel is exposed to the outside is formed.

After that, the liquid crystal L is poured inside each of the liquid crystal panel via the exposed liquid crystal pouring mouth 110. Furthermore, each liquid crystal pouring mouth 110 is sealed by resin or the like (process P23). In an ordinary liquid crystal pouring process, for example, a liquid crystal is stored in a storing container. The storing container in which the liquid crystal is stored and the empty panel with a slit condition are contained in a chamber or the like. Air is evacuated from the chamber, and the empty panel with a slit is dipped into the liquid crystal in the chamber. After that, the liquid crystal is poured when the chamber is opened to an atmospheric pressure. At this time, the inside of the empty panel is under a vacuum condition. Therefore, the liquid crystal is compressed by the atmospheric pressure, and the liquid crystal is introduced into the panel through the liquid crystal pouring mouth. After pouring the liquid crystal, the liquid crystal sticks around the liquid crystal structure member. Therefore, the panel with a slit is cleaned in a process P24 after the liquid crystal pouring process.

After the liquid crystal pouring process and the cleaning process, the scribed groove is formed in a predetermined position of the mother panel with a slit. Furthermore, the panel with a slit is cut by the scribed groove as a cutting reference point. By doing this, a plurality of independent liquid crystal panels 102 are cut into pieces (process P25). As shown in FIG. 18, the liquid crystal driving ICs 103a and 103b are mounted to each of independent liquid crystal panels 102 which is manufactured in the above-explained processes, and the lighting apparatus 106 as a back light is mounted to the liquid crystal panel 102. Furthermore, by connecting the FPC 104 to the liquid crystal panels 102, the liquid crystal apparatus 101 as a final product is completed (process P26).

Manufacturing method for the liquid crystal apparatus explained above and the manufacturing apparatus therefor have the following characteristics, particularly in the manufacturing steps for the color filter 1. That is, the color filter 1 shown in FIG. 5A such as independent filter element 3 in the color filter 118 shown in FIG. 19 is not formed at one time of main scanning X of the ink jet head 22 (see FIG. 1). The ink is ejected to each of independent filter elements 3 multiple times n such as, for example 4 (four) by a plurality of nozzles 27 which belong to different groups. By doing this, the filter element 3 is formed in a predetermined thickness. Therefore, if ink ejection amount differs among a plurality of nozzles 27, it is possible to prevent different thicknesses of the plurality of filter elements 3. Therefore, it is possible to maintain the planar translucency of the color filter 1 uniformly. This means that clear color display operation without non-uniform color shifting is possible in the liquid crystal apparatus 101 shown in FIG. 19.

Also, in a manufacturing method for the liquid crystal apparatus explained above and the manufacturing apparatus therefor according to the present embodiment, the filter element 3 is formed by ejecting the ink by using the ink jet head 22 by using the liquid drop ejecting apparatus 16 as shown in FIG. 8. Therefore, a complicated manufacturing process such as photolithography is not necessary, and the material member which is used for manufacturing the filter element is not wasted.

(Explanation for Manufacturing Method for an Electrooptical Apparatus Using an EL Element and a Manufacturing Apparatus Therefor)

Figure 20:
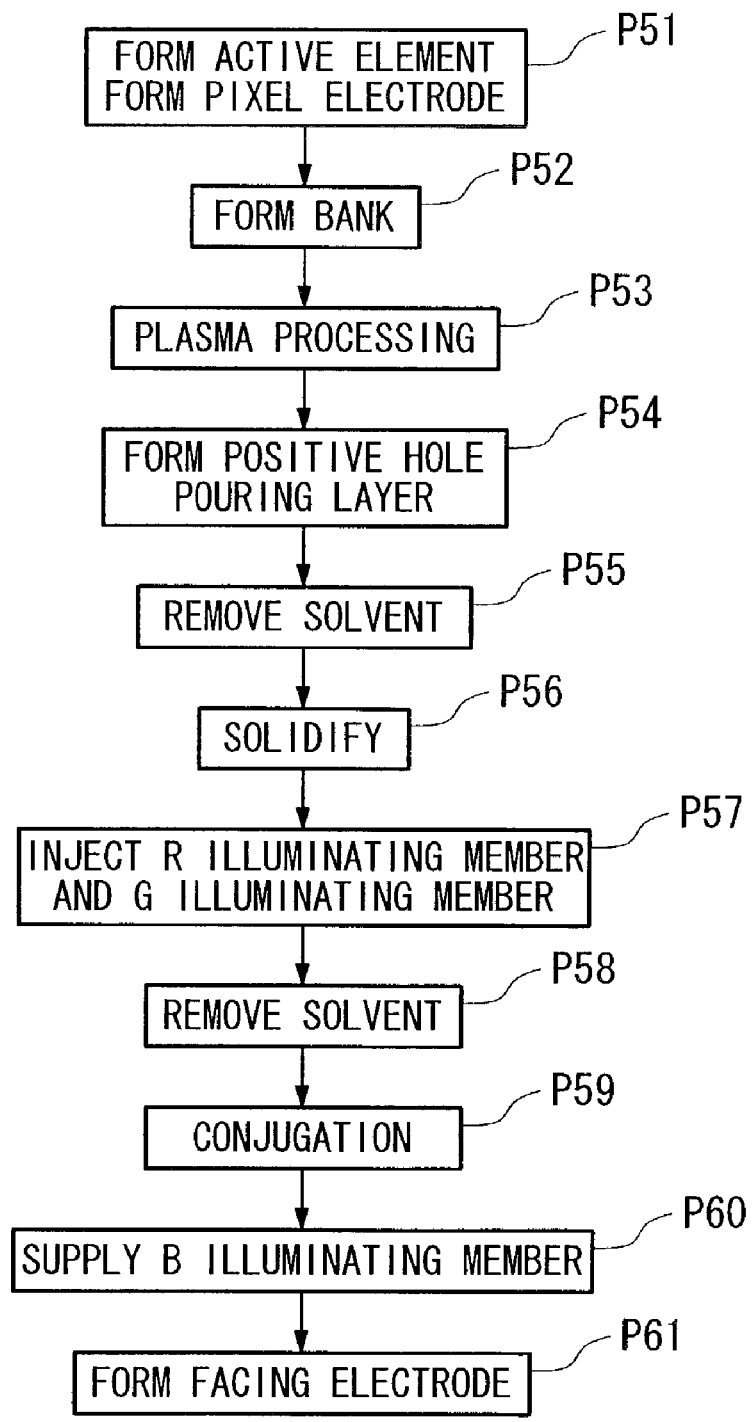
FIG. 20 is a process chart showing an embodiment of the manufacturing method for an EL apparatus according to the present invention.

FIG. 20 shows an embodiment of a manufacturing method for an EL apparatus as an example for an electrooptical apparatus according to the present invention. Also, FIGS. 21A to 21D show important parts of the manufacturing process for an EL apparatus and a main part of a cross section of the EL apparatus as a final product. As shown in FIG. 21D, an EL apparatus 201 forms an pixel electrode 202 on a transparent base board 204. Also, the EL apparatus 201 forms a bank 205 between the pixel electrodes 202 in a grid manner viewed in an arrow direction G in the drawing.

A positive hole ejection layer 220 is formed in a grid concave section. An R color illuminating layer 203R, a G color illuminating layer 203G, and a B color illuminating layer 203B are formed in each of the grid concave sections in a predetermined array disposition such as stripe dispositions viewed in an arrow direction G in the drawing. Furthermore, by forming a facing electrode 213 thereon, an EL apparatus 201 is formed.

When the pixel electrode 202 is driven by an active element having two terminals such as TFD (Thin Film Diode), the above-mentioned facing electrode 213 is formed in a stripe manner viewed in an arrow direction G. Also, the pixel electrode 202 is driven by an active element having three terminals such as TFT (Thin Film Transistor), the above-mentioned facing electrode 213 is formed in a simple surface form.

A region which is sandwiched between the pixel electrode 202 and the facing electrode 213 becomes one picture element pixel. The three color picture element pixels forms one unit so as to form one pixel. By controlling an electric current which flows in the picture pixel, a desirable one of a plurality of picture element pixel is illuminated selectively. By doing this, it is possible to display a desirable full-color image viewed in an arrow direction H.

The above-mentioned EL apparatus 201 is manufactured by a manufacturing method shown in, for example, FIG. 20. That is, active elements such as a TFD element or a TFT element are formed on a surface of the transparent base board 204 as shown in a process P 51 and FIG. 21A. Furthermore, a pixel electrode 202 is formed thereon. Here, as a forming method, for example, photolithography method, vacuum evaporation method, sputtering method, or a pyrosol method can be used. As a raw material for the pixel electrode 202, ITO (Indium-Tin Oxide), tin oxide, composite oxide of indium oxide, and zinc oxide can be used.

Figure 21A:
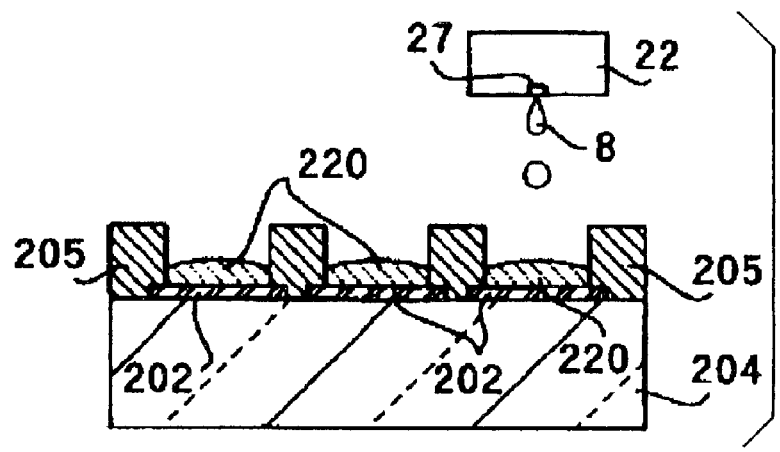
FIGS. 21A to 21D are cross sections of the EL apparatus corresponding to the process chart shown in FIG. 20.

Next, as shown in a process P 52 and FIG. 21A, a bulkhead such as a bank 205 is formed by using a common patterning method such as a photolithography method. Spaces between the transparent pixel electrodes 202 are buried by the bank 205. By doing this, contrast improves, mixing of the color illuminating members is prevented, and light leakage from between pixels can be prevented. For a raw material for a bank 205, there is no problem as long as the raw material is durable to solvents for dissolving the EL illuminating member. It is preferable that a fluorocarbon polymer coating be formed on a surface of the raw material for a bank 205 by performing a fluorocarbon plasma processing. For such a material, an organic component such as acrylic resin, epoxy resin, and photosensitive polyimide may be mentioned.

Next, just before applying a positive hole pouring ink as a functional liquid material, a continuous plasma processing of the oxygen gas and the fluorocarbon plasma is performed to the transparent base board 204 (process P53). By doing this, a surface of polyimide becomes water-repellant. A surface of the ITO becomes hydrophilic. Thus, wettablity of a base board for performing a patterning of the liquid drop can be finely controlled. For a plasma generating apparatus, an apparatus which can generate plasma under vacuum conditions, and an apparatus which can generate plasma under atmospheric pressure conditions can be used similarly.

Next, as shown in process P54 and FIG. 21A, a positive hole pouring ink is ejected from an ink jet head 22 of the liquid drop ejecting apparatus 16 shown in FIG. 8 so as to apply a patterning on a surface of the pixel electrode 202. Specifically, in order to control the ink jet head 22, any one among controlling methods shown in FIGS. 1, 2, 3, and 4 may be used. After applying the patterning, a solvent is removed under conditions of a vacuum (1 torr), at room temperature, for 20 minutes (process P55). After that, by performing a heating process under conditions of atmospheric pressure, 20° C. (on a hot plate), 10 minutes, a positive hole pouring layer 220 which is not soluble with the illuminating layer ink is formed (process P56). Under the above-mentioned conditions, the thickness of the layer was 40 nm.

Figure 21B:
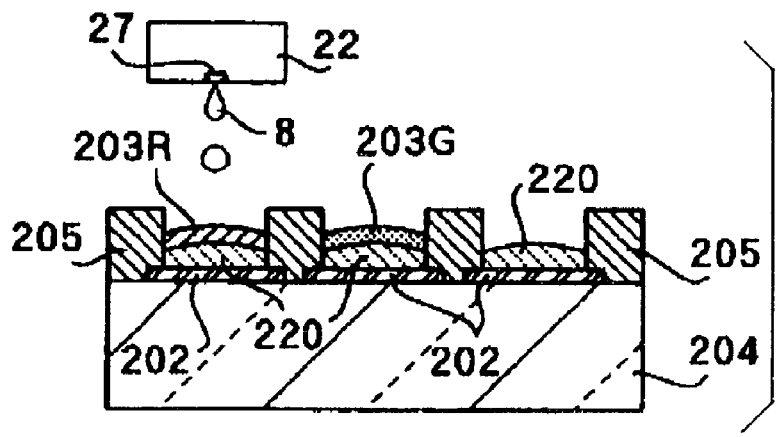

Next, as shown in a process P57 and FIG. 21B, the R illuminating layer ink as an EL illuminating member as a functional liquid material and a G illuminating layer ink as an EL illuminating member as a functional liquid material are applied on the positive hole pouring layer 220 in each of the filter element forming areas 7 by using a liquid drop ejecting method. Here, each of the illuminating layer inks are ejected from the ink jet head 22 of the liquid drop ejecting apparatus 16 shown in FIG. 8. For a controlling method for the ink jet head 22, any one of the methods shown in FIGS. 1 to 4 is used. By using the ink jet method, it is possible to perform a fine patterning operation easily and quickly. Also, by changing the a density of solid parts of ingredients in the ink and the ejection amount, it is possible to change the thickness.

After applying the illuminating layer ink, the solvent is removed under condition of, for example, a vacuum (1 torr), at room temperature, for 20 minutes (process P58). Consequently, by performing a conjugating operation by the heating process under condition of, for example, a nitrogen atmosphere, at 150° C., for 4 hours, the R color illuminating layer 203R and the G color illuminating layer 203G are formed (process P59). Under the above-mentioned conditions, the thickness of the layer was 50 nm. The illuminating layer which was conjugated by the heating process is not soluble in the solvent.

Here, it is acceptable that a continuous plasma processing of the oxygen gas and the fluorocarbon gas plasma be performed to the positive hole pouring layer 220 before forming the illuminating layer. By doing this, a fluorocarbon polymer coating can be formed on the positive hole pouring layer 220. Therefore, an ionizing potential increases. Because of this, the positive hole pouring efficiency increases. Thus, it is possible to provide an organic EL apparatus having high illuminating efficiency.

Figure 21C:
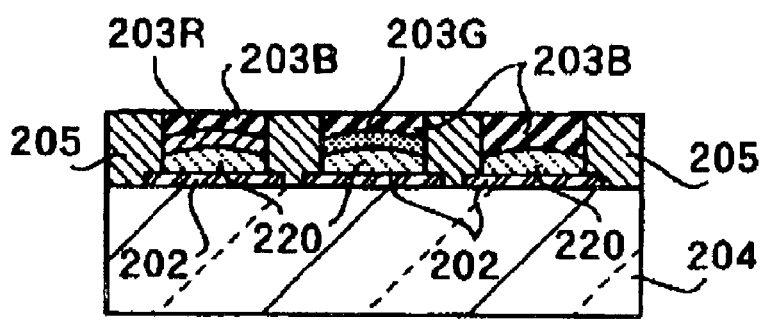
Figure 21D:
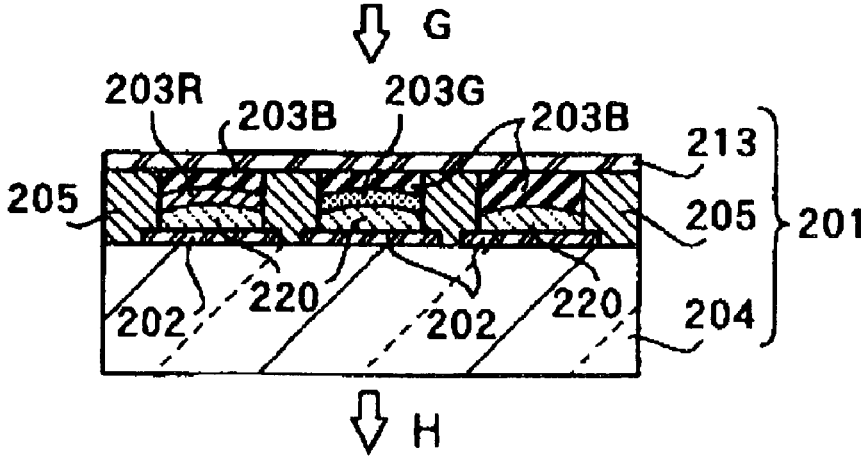

Next, as shown in a process P60 and FIG. 21C, the B color illuminating layer 203 as the EL illuminating member as a functional liquid material is formed on the R color illuminating layer 203R, the G color illuminating layer 203G, and the positive hole pouring layer 220 in each picture element pixel. By doing this, it is possible not only to form three primary colors such as those of R, G, and B, but also to bury gaps among the R color illuminating layer 203R, the G color illuminating layer 203G, and the bank 205 so as to flatten them. By doing this, it is possible to prevent a short-circuit between electrodes which are disposed vertically. By adjusting the thickness of the B color illuminating layer 203B, the B color illuminating layer 203B works as an electron pouring transporting layer in a layered structure of the R color illuminating layer 203R and the G color illuminating layer 203G; thus, the B color illuminating layer 203B does not illuminate in Blue.

For a forming method for the B color illuminating layer 203B as explained above, for example, a common spin-coating method can be used as a wet method. Otherwise, an ink jet method which is equivalent to a forming method for the R color illuminating layer 203R and the G color illuminating layer 203G can be used.

After that, as shown in a process P61 and FIG. 21D, a desired EL apparatus 201 is manufactured by forming a facing electrode 213. If the facing electrode 213 is in a form of a surface electrode, the facing electrode 213 can be formed by a film forming method such as a vacuum evaporation method, or sputtering method using material members such as Mg, Ag, Al, and Li or the like. Also, if the facing electrode 213 is in the form of a stripe electrode, the coated electrode layer can be formed by a patterning method such as a photolithography method vacuum evaporation method, or sputtering method using material members such as Mg, Ag, Al, and Li or the like.

In the manufacturing method for the EL apparatus 201 and the manufacturing apparatus therefor as explained above, any one of the controlling methods shown in FIGS. 1 to 4 is used as the controlling method for the ink jet head. Therefore, the positive hole pouring layer 220, the R color illuminating layer 203R, the G color illuminating layer 203G, and the B color illuminating layer 203B in each picture element pixel in FIGS. 21A to 21D are formed not by one time of the main scanning operation X of the ink jet head (see FIG. 1), but by receiving the ink ejection multiple times (n times, for example, 4 times) by the positive hole pouring layer in a piece of the picture element pixel and/or each color illuminating layer of a plurality of nozzles 27 which belong to different nozzle groups in a predetermined thickness. By doing this, the ink ejection amount differs among a plurality of nozzles 27, and it is possible to avoid that the thickness of the color illuminating layers differing among a plurality of the picture element pixels. Therefore, it is possible to equalize planar illumination distribution characteristics of the illuminating surface of the EL apparatus 201. This means that clear color-display operation without uneven color contrast can be realized in the EL apparatus shown in FIG. 21D.

Also, in the manufacturing method for the EL apparatus and the manufacturing apparatus according to the present embodiment, by using the liquid drop ejecting apparatus 16 as shown in FIG. 8, each of the color picture element pixels such as those of R, G, and B are formed by ejecting the ink by the ink jet head 22. Therefore, complicated manufacturing method such as photolithography method is not necessary. Also, the material member which is used for manufacturing the filter element is not wasted.

(An Embodiment of a Manufacturing Method for a Color Filter and a Manufacturing Apparatus Therefor)

Figure 33A:
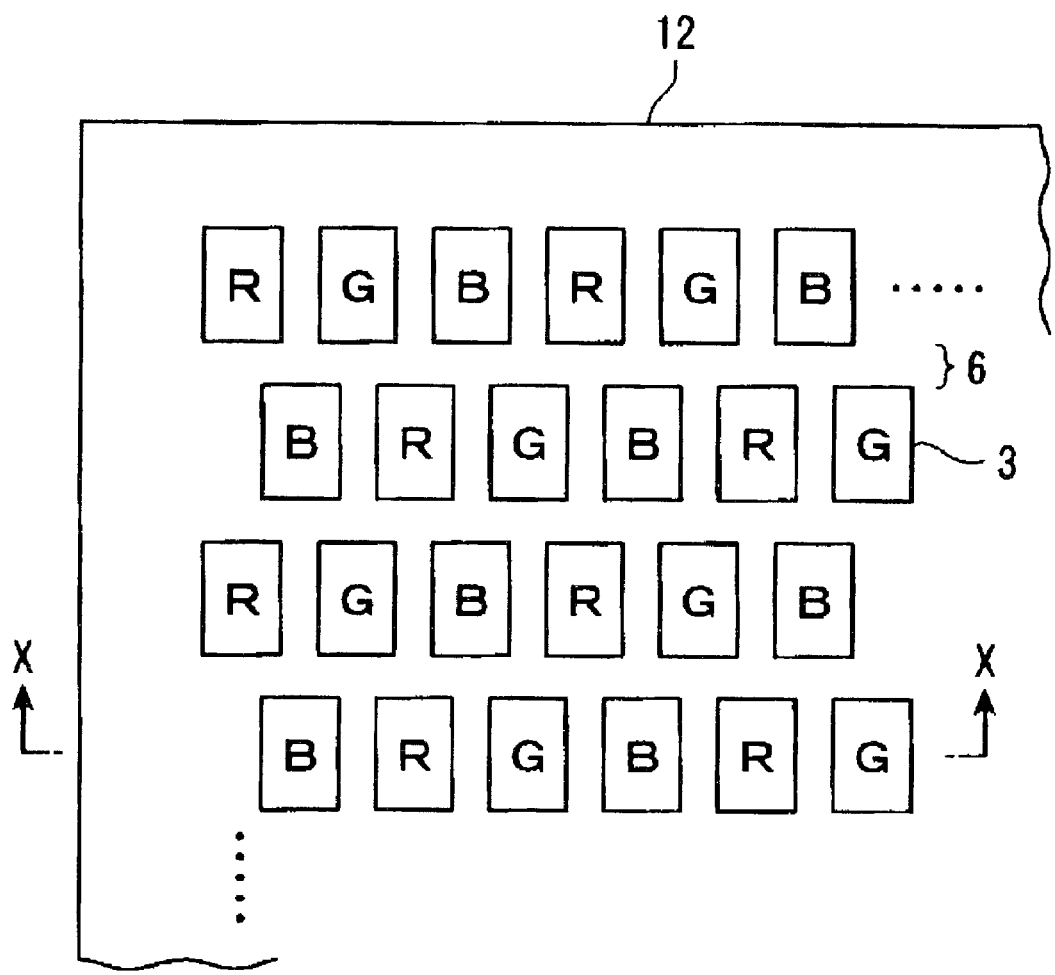
FIGS. 33A and 33B are views showing the color filter which is manufactured by the manufacturing apparatus for the color filter graphically.
Figure 33B:
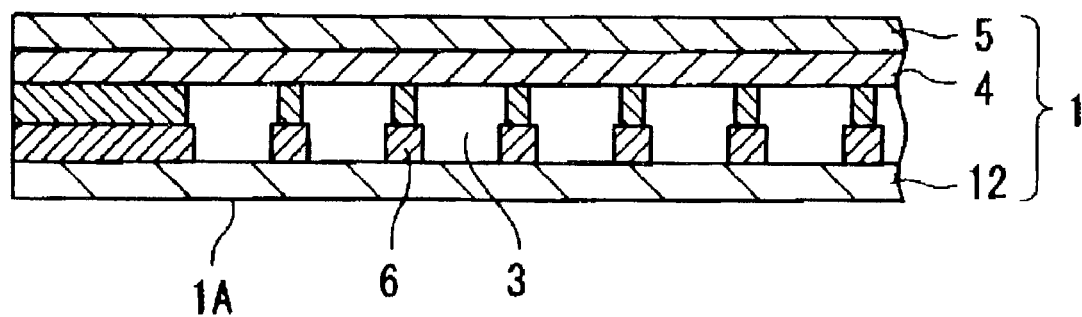

Next, an embodiment of a manufacturing apparatus for a color filter according to the present invention is explained with reference to the drawings as follows. First, before explaining the manufacturing apparatus for a color filter, the color filter which is supposed to be manufactured is explained. FIGS. 33A and 33B are enlarged views of a color filter. FIG. 33A is a plan view. FIG. 33B is a cross section viewed along a line X—X shown in FIG. 33A. Here, in the color filter shown in FIGS. 33A and 33B, the structural members which are the same as those of the color filter 1 shown in FIG. 5 are explained with the same reference numerals.

(Structure of the Color Filter)

In FIG. 33A, the color filter 1 is provided with a plurality of pixels 1A which are disposed in matrix manner. These pixels 1A are separated by bulkhead 6 as a border. To each one of the pixels 1A, the color filter member as a liquid material which is any one of inks such as those of R (red), G (green), or B (blue) such as filter element member 13 are introduced. Disposition of the colors such as those of R, G, and B has been explained to be, for example, a mosaic disposition. Also, as explained above, any disposition such as a stripe disposition or a delta disposition can be applied. The color filter 33 is shown in FIG. 33A and 33B.

The color filter 1 is provided with a translucent base board 12 and a translucent bulkhead 6 as shown in FIG. 33B. A region where the bulkhead 6 is not formed, that is, a removed area, is the above-explained pixel 1A. The filter element 13 for each color which is introduced to the pixel 1A becomes a filter element 3 which is supposed to be a coloring layer. On surfaces of the bulkhead 6 and the filter element 3, a protecting coating 4 and an electrode layer 5 are formed as a protecting layer.

(Structure of a Manufacturing Apparatus for Color Filter)

Figure 22:
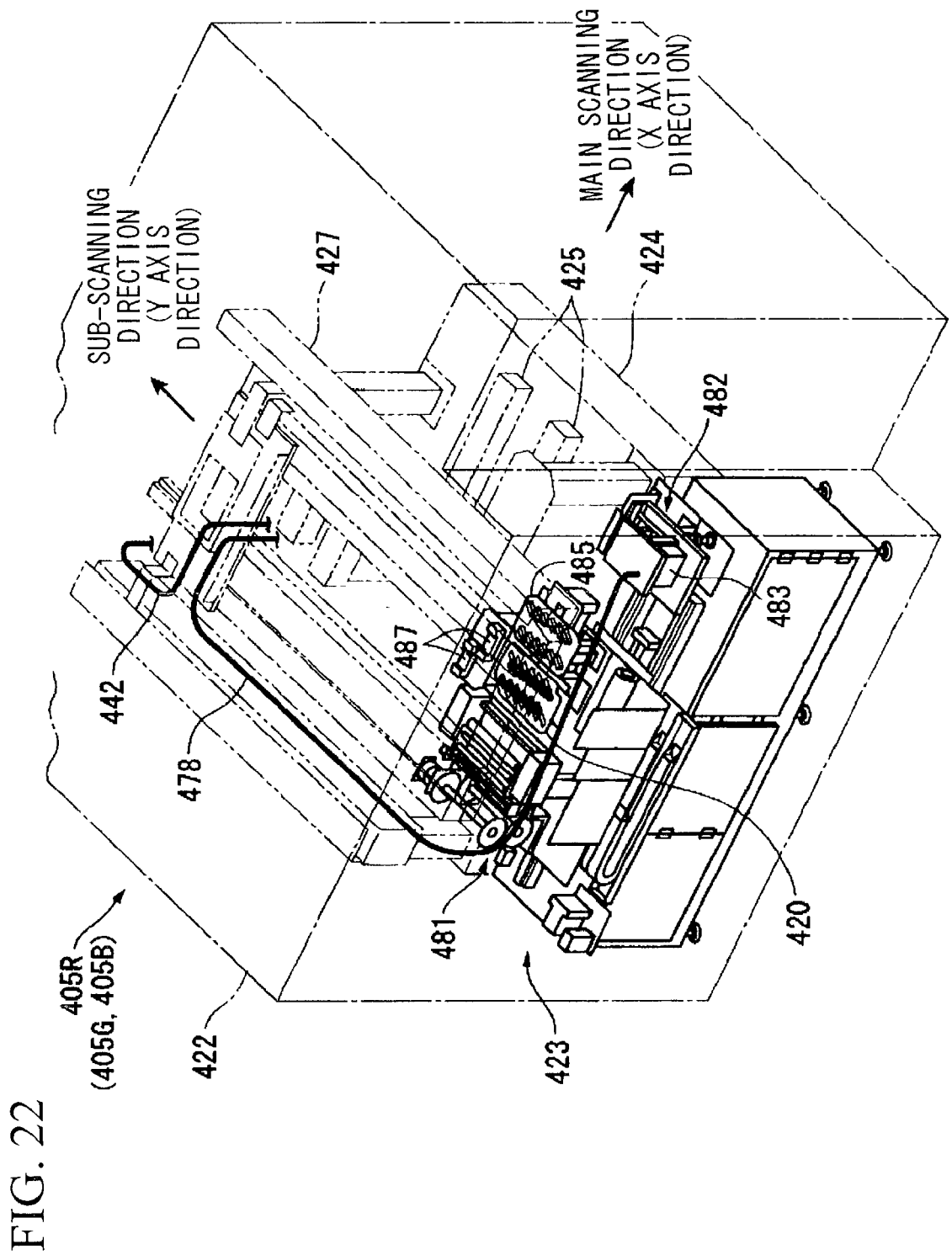
FIG. 22 is a perspective view showing a liquid drop ejection processing apparatus in the liquid drop ejecting apparatus which is provided in the manufacturing apparatus for the color filter according to the present invention, an internal portion of which can be seen.

Next, a structure for a manufacturing apparatus for the above-mentioned color filter is explained with reference to the drawings as follows. FIG. 22 is a perspective view showing a liquid drop ejecting apparatus in a manufacturing apparatus for a color filter according to the present invention.

The manufacturing apparatus for color filters manufactures a color filter which is contained in the color liquid crystal panel as an electrooptical apparatus. The manufacturing apparatus for color filters is provided with a liquid drop ejecting apparatus which is not shown in the drawing.

(Structure of Liquid Drop Ejecting Apparatus)

The liquid drop ejecting apparatus has 3 sets of liquid drop ejecting processing apparatuses 405R. 405G, and 405B as shown in FIG. 22, similarly to the case of the liquid drop ejecting apparatus of which an embodiment is explained above. These liquid drop ejecting processing apparatuses 405R, 405G, and 405B correspond to 3 colors such as those of R, G, and B which are ejected to the motherboard 12 as filter element members such as those of R, G, and B as color filter members as a liquid ink. Here, the liquid drop ejecting processing apparatus 405R, 405G, and 405B are disposed nearly in a series so as to form the liquid drop ejecting apparatus. Also, to the liquid drop ejecting processing apparatus 405R, 405G, and 405B, a controlling apparatus for controlling a movement of each structural member is provided integrally.

Here, to the liquid drop ejecting processing apparatus 405R, 405G, and 405B, transporting robots, which are not shown in the drawings, for bringing in and out a piece of motherboard 12 to the liquid drop ejecting processing apparatus 405R, 405G, and 405B are connected respectively. Also, to the liquid drop ejecting processing apparatus 405R, 405G, and 405B, for example, 6 pieces of motherboard 12 can be contained. Also, to the liquid drop ejecting processing apparatus 405R, 405G, and 405B, a multi-stage baking furnace, which is not shown in the drawings, is connected for desiccating the filter element member 13 which is ejected after the motherboard 12 is heated under conditions of, for example, 120° C., for 5 minutes.

In addition, each of the liquid drop ejecting processing apparatuses 405R, 405G, and 405B has a thermal clean chamber 422 as a hollow casing as shown in FIG. 22. The temperature inside the thermal clean chamber 422 is adjusted to, for example, 20±0.5° C. so as to realize better and stable dotting in the ink jet method and so as to prevent dust from entering from thereoutside. In the thermal clean chamber 322, a liquid drop ejecting processing apparatus 423 is provided.

The liquid drop ejecting processing apparatus 423 has an X-axis air slide table 424 as shown in FIG. 22. On the X-axis air slide table 424, a main scanning driving unit 425 having a linear motor, not shown in the drawings thereon is disposed. The main scanning driving apparatus 425 has a base stand section, not shown in the drawings for fixing the motherboard 12 by, for example, absorbing method and moves the base stand section in the main scanning direction against the motherboard 12 which is disposed in an X-axis direction.

In the liquid drop ejecting processing apparatus 423, as shown in FIG. 22, a sub-scanning driving apparatus 427 which is located above the X-axis air slide table 24 as a Y-axis table is disposed. The sub-scanning driving apparatus 427 moves the head unit 420 for ejecting the filter element member 13 in, for example, a vertical direction in the sub-scanning direction against the motherboard 12 which is disposed in Y-axis direction. Here, in FIG. 22, the head unit 420 is described by a continuous line as if it floats therein-side for better understanding of the positioning relationship between the head unit 420 and the motherboard 12.

Also, in the liquid drop ejecting processing apparatus 423, various cameras not shown in the drawing as a position acknowledging member for acknowledging the position of the ink jet head 421 and the motherboard 12 so as to control them are disposed. Here, the position of the head unit 420 and the base stand section can be controlled not only by a position controlling method using a pulse motor but also by a feedback controlling method using a servo-motor and any desirable controlling methods.

Also, in the liquid drop ejecting processing apparatus 423, as shown in FIG. 22, a wiping unit 481 for wiping a surface from which the filter element member 13 is ejected in the head unit 420 is disposed. The wiping unit 481 is formed by winding up an end of a wiping member, not shown in the drawings appropriately which is made by layering a cloth and rubber sheet integrally. The wiping unit 481 wipes the surface from which the filter element member 13 is ejected always by a new wiping surface. By doing this, the filter element member 13 which sticks to the ejection surface is removed so as to prevent the nozzle 466 from being clogged.

Furthermore, in the liquid drop ejecting processing apparatus 423, as shown in FIG. 22, an ink system 482 is provided. The ink system 482 is provided with an ink tank 483 for storing the filter element member 13, a supply pipe 478 through which the filter element member 13 can pass, and a pump for supplying the filter element member 13 from the ink tank 483 through the supply pipe 478 to the head unit 420. Here, in FIG. 22, disposition of the supply pipe 478 is graphically shown such that the supply pipe 478 is connected from the ink tank 483 to the sub-scanning driving apparatus 427 so as not to influence the movement of the head unit 420. Also, the filter element member 13 is supplied to the head unit 420 from above the sub-scanning driving apparatus 427 for driving the scanning operation of the head unit 420.

Also, in the liquid drop ejecting processing apparatus 423, a weight measuring unit 485 for measuring the ejection amount of the filter element member 13 which is ejected from the head unit 420 is provided.

Furthermore, in the liquid drop ejecting processing apparatus 423, a pair of missing-dot detecting units 487 having, for example, a light sensors, not shown in the drawings, for monitoring ejecting condition of the filter element member 13 which is ejected from the head unit 420 is disposed. In the missing-dot detecting units 487, a light source of the light sensor, not shown in the drawings, and a light receiving section are disposed so as to face each other having a space through which the ejected liquid drop 8 which is ejected from the head unit 420 passes in an X-axis direction which crosses diagonally a direction in which the liquid material is ejected from the head unit 420. Also, the missing-dot detecting units 487 are disposed in a Y-axis direction in a direction in which the head unit 420 is transported. The missing-dot detecting unit 487 detects a missing-dot by monitoring the ejection condition each time the head unit 420 performs the sub-scanning movement so as to eject the filter element member 13.

Although detail explanation is made later, in the head unit 420, head apparatuses 433 for ejecting the filter element member 13 are disposed in 2 arrays. By doing this, a pair of missing-dot detecting units 487 are disposed so as to monitor the ejection condition for each head apparatus in each of the arrays.

(Structure of Head Unit)

Figure 23:
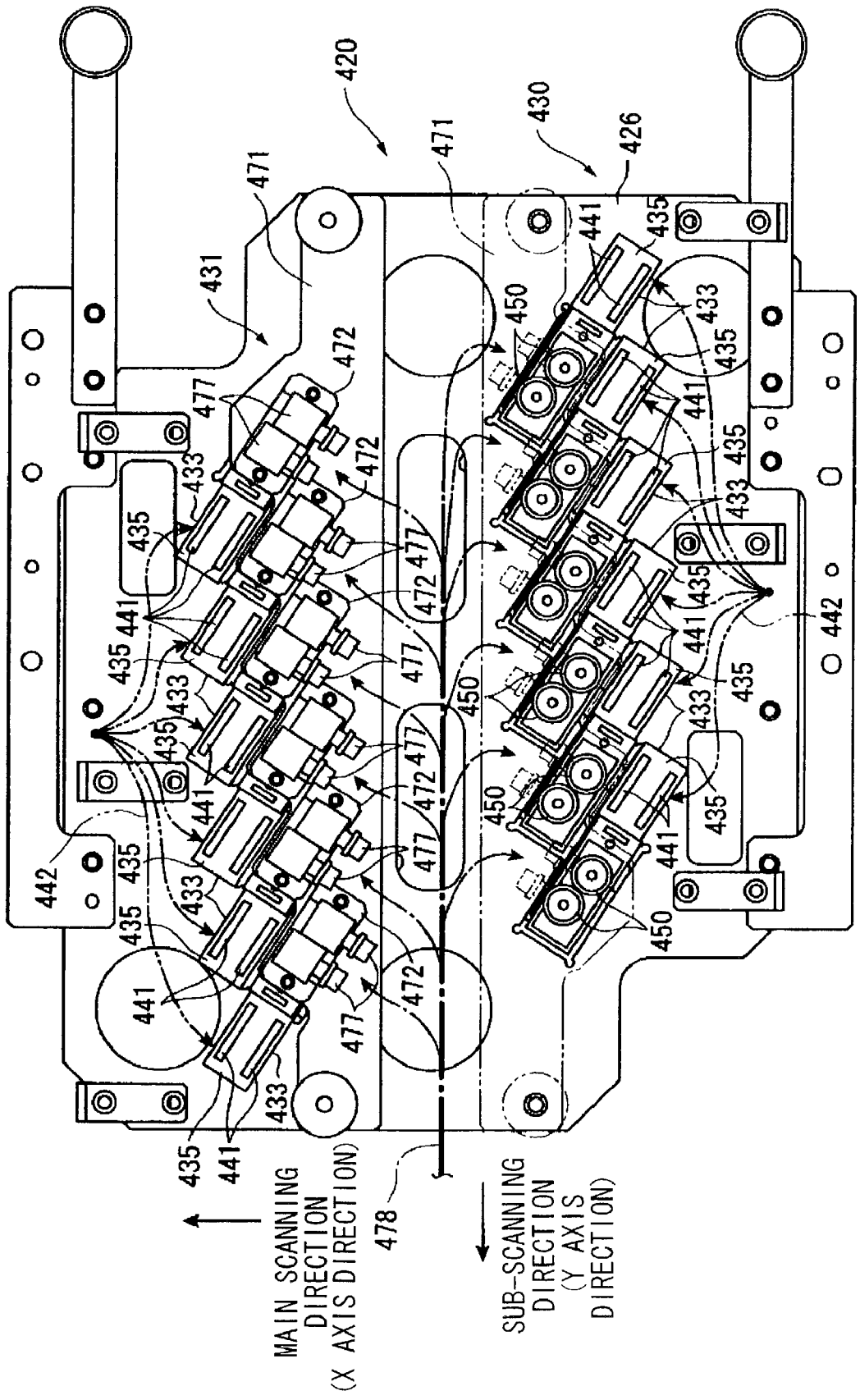
FIG. 23 is a plan view showing the head unit of the liquid drop ejecting processing apparatus.
Figure 24:
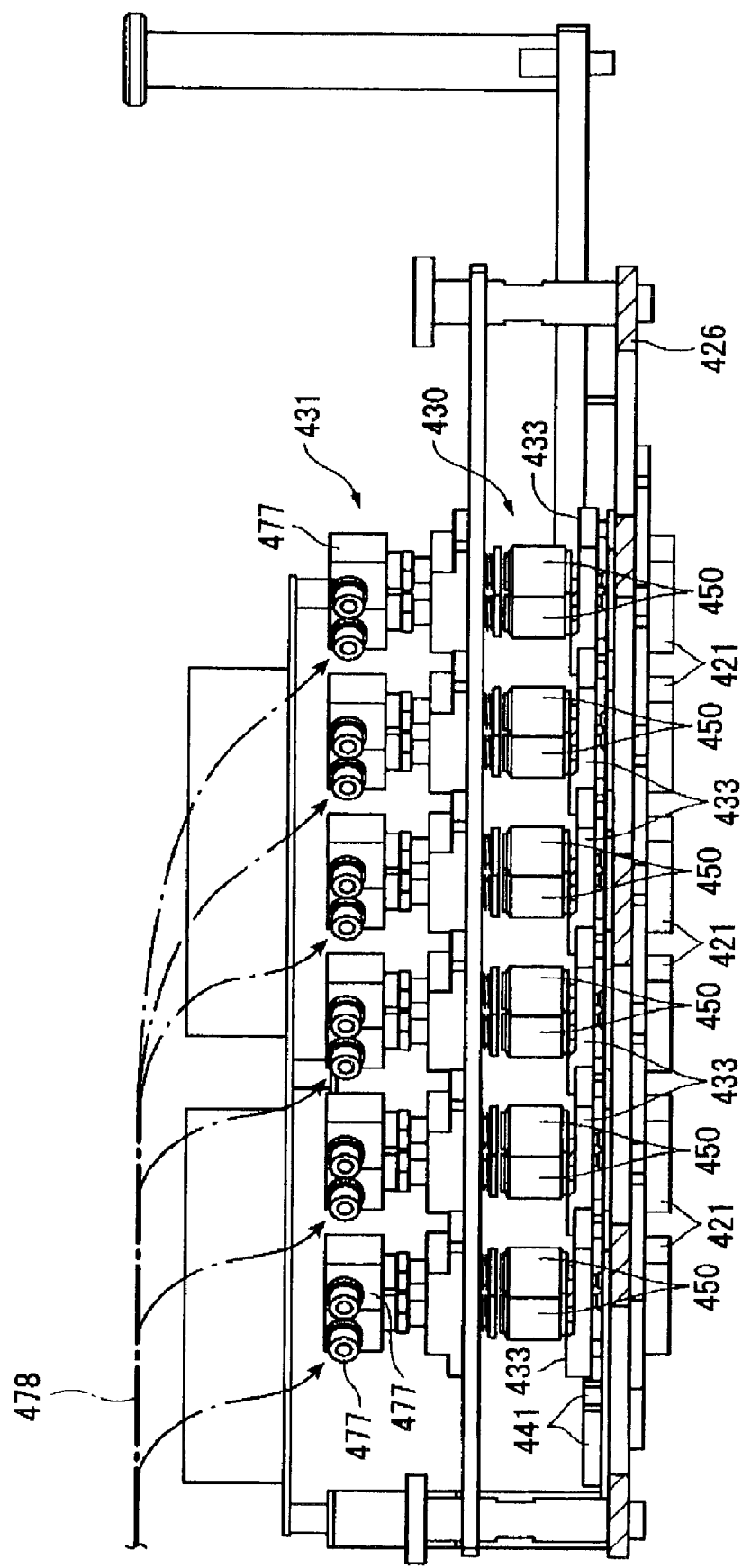
FIG. 24 is a side view showing the head unit of the liquid drop ejecting processing apparatus.
Figure 25:
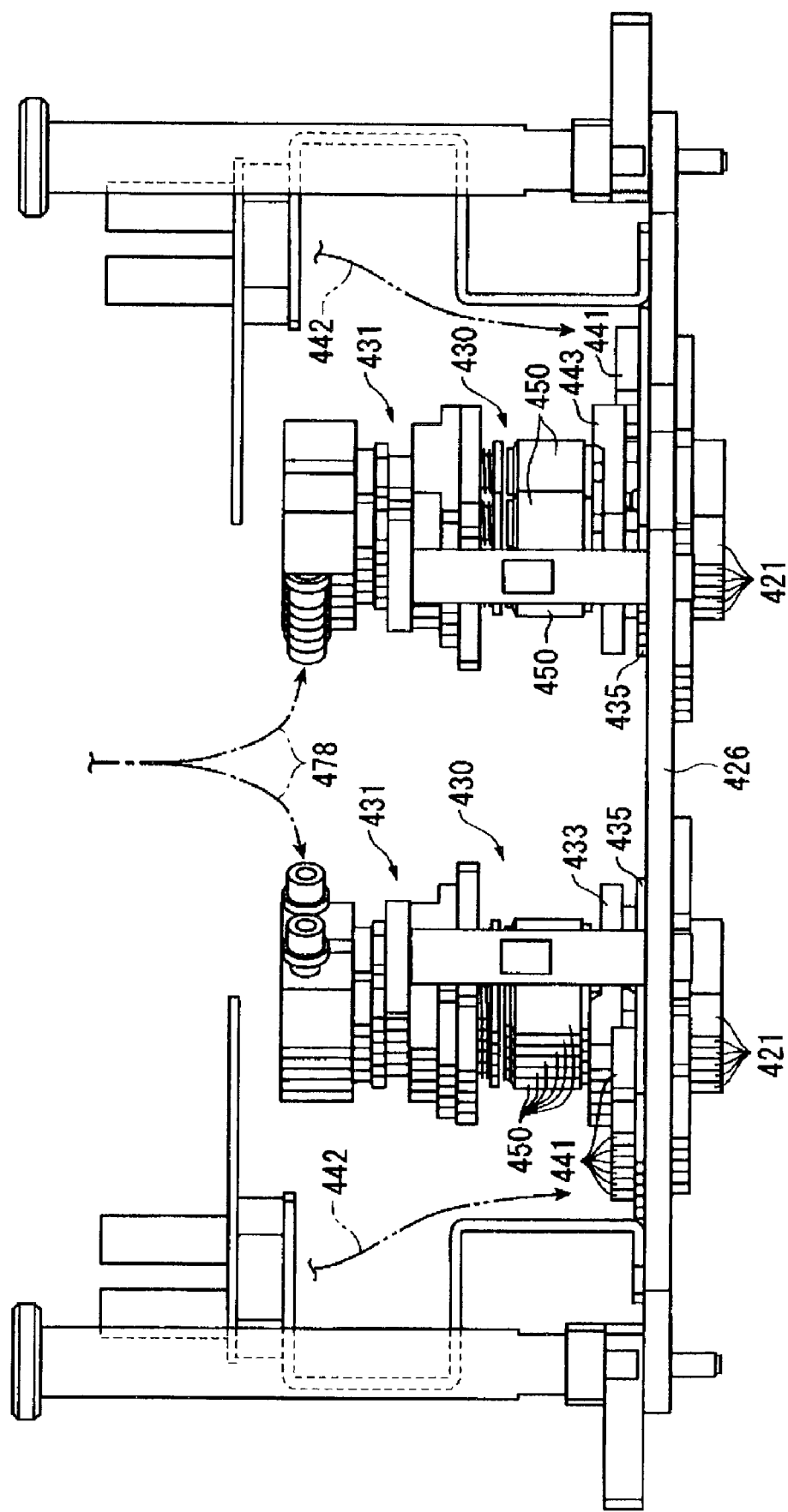
FIG. 25 is a front view showing the head unit of the liquid drop ejecting processing apparatus.
Figure 26:
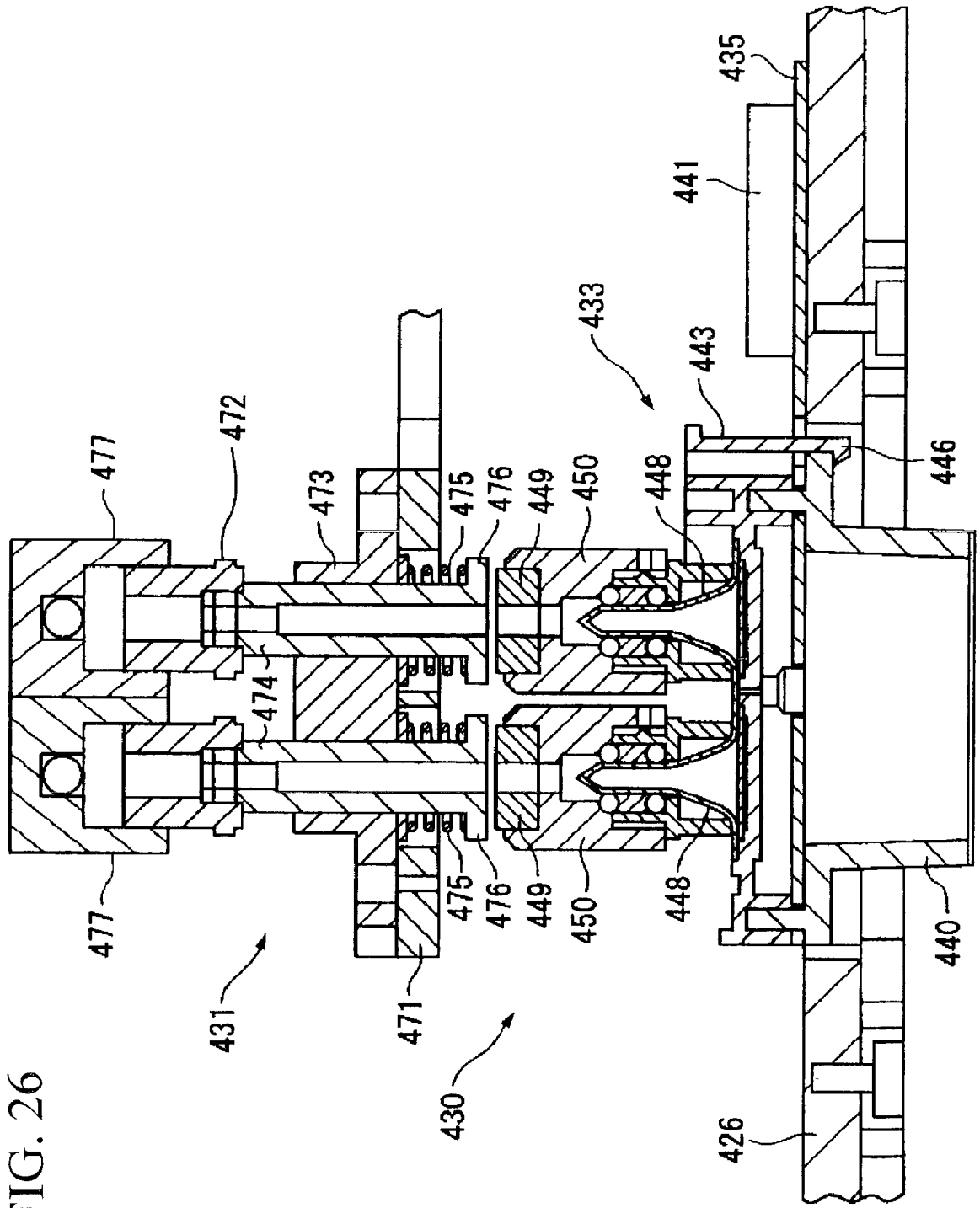
FIG. 26 is a cross section showing the head unit of the liquid drop ejecting processing apparatus.

Next, a structure of a head unit 420 is explained. FIG. 23 is a plan view showing a head unit which is provided in the liquid drop ejecting processing apparatus. FIG. 24 is a side view of the head unit. FIG. 25 is a front view of the head unit. FIG. 26 is a cross section of the head unit.

The head unit 420 has a head unit section 430 and an ink supply section 431 as shown in FIGS. 23 to 26. Also, the head unit section 430 has a planar carriage 426 and a plurality of head units 433 having shapes which are substantially the same as each other attached on the carriage 426.

(Structure of Head Apparatus)

Figure 27:
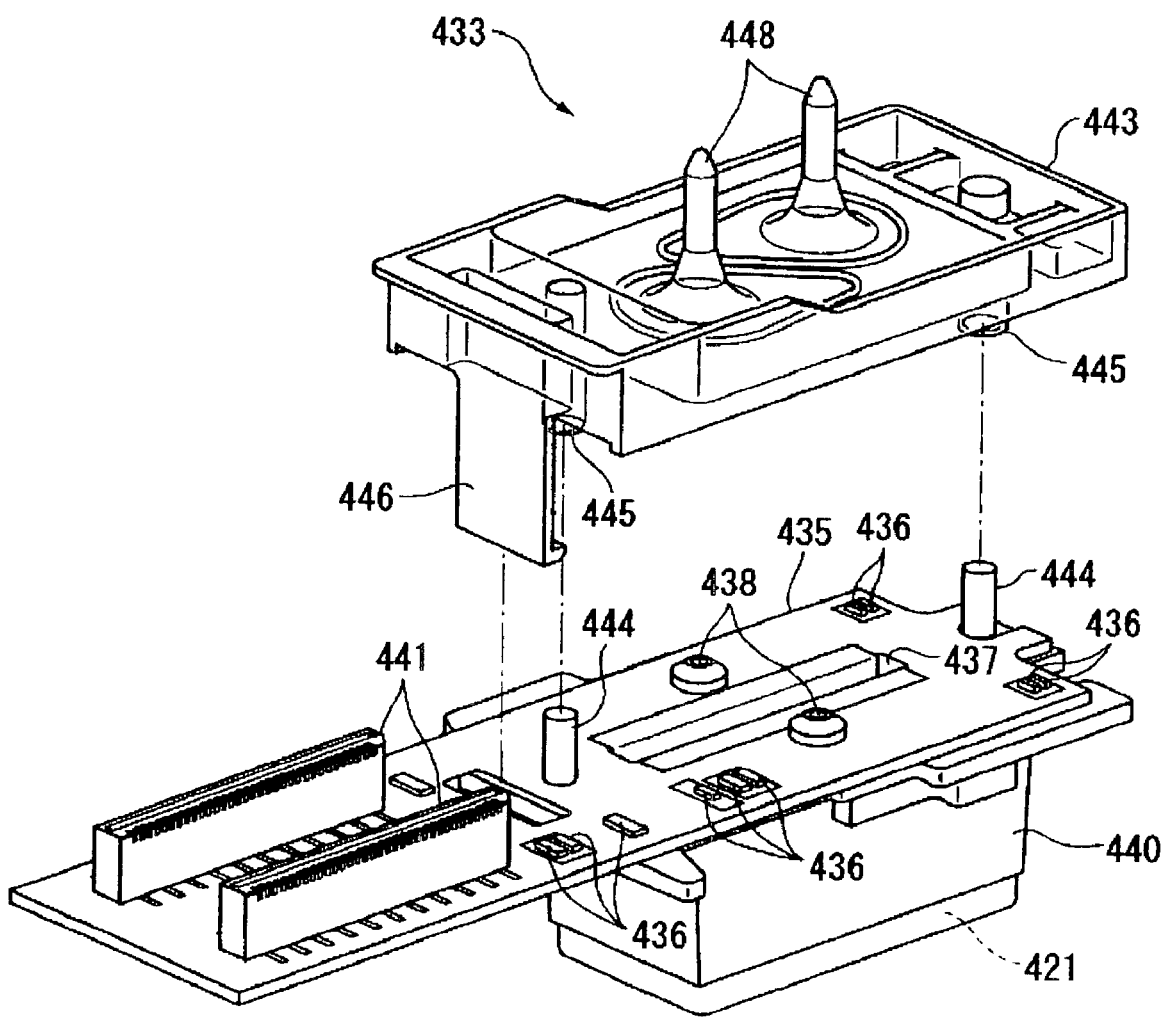
FIG. 27 is a perspective view showing the head apparatus in a disassembled state.

FIG. 27 is a perspective view for a head apparatus which is disposed on the head unit in a disassembled form.

The head apparatus 433 has a printed base board 435 as shown in FIG. 27.

On the printed base board 435, various electric parts 436 are mounted and electric wirings are made. Also, on an end in the longitudinal direction of the printed base board 435 (right-hand side in FIG. 27), a window section 437 is opened therethrough. Furthermore, on the printed base board 435, a flow path 438 through which the filter element member 13 can pass as an ink is disposed on both sides of the window section 437.

Furthermore, at nearly one end (right-hand side in FIG. 27) in the longitudinal direction of one surface (down side in FIG. 27) of the printed base board 435, an ink jet head 421 is attached integrally by an attaching member 440. The ink jet head 421 is formed in a rectanglular shape and its longitudinal direction portion corresponds to a longitudinal portion of the printed base board 435. Here, the shapes of each ink jet head on each head apparatus 433 are substantially nearly the same as each other. That is, each of ink jet heads are commonly obtainable products according to a prescribed industrial standard as long as they are qualified products according to the prescribed standard. More specifically, when the ink jet heads have the same number of nozzles in the same positions among the ink jet head, assembling operation of the ink jet head on the carriage becomes efficient; thus, it is preferable because the assembling accuracy increases. Furthermore, if a product which is produced according to the same manufacturing and assembling processes is used, a product which is made specially is not necessary; thus, it is possible to decrease the manufacturing cost.

Also, at nearly the other end (left-hand side in FIG. 27) in the longitudinal direction of one surface (up side in FIG. 27) of the printed base board 435, connectors 441 which are connected electrically to the ink jet head 421 are attached integrally by an attaching member 440. To these connectors 441, as is graphically shown in FIG. 22, electric wirings 442 (including a power supply wiring and signal wiring) which are connected to the sub-scanning driving apparatus 427 so as not to influence the movement of the head unit 420 are connected. The electric wiring 442 connects the controlling apparatus not shown in the drawings, and the head unit 420. That is, as shown in FIGS. 23 and 26 by a two-dot chain line arrow graphically, these electric wirings 442 are disposed on an outer periphery of the head unit 420 such as both sides of a disposition direction of the 2 arrays of the head apparatus 433 on the head unit 420 from the sub-scanning driving apparatus 427 so as to be connected to the connectors 441; thus, electric noise does not occur.

Furthermore, on nearly one end (right-hand side in FIG. 27) in the longitudinal direction of the other surface (up side in FIG. 27) of the printed base board 435, an ink introducing section 443 is attached corresponding to the ink jet head 421. The ink introducing section 443 has a positioning cylinder section 445 disposed on the attaching member 440 having nearly a cylindrical shape so as to fit to a positioning pin section 444 which goes through the printed base board 435 and a fitting nail section 446 which fits the printed base board 435.

Also, on the ink introducing section 443, a pair of connecting section 448 having nearly a cylindrical shape with a narrowing tip are disposed. These connecting sections 448 have openings, not shown in the drawings, which connect the flow path 438 of the printed base board 435 in a water-tight manner on a base end section near the printed base board 435. On a tip of the connecting section 448, a hole through which the filter element member 13 can pass is disposed.

Furthermore, to these connecting sections 448, as shown in FIGS. 24 to 27, a seal connecting sections 450 are attached in the tip position respectively. These seal connecting sections 450 are formed in nearly a cylindrical shape so as to fit the connecting member 448 in a water-tight manner with its inner circumference. Also, on a tip of the connecting section 448, a sealing member 449 is disposed.

(Structure of Ink Jet Head)

Figure 28:
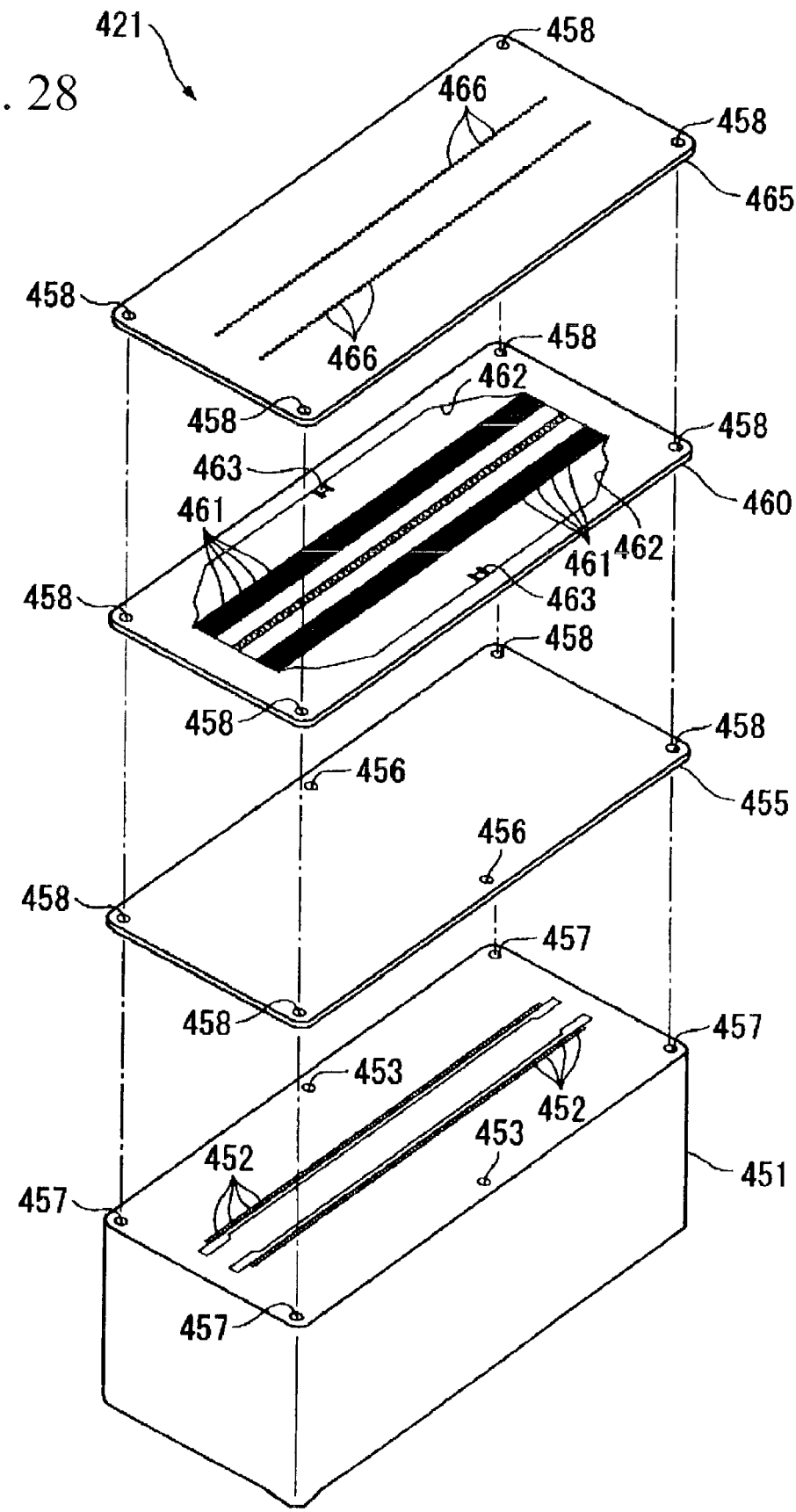
FIG. 28 is a perspective view showing the ink jet head in a disassembled state.
Figure 30:
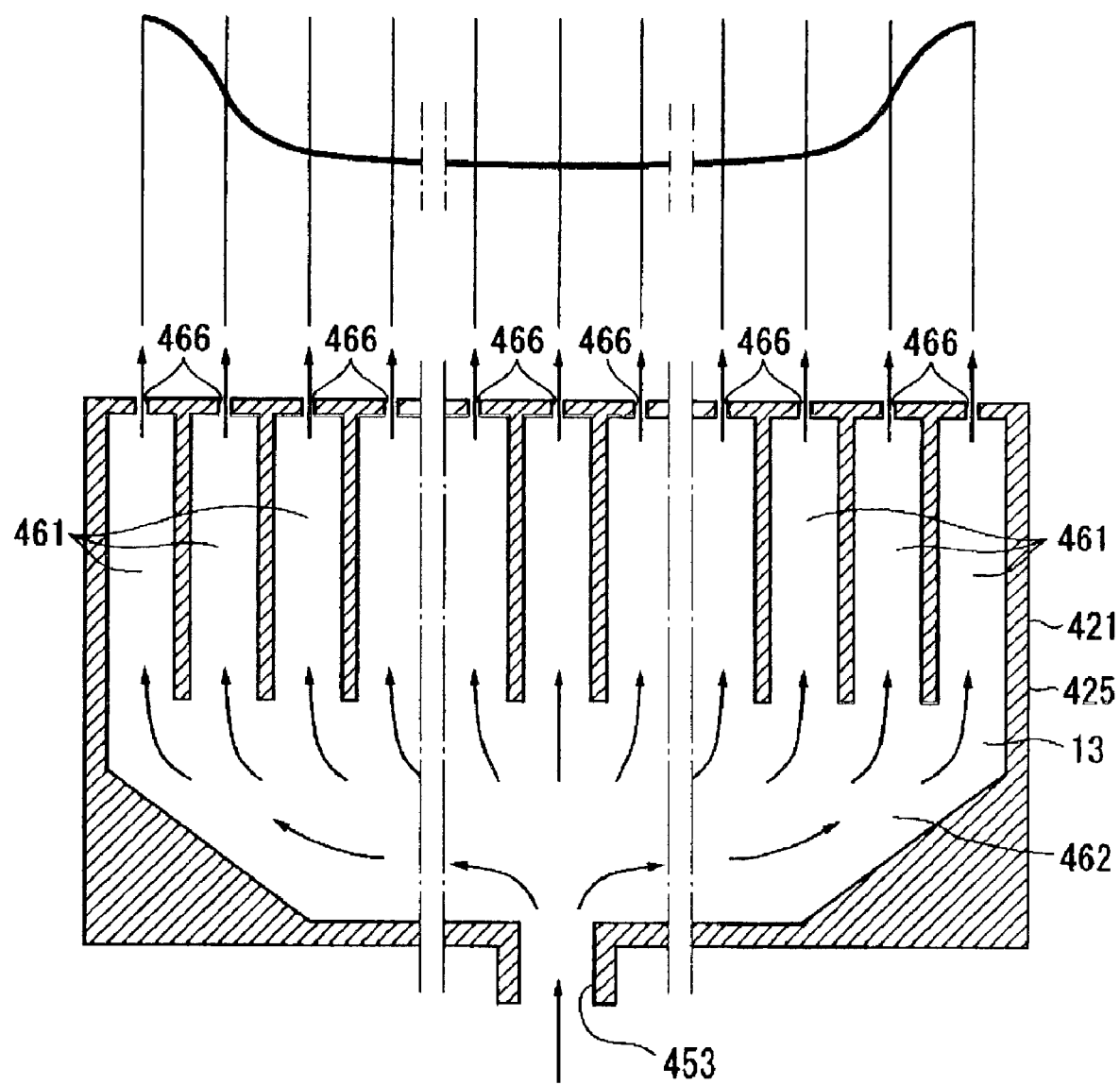
FIG. 30 is a view for explaining ejection amount of the filter element member by the ink jet head.
Figure 31:
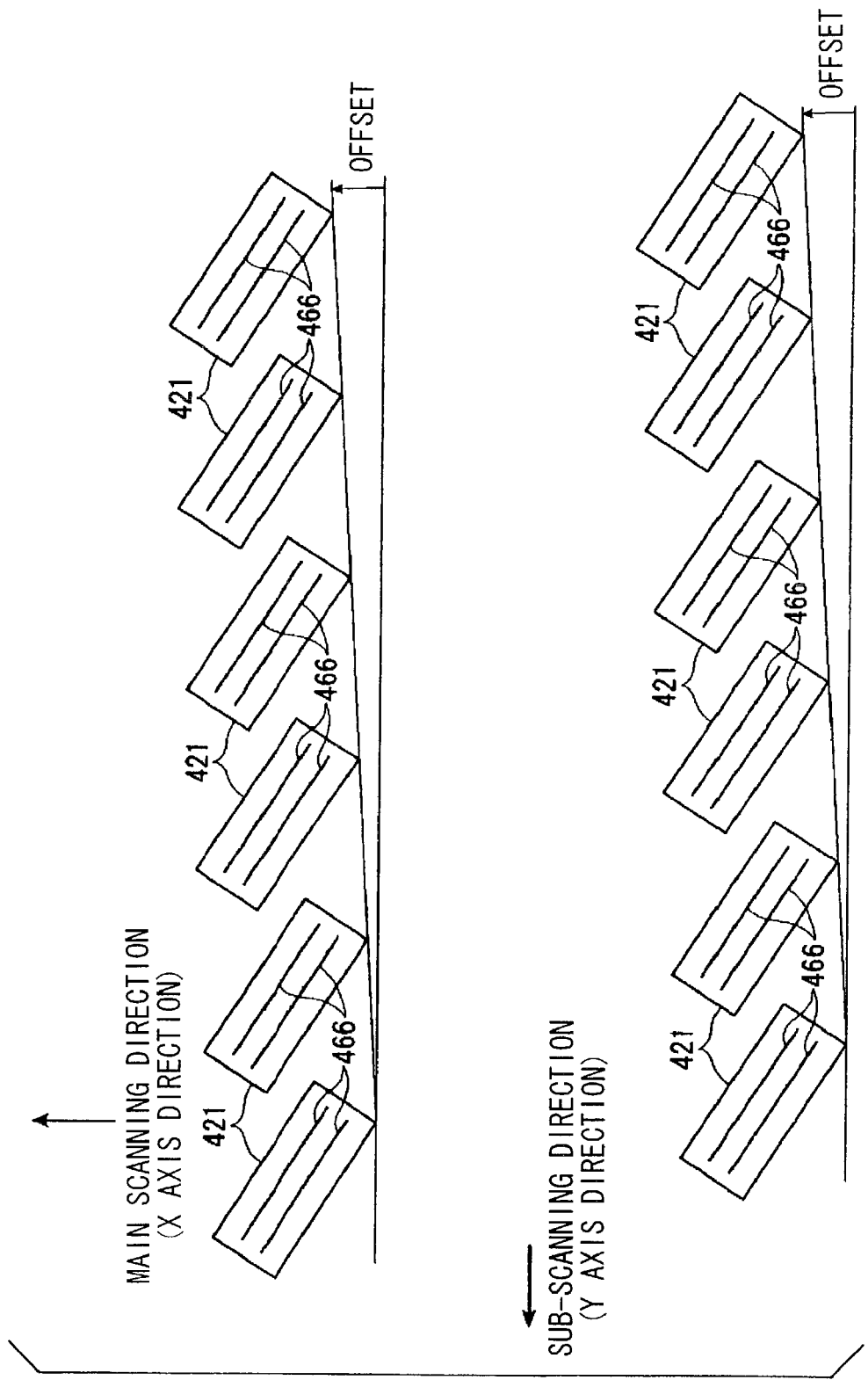
FIG. 31 is a general view for explaining disposition condition of the ink jet head.
Figure 32:
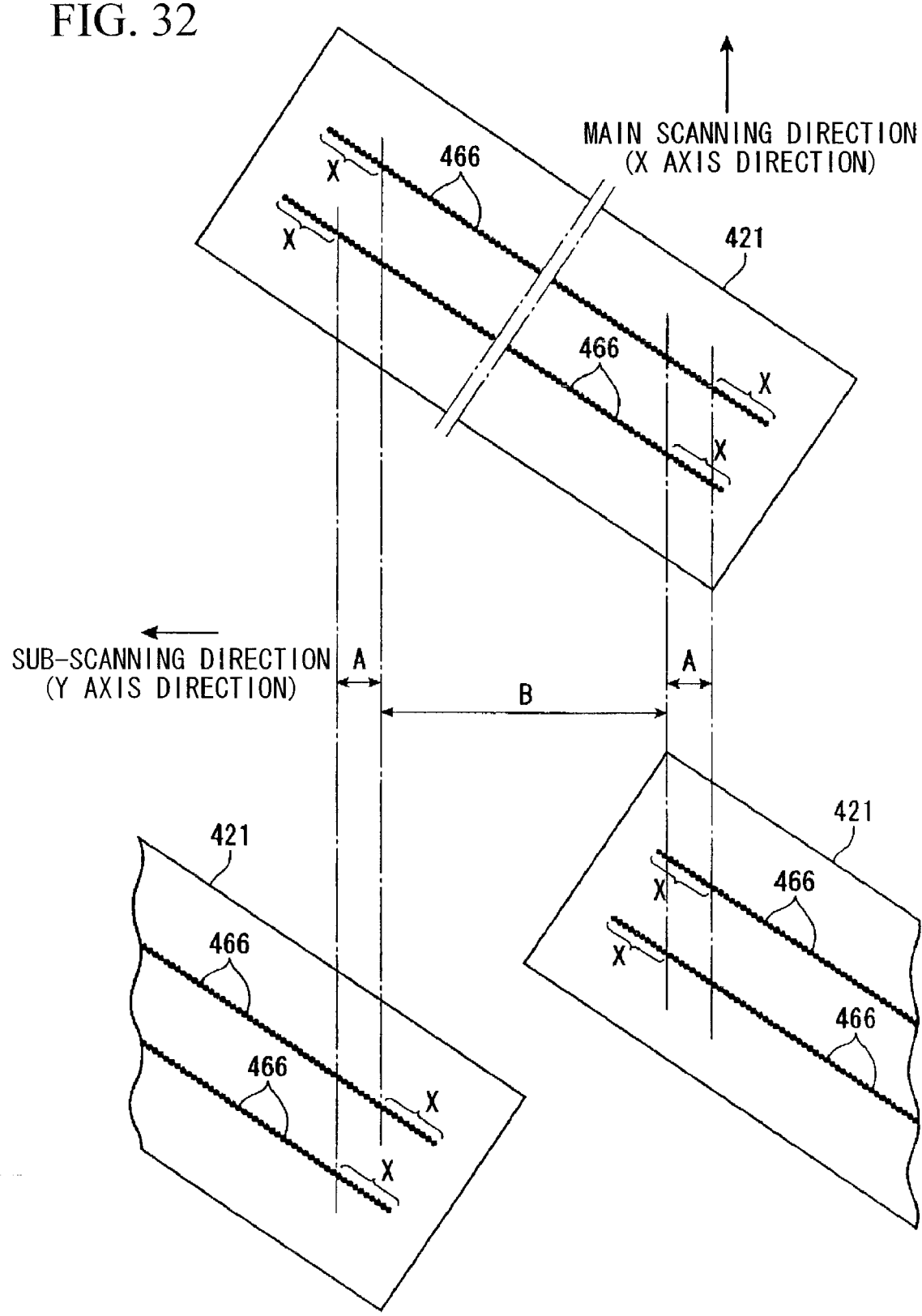
FIG. 32 is an enlarged general view for explaining the disposition condition of the ink jet head.

FIG. 28 is a perspective view of an ink jet head in a disassembled form. FIGS. 29A to 29C are cross sections for showing filter element member ejection operation by the ink jet head. FIG. 29A shows an ink jet head under conditions before the filter element member is ejected. FIG. 29B shows an ink jet head under conditions in which the filter element member is ejected by a contracting movement by a piezoelectric vibrating element. FIG. 29C shows an ink jet head under conditions immediately after the filter element member is ejected. FIG. 30 is a view for explaining ejection amount of the filter element member by the ink jet head. FIG. 31 is a view for explaining an approximate disposition condition of the ink jet head. FIG. 32 is an enlarged view for explaining an approximate disposition condition of the ink jet head shown in FIG. 31.

The ink jet head 421 has a holder 451 having an approximately rectanglular shape as shown in FIG. 28. In the holder 451, a plurality, for example, 180 pieces of piezoelectric vibrating elements 452 such as piezo elements are disposed in 2 arrays along the longitudinal direction. In approximately the middle of both longitudinal sides of the holder 451, through holes 453 which communicate to the flow paths 438 of the print base board 435 and flows the filter element member 13 as an ink are disposed respectively.

Also, on a surface on which the piezoelectric vibrating element 452 of the holder 451 is disposed, as shown in FIG. 28, a flexible plate 455 which is formed in a sheet condition by synthetic resin is disposed integrally. On the flexible plate 455, communicating holes 456 which continue to the through holes 453 are provided respectively. On the flexible plate 455, fitting holes 458 which fit the positioning nails 457 which are disposed so as to protrude on four corner portions of the holder 451 are provided. The fitting holes 458 are positioned on a top surface of the holder 451 so as to be attached there integrally.

Furthermore, on the flexible plate 455, a planar flow path forming plate 460 is provided. On the flow path forming plate 460, nozzle grooves 461 which are disposed serially in 2 arrays corresponding to 180 pieces of piezoelectric vibrating elements which are disposed in the longitudinal direction of the holder 451, opening sections 462 which are formed in the longitudinal direction and in one side of the holder 451, and communicating holes 463 which continue to the fitting holes 456 on the flexible plate 455 are provided. On the flexible plate 455, fitting holes 458 which fit the positioning nail sections 457 which are disposed on four corner portions of the holder 451 so as to protrude thereat are disposed. The fitting holes 458 are positioned on the top surface of the holder 451 with the flexible plate 455 so as to be attached thereat integrally.

Also, on a top surface of the flow path forming plate 460, a nozzle plate 465 having approximately a planar shape is provided. On the nozzle plate 465, 180 pieces of nozzles 466 having approximately a circular shape in a longitudinal direction of the holder 451 over 25.4 mm of longitudinal range are disposed serially in two arrays so as to correspond to the nozzle grooves formed on the flow path forming plate 460. On the flexible plate 455, fitting holes 458 which fit the positioning nails 457 which are disposed so as to protrude on four corner portions of the holder 451 are provided. The fitting holes 458 are positioned on a top surface of the holder 451 together with the flexible plate 455 and the flow path forming plate 460 so as to be attached thereat integrally.

In addition, by the flexible plate 455 which is layered, a flow path forming plate 460, and a nozzle plate 465, as graphically shown in FIGS. 29A to 29D, a liquid reservoir 467 is formed separately in an opening sections 462 formed on the flow path forming plates 460. Also, the liquid reservoir 467 communicates to each nozzle groove 461 via liquid supply path 468. By doing this, when pressure in the nozzle grooves 461 increases by vibrating movement by the piezoelectric vibrating element 452, the ink jet head 421 ejects the filter element member 13 from the nozzle by ejection liquid drop amount between 2 to 13 pl, for example, 10 pl, with 7±2 m/s of pump head. That is, as shown in FIGS. 29A to 29C successively, by applying a predetermined voltage Vh to the piezoelectric vibrating element 452 in a pulse manner, the piezoelectric vibrating element 452 is extended and contracted appropriately in an arrow direction Q. By doing this, the filter element member 13 as an ink is suppressed so as to be ejected from the nozzle 466 in a predetermined amount of liquid drop 8.

Also, in the ink jet head 421, it is observed that ejection amount is larger at both ends in the disposition direction than in the rest of the disposition direction as explained in the above-mentioned embodiment with reference to FIG. 30. Because of this, it is controlled such that the filter element member 13 is not ejected from the nozzles 466 of which ejection amount difference is within 5% such as each of 10 nozzles at both ends.

In addition, in the head unit section 430 contained in the head unit 420, as shown in FIGS. 22 to 26, a plurality of head apparatuses 433 having the ink jet head 421 are disposed in an array manner. As shown in FIG. 31 graphically, the disposition of the head apparatuses 433 on the carriage 426 is under conditions that the head apparatuses 433 are disposed in a direction which is slanted more in an X-axis direction which is a main scanning direction which crosses orthogonally to the Y-axis direction than in the Y-axis which is a sub-scanning direction in a offset manner. That is, a plurality, for example, 6 pieces of the head unit sections are disposed in a direction which is slanted more slightly than the Y-axis direction as a sub-scanning direction in an array manner. Here, plural arrays are disposed, for example, two arrays. In an ordinary disposition of the ink jet heads 421, the width of the head apparatus 433 in its latitudinal direction is larger than the ink jet head; thus, it is not possible to narrow disposition interval of the neighboring ink jet heads 421. However, arrays of the nozzle 466 must be in line with the Y-axis direction; therefore, the above-explained disposition of the head apparatuses 433 are provided.

Furthermore, in the head unit section 430, as shown in FIGS. 23 and 31, head apparatuses 433 are disposed along a line which is slightly offset from the Y-axis direction to the X-axis direction as a main scanning direction. Also, the connectors 441 are disposed approximately in point-symmetry manner outside of the arrays of the head apparatuses 433 disposed facing each other in 2 arrays. Here, the head apparatuses 433 are disposed such that the nozzles 466 disposed in the longitudinal direction of the ink jet head 421 are disposed to be slanted closer in the X-axis direction by, for example, 57.1 degrees.

Also, the head apparatuses 433 are disposed in a staggered manner so as not to be disposed in rows against the disposition direction. That is, as shown in FIGS. 23, 26, and 31, the ink jet head 421 are disposed in two arrays such that nozzles 466 in 12 (twelve) pieces of ink jet head 421 are disposed in the Y-axis direction continuously and in a staggered manner in which the ink jet heads 421 are disposed one by one alternatingly between facing arrays.

More specifically, detailed explanation is made with reference to FIGS. 31 and 32. Here, the disposing directions of the nozzles 466 which are disposed in a longitudinal direction of the ink jet head 421 are slanted closer in the X-axis direction. By doing this, in a first array of the nozzles 466 disposed in two arrays on the ink jet head 421, on a line in the X-axis direction in which the eleventh nozzle 466 is disposed for ejecting the filter element member 13, there is an area A (A in FIG. 32) in which 10 nozzles 466 disposed in a second array do not eject the filter element member 13. That is, in one ink jet head 421, there is the area A in which there are not two nozzles 466 in a line in the X-axis direction.

Therefore, as shown in FIGS. 31 and 32, in an area B (B shown in FIG. 32) in which two pieces of nozzle 466 in an ink jet head 421 are disposed in the X-axis direction, the head apparatuses 433 which are disposed in an array manner are not disposed in a row in the X-axis direction. Furthermore, the area A in which only one nozzle on the head apparatus 433 forming one array is disposed on the X-axis direction and the area A in which only one nozzle on the head apparatus 433 forming the other array is disposed on the X-axis direction are disposed in rows each other in the X-axis direction. Between the ink jet head 421 in one array and the ink jet head 421 in the other array, a total of two nozzles 466 are disposed on a line which is in the X-axis direction. That is, in the area in which the ink jet head 421 is disposed, a total of two nozzles 466 are disposed in a staggered manner such that two pieces of nozzle 466 are disposed on a line which is in the X-axis direction. Here, nozzles in an area X of the nozzles 466 which do not eject the filter element member 13 are not regarded as two nozzles 466 on a line which is in the X-axis direction. By doing this, two nozzles 466 which eject the ink in the X-axis direction in which the main scanning operation is performed are disposed on a line. As explained later, the ink is ejected from two nozzles 466 to one point. If one element is formed by only one nozzle 466, different ejection amounts among the nozzles 466 cause different ejecting characteristics among the elements and decreased yield. Therefore, if one element is formed by different nozzles 466, it is possible to overcome the difference in ejection amount by the nozzles 466 and equalize the ejecting characteristics among elements and improve the product yield.

(Structure of Ink Supply Section)

As shown in FIGS. 23 to 26, the ink supply section 431 comprises a pair of attaching plates 471 which are provided corresponding to two arrays of the head unit sections 430 and a plurality of supplying unit sections 472 which are attached to the attaching plates 471. The supplying unit section 472 has movable members 474 having approximately a cylindrical shape. The movable members 474 are attached by the attaching fixtures 473 so as to penetrate through the attaching plates 471 movably in an axial direction. The movable members 474 of the supplying unit section 472 are attached by, for example, coil springs 475 or the like so as to be pushed in a direction toward the head apparatus 433 from the attaching plate 471. Here, in FIG. 23, the ink supplying section 431 is shown only for one array of the head apparatuses 433 among two arrays and the other array is omitted for the convenience of explanation.

On an end section of the movable member 474 which is facing the head apparatus 433, flange sections 476 are provided. The flange section 476 protrudes like a sword-guard around the outer periphery of the movable section 474. The end of the flange section 476 contacts a sealing member 449 of the ink introducing section 443 in the head apparatus 433 in approximately water-tight manner so as to resist the pushing force by the coil spring 475. Also, on an end of the movable member which is opposite to the flange section 476, a joint section 477 is provided. As shown graphically in FIG. 22, an end of the supplying pipe 478 in which the filter element member 13 flows through is connected to the joint section 477.

As explained above and graphically shown in FIG. 22, the supplying pipe 478 is connected to the sub-scanning driving apparatus 427 so as not to influence the movement of the head unit 420. Also, as graphically shown in FIGS. 23 and 25 by one-dot chain line arrow, the supplying pipe 478 is connected from the sub-scanning driving unit 427 to an approximately middle between the ink supplying sections which are disposed in two arrays from above the head unit 420. Furthermore, the supplying pipes 478 are disposed radially and an end of the supplying pipe 478 is connected to the joint section 477 of the ink supplying section 431.

In addition, the ink supplying section 431 supplies the filter element member 13 which flows through the supply pipe to the ink introducing section 443 in the head apparatus 433. Also, the filter element member 13 which is supplied to the ink introducing section 443 is supplied to the ink jet head 421 and ejected from nozzles 466 of the ink jet head 421 which is controlled electrically appropriately in a form of liquid drop 8.

(Manufacturing Operation of Color Filter)

(Preparatory Process)

Figure 34:
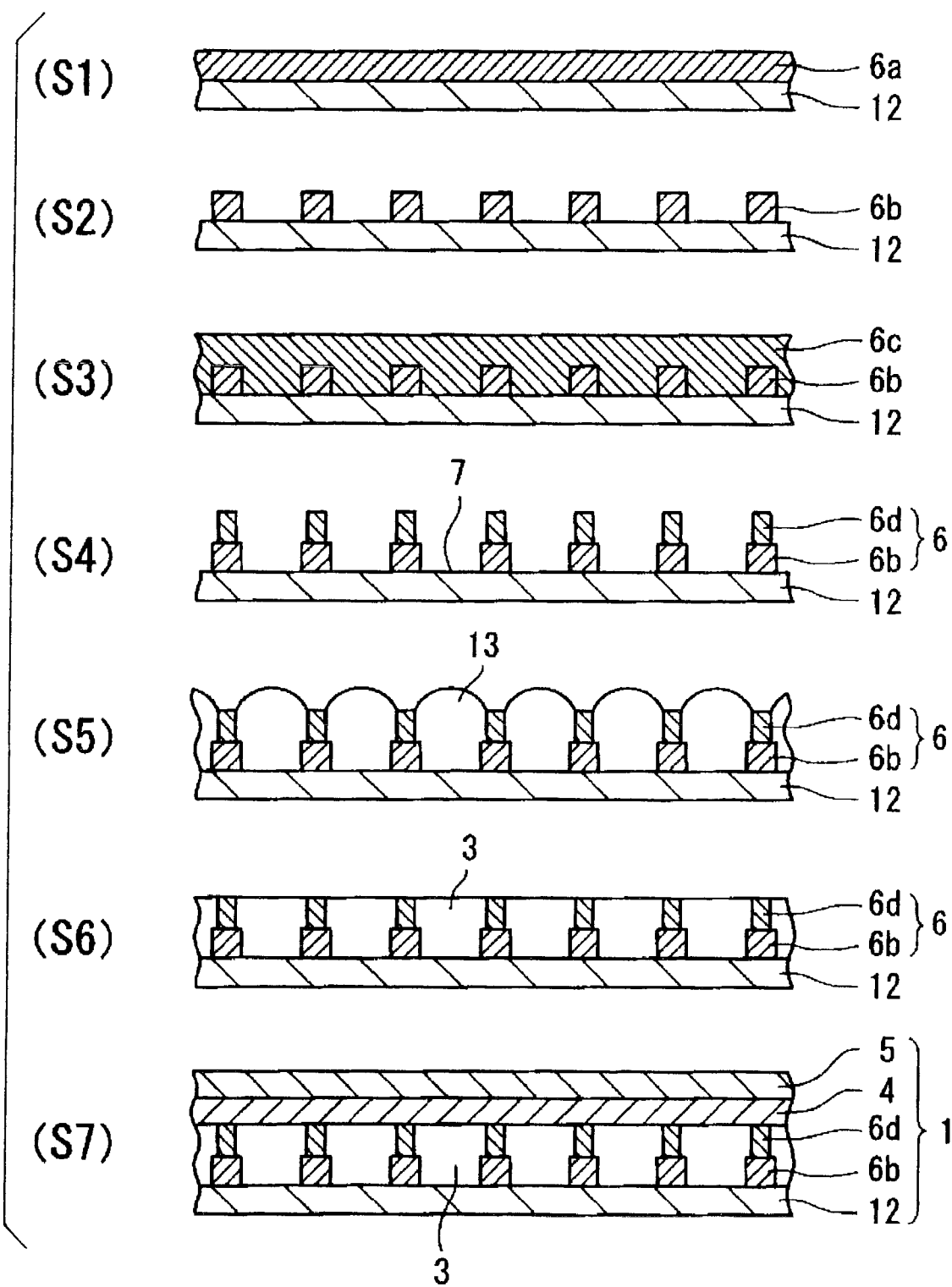

Next, a forming process for a color filter 1 by using a manufacturing apparatus for a color filter according to the above-explained embodiment is explained with reference to drawings. FIG. 34 shows manufacturing steps S1 to S7 for the color filter 1 by using a manufacturing apparatus for a color filter in a form of cross section.

First, surface of the motherboard 12 as a transparent base board made of non-alkali-glass having a thickness of 0.7 mm, a length of 38 cm, and a width of 30 cm, is cleaned by a cleaning liquid which is made of a concentrated sulfuric acid to which 1 mass % of hydrogen peroxide solution is added. After the cleaning operation, the motherboard 12 is rinsed with pure water and dried by air so as to obtain a clean surface. A chrome coating having 0.2 μm of thickness on average is formed on the surface of the motherboard 12 by a coating method such as, for example, sputtering method, so as to obtain a metal layer 6a (step S1 in the FIG. 34)

After the motherboard 12 is dried on a hot plate under conditions of 80° C., for five minutes, a photoresist layer which is not shown in the drawing is formed on the surface of the metal layer 6a by, for example, a spin coating method. A mask film which is not shown in the drawing on which, for example, a predetermined matrix pattern shape is formed is contacted on the surface of the motherboard 12 so as to be exposed to ultraviolet laight. Next, the exposed motherboard 12 is dipped into an alkali-developer liquid which contains 8 mass % of potassium hydroxide, and non-exposed portion of photoresist is removed, and a patterning operation is performed on a resist layer. Consequently, etching removal operation is performed on the exposed metal layer 6a by an etching liquid containing, for example, hydrochloric acid as a main ingredient. By doing this, a shielding layer 6b as a black matrix having a predetermined matrix pattern is obtained (step S2 in FIG. 34). Here, thickness of the shielding layer 6b is approximately 0.2 μm, and the width of the shielding layer 6b is approximately 22 μm.

Furthermore, a negative transparent acrylic photosensitive resin formation 6c is applied on the motherboard 12 on which the shielding layer 6b is formed by, for example, a spin coating method (step S3 in FIG. 34). Pre-baking operation is performed to the motherboard 12 on which the photosensitive resin formation 6c is formed under conditions of 100° C. for 20 minutes, and after that, the motherboard 12 is exposed to ultra violet light by using a mask film, which is not shown in the drawing, on which a predetermined matrix pattern shape is formed. Consequently, a resin on the non-exposed area is developed by, for example, the above-mentioned alkali-developer liquid, and rinsed by pure water, and then, a spin drying operation is performed. As a final drying operation, an after-baking operation is performed under condition of, for example, 200° C. for 30 minutes so as to harden the resin portion sufficiently; thus, a bank layer 6d is formed. Average thickness of the bank layer 6d is nearly 2.7 μm, and the width is nearly 14 μm. A bulkhead 6 is formed by the bank layer 6d and the shielding layer 6b (step S4 in FIG. 34).

Dry etching operation and plasma processing are performed so as to improve ink wettability of the filter element forming area 7 (in particular, exposed surface of the motherboard 12) as a color layer forming area which is separated by the above-obtained shielding layer 6b and the bank layer 6d. More specifically, for example, high voltage current is charged to a mixed gas of helium and 20% of oxygen, and an etching spot is formed by performing the plasma processing. The motherboard 12 is transported under the above-formed etching spot so as to be etched; thus, pre-processing of the motherboard 12 is performed.

(Ejection of Filter Element Member)

Next, each of filter element members such as those of Red (R), green (G), and blue (B) is introduced (that is, ejected) to the inside the filter element forming area 7 which is separated by the bulkhead 6 of the motherboard 12 to which the above-mentioned pre-processing is performed by an ink jet method (step S5 in FIG. 34).

When the filter element member is ejected by the ink jet method, a head unit 420 is assemble in advance. In addition, in each of the liquid drop ejection processing apparatuses 405R, 405G, and 405B in the liquid drop ejecting apparatus, ejection amount of the filter element member 13 which is ejected from a nozzle 466 of each ink jet head 421 is adjusted to be a predetermined amount, such as nearly 10 pl. On the other hand, on one surface of the motherboard 12, the bulkhead 6 is formed in a grid pattern in advance.

In addition, at first, the motherboard 12 to which the pre-processing was performed as explained above is transported into the liquid drop ejection processing apparatus 405R for R color by a transporting robot, which is not shown in the drawing, so as to put the motherboard 12 on the base stand section in the liquid drop ejection processing apparatus 405R. The motherboard 12 which is put on the base stand section is positioned so as to be fixed thereon by a placing method, for example, an absorption method. Position of the motherboard 12 is monitored by various cameras, and the movement of the base stand section on which the motherboard 12 is supported is controlled so as to be in a predetermined appropriate position by controlling the main scanning driving apparatus 425. Also, the head unit 420 is moved appropriately by the sub-scanning driving apparatus 427 so as to acknowledge the position thereof After that, the head unit 420 is moved in the sub-scanning direction, and the ejection conditions of the nozzle 466 is monitored by the missing-dot detecting unit 487 so as to confirm no occurrence of defective ejection; thus, the head unit 420 is transported to the initial position.

After that, the motherboard 12 which is supported on the base stand section which movable by the main scanning driving unit 425 is scanned in the X-axis direction. While the head unit 420 is moved relatively to the motherboard 12, the filter element member 13 is ejected from the predetermined nozzle 466 of the ink jet head 421 appropriately. The filter element member 13 is filled in the concave section which is separated by the bulkhead 6 on the motherboard 12. It is controlled by a controlling apparatus which is not shown in the drawing such that the filter element member 13 is not ejected from a predetermined area X, for example, 10 nozzles located on both ends in the disposition direction of the nozzle 466 as shown in FIG. 32. The filter element member 13 is ejected from 160 nozzles 466 of which the ejection amount is relatively uniform in the middle position of the nozzle array.

Also, because 2 nozzles 466 are located on the scanning line such as on a line which is on the scanning direction, 2 dots are ejected from one nozzle 466 to one concave section during the movement. More specifically, 2 liquid drops 8 are ejected as one dot from one nozzle 466. Therefore, in total, 8 liquid drops 8 are ejected from the nozzle 466. The ejection condition is monitored in every scanning movement by the missing-dot detecting unit 487 whether or nota missing-dot exists.

When the missing-dot is determined not to exist, the head unit 420 is moved in the sub-scanning direction by a predetermined distance. While the base stand section which supports the motherboard 12 is moved again in the main scanning direction, the ejection for the filter element member 13 is repeated. Thus, the filter element 3 is formed in a predetermined filter element forming area 7 in the predetermined color filter forming area 11.

(Drying and Hardening)

Consequently, the motherboard 12 to which the R color filter element member 13 is ejected are taken out by the liquid drop ejection processing apparatus 405R by a transporting robot, which is not shown in the drawing. The filter element member 13 is dried by a multi-stage baking furnace, which is not shown in the drawing, under condition of, for example, 120° C. for five minutes. After the drying operation, the motherboard 12 is taken out from the multi-stage baking furnace by the transporting robot, and then the motherboard 12 is cooled during the transportation. After that, the motherboard 12 is transported into the liquid drop ejection processing apparatus 405R, the liquid drop ejection processing apparatus 405G for G color, and the liquid drop ejection processing apparatus 405B for B color successively. The filter element members 13 for G color and the B color are ejected successively to the predetermined filter element forming area 7. In addition, the motherboard 12 of which ejected filter element members 13 for three colors are dried are collected. Furthermore, the filter element members 13 are fixed and settled on the motherboard 12 by performing a heating processing (step S6 in FIG. 34).

(Formation of Color Filter)

A protecting coating 4 is formed on nearly the entire surface of the motherboard 12 on which the filter element 3 is formed. Furthermore, an electrode layer 5 which is made from, for example, ITO (Indium-Tin Oxide) is formed on a surface of the protecting coating 4 by the required pattern. After that, a plurality of color filters 1 is obtained by cutting the motherboard 12 in accordance with the color filter forming area 11 (step S7 in FIG. 34). The motherboard 12 on which the color filter 1 is formed is used as one of a pair of base boards in the liquid crystal apparatus shown in FIG. 18 as explained in the embodiment previously.

(Effect of Manufacturing Apparatus for Color Filter)

According to the embodiment as shown in FIGS. 22 to 34, there are the following effects in addition to the operational effects in each embodiment explained previously.

That is, a plurality of ink jet heads 421 in which a plurality of nozzle heads 466 for ejecting the filter element member 13 as a fluid liquid material such as an ink as a liquid drop 8 are disposed in arrays on a surface of the ink jet heads 421 and are moved along a surface of the motherboard 12 relatively under conditions that a surface on which the nozzles 466 of the ink jet heads 421 is facing a surface of the motherboard 12 as a member to receive ejection while having a predetermined space therebetween. One filter element member 13 is ejected on a surface of the motherboard 12 from each nozzle 466 of a plurality of the ink jet heads 421. Because of this, it is possible to eject the filter element member 13 over a wide range of the motherboard 12 by using substantially the common ink jet head 421 based on the same industrial standard. Also, it is possible to use a plurality of conventional standardized parts without using a long-range ink jet head; thus, it is possible to reduce manufacturing cost. The product yield of the long-range ink jet head is quite low; thus it becomes expensive. However, the product-yield of a short-range ink jet head 421 is high; therefore, a plurality of short-range ink jet head is disposed in the present invention so as to obtain substantially the same effect as the case in which the long-range ink jet head is used; thus, it is possible to reduce manufacturing cost.

Furthermore, for example, by appropriately setting the disposition direction and the number of the ink jet head 421 and the number and the interval (nozzles 466 can be used by every piece or by every several pieces so as to correspond to the pitch of the pixel) of the nozzles 466 which are used for ejecting operation, it is possible to make the area to which the filter element member 13 is ejected correspond to the color filter 1 having different size, pixel pitch, and disposition. Therefore, common utility can be increased.

In addition, because the shape of a plurality of the liquid drop ejecting heads 421 is substantially the same, it is possible to make one kind of ink jet head 421 correspond to the area to which the liquid material is ejected by setting the array appropriately. Therefore, the structure becomes simple, and the production yield improves, and the manufacturing cost can be reduced.

Also, because the nozzle 466 uses a plurality of the liquid drop ejecting heads 421 which are aligned in an array in nearly and equal interval, it is possible to dot a pattern following a predetermined rule such as a striped pattern, mosaic pattern, or delta pattern easily.

In addition, a plurality of ink jet heads 421 are moved along a surface of the motherboard 12 relatively such that a plurality of ink jet heads 421 are along with a slanted direction which crosses the disposition direction of the nozzles 466 which are disposed in approximately a linear form against the main scanning direction along a surface of the motherboard 12 relatively. Therefore, the disposition direction of the nozzles 466 of a plurality of the ink jet heads 421 becomes slanted to the main scanning direction as a moving direction along a surface of the motherboard 12. By doing this, the pitch which is an ejection interval of the filter element member 13 becomes narrower than the pitch between the nozzles. When, for example, the motherboard 12 to which the filter element member 13 is ejected is used for a display apparatus such as an electrooptical apparatus such as a liquid crystal panel, clearer display is obtained. Thus, it is possible to obtain a desirable display apparatus. Furthermore, it is possible to prevent an interference of the neighboring ink jet heads 421; thus, it is possible to realize small size apparatus. In addition, by setting the slanting angle appropriately, the dot pitch is set appropriately; thus, the common utility can be improved.

Furthermore, in the ink jet head 421 in which the nozzles 466 are disposed on nearly a linear form with nearly equal interval, the nozzles 466 are disposed on nearly a linear form with nearly equal intervals in a longitudinal direction of the rectangle ink jet head 421. Therefore, the ink jet head 421 be made smaller. Thus, for example, it is possible to prevent the interference between the neighboring ink jet heads 421 or between the ink jet head 421 and other structural members; thus, a small appratus can be realized easily.

Also, the head unit 420 is disposed such that a plurality of ink jet head 421 are disposed on a carriage 426 under condition that the disposition directions of the nozzles 466 are nearly in parallel. Therefore, it is possible to form a plurality of ejection areas of one liquid material in one area without using a long-range ink jet head. Furthermore, it becomes possible to eject the filter element member 13 in duplicated condition from the ink jet heads 421 which are duplicated in one position. Therefore, it is possible to equalize the ejection amount in the ejection area easily; thus, it is possible to obtain stable and desirable dot formation.

In addition, a plurality of the ink jet heads 421 are slanted in a direction which crosses the main scanning direction and the nozzles 466 are disposed in a different direction from a longitudinal direction of the ink jet head 421 such that the disposition directions of all of the nozzles 466 are in parallel. Therefore, it is possible to enlarge an area for ejection easily without manufacturing a special long-range ink jet head. Furthermore, the disposition directions of the nozzles 466 are slanted to a direction which crosses the scanning direction, as explained above, the neighboring ink jet heads 421 do not interfere, and the pitch which is ejection interval of the filter element member 13 becomes narrower than the pitch between the nozzles 466. For example, when the motherboard 12 to which the filter element member 13 is ejected is used for a display apparatus or the like, cleaner display condition can be obtained. Also, by setting the slanting angle appropriately, the dot pitch of the dot description are set appropriately; thus, the common utility improves.

Also, a plurality of ink jet heads 421 are disposed in a plurality of arrays, for example, 2 arrays in a staggered manner; therefore, special long-range ink jet heads 421 need not be used. Even if the commonly obtainable ink jet heads 421 is used, the neighboring ink jet heads do not interfere therewith. Also, an area in which the filter element member 13 is not ejected between the ink jet heads 421 does not occur. Therefore, it is possible to eject the filter element member 13 desirably, in other words, continuously.

In addition, a plurality of ink jet heads 421 on surface of which nozzles 466 which eject the filter element member 13 as a fluid liquid material such as an ink are provided are moved along a surface of the motherboard 12 relatively such that a surface of the ink jet head 421 on which the nozzles 466 are provided faces a surface of the motherboard 12 as a substance to receive the ejection with a predetermined space therebetween. The filter element member 13 is ejected from a plurality, for example, two nozzles 466 which are located on a line along the relative moving direction. By doing this, a feature in which the filter element member 13 is ejected form two different nozzles 466 in duplicating manner is obtained. Therefore, even if the ejection amount differs among a plurality of nozzles 466, the ejection amount of the filter element member 13 is equalized; thus, it is possible to prevent unequal ejection amounts. Also, it is possible to obtain a uniform ejection on a plane, and it is possible to provide an electrooptical apparatus having desirable characteristics in planar quality.

Also, a plurality of ink jet heads 421 on surface of which nozzles 466 which eject the filter element member 13 are provided are moved along a surface of the motherboard 12 relatively such that a surface of the ink jet head 421 on which the nozzles 466 are provided faces a surface of the motherboard 12 as a substance to receive the ejection with a predetermined space therebetween. Among the nozzles 466 of the ink jet head 421, the filter element member 13 is not ejected from a plurality, for example, 10 nozzles 466, in a predetermined area X which are on both ends of the linearly-disposed line of the nozzles 466. The filter element member 13 is ejected from the nozzles 466 which are provided not in the predetermined area X but in the center of the rest of the area. By doing this, the filter element member 13 is not ejected from 10 nozzles 466 which are provided in the predetermined area which are on both ends of the linearly-disposed line of the nozzles 466 where ejection amount is larger. The filter element member 13 is ejected from the nozzles 466 in the middle of the linearly-disposed line of the nozzles 466 where ejection amount is relatively uniform. Therefore, it is possible to eject the filter element member 13 on the motherboard 13 uniformly in plane. Thus, a color filter 1 having uniform plane quality can be obtained. Also, in an electrical optical apparatus using the color filter 1, desirable display characteristics can be realized.

Furthermore, the filter element member 13 is not ejected from nozzles 466 of which the ejection amount is larger than the average ejection amount by more than 10%. Therefore, in particular, even if filter element member 13 of the color filter 1, EL illuminating member, and functional liquid material containing charged grain for an electrophoretic apparatus are used as a liquid material, there is no difference in the ejection amount characteristics. Therefore, desirable ejection amount characteristics for an electrooptical apparatus such as a liquid crystal apparatus and an EL apparatus can be obtained securely.

Also, the filter element member 13 is ejected within tolerance of ±10% of average ejection amount from each of the nozzles 466. Therefore, the ejection amount becomes relatively uniform; thus, the filter element member 13 is ejected on a surface of the motherboard 12 uniformly in a planar manner. Therefore, an electrooptical apparatus having desirable characteristics can be provided.

Furthermore, a missing-dot detecting unit 487 is provided so as to monitor the ejection condition of the filter element member 13 which is ejected from the nozzles 466. Therefore, it is possible to prevent non-uniform ejection of the filter element member 13; thus, liquid material ejection for desirable and reliable dotting can be realized.

In addition, an optical sensor is provided on the missing-dot detecting unit 487 so as to detect whether or not the filter element member 13 passes through in a direction which crosses orthogonally an ejection direction of the filter element member 13. Therefore, even during the ejection process of the filter element member 13, it is possible to acknowledge the ejection condition of the filter element member 13 securely by an easy structure. Also, it is possible to prevent non-uniform ejection of the filter element member 13; thus, ejection of the filter element member for desirable and reliable dot description can be realized.

The ejection condition of the filter element member 13 is monitored by the missing-dot detecting unit 487 before and after the ejecting process of the filter element member 13 on the motherboard 13 from the nozzles 466. Therefore, it is possible to monitor the ejection condition of the filter element member 13 just before the ejection of the filter element member 13 and immediately after the ejection thereof Also, it is possible to confirm the ejection condition of the filter element member 13 reliably; thus, it is possible to obtain desirable dotting operation by reliably preventing the missing of dots. Here, it is acceptable that the detecting operation of whether or not there is a dot which is missing is performed before or after the ejecting process.

Also, the missing-dot detecting unit 487 is disposed in an area in which the main scanning direction of the head unit 420 is directed. Therefore, it is acceptable that the movement distance of the head unit 420 be short so as to monitor the ejection condition of the filter element member 13. Also, a movement for ejection in the main scanning direction can be realized by a simple structure. Thus, it is possible to detect the missing-dot by a simple structure.

In addition, the ink jet heads 421 are disposed in 2 arrays in a point-symmetry manner. Therefore, supply pipes 478 for supplying the filter element member 13 can be assembled near the head unit 420. Therefore, it is possible to assemble the apparatus and maintain thereof easily. Furthermore, electric wirings 442 which are used for controlling the ink jet head 421 are connected from both sides of the head unit 420. Therefore, it is possible to prevent the influence of electric noise caused by the electric wirings; thus, it is possible to realize desirable superior dotting operation.

Furthermore, a plurality of ink jet heads 421 on an end of the printed base board 435 which is in a slit form, and a connector 441 be provided on the other end. Therefore, even if the connectors 441 are disposed in a plurality of lines, the connectors 441 do not interfere with each other; thus, it is possible to reduce the size of the apparatus. Also, an area is not formed in which the nozzles 466 in the main scanning direction do not exist. Therefore, it is possible to provide nozzles 466 in continuous array; thus, it is not necessary to use a special long-range ink jet head.

Additionally, the connectors 441 are disposed in a point-symmetry manner so as to be opposite to each other; therefore, it is possible to prevent an influence of electric noise caused in the connector 441. Therefore, it is possible to provide desirable and stable dotting operation.

Here, it is understood that, in the above-explained embodiments, the same effect can be obtained by the same structure.

(Embodiment of a Manufacturing Method for an Electrooptical Apparatus Using EL Element)

Next, a manufacturing method for an electrooptical apparatus according to the present invention is explained with reference to drawings. Here, an active-matrix display apparatus using EL element is explained as the electrooptical apparatus. Before explaining the manufacturing method for the display apparatus, the structure of a display apparatus which is supposed to be manufactured is explained.

(Structure of Display Apparatus)

Figure 35:
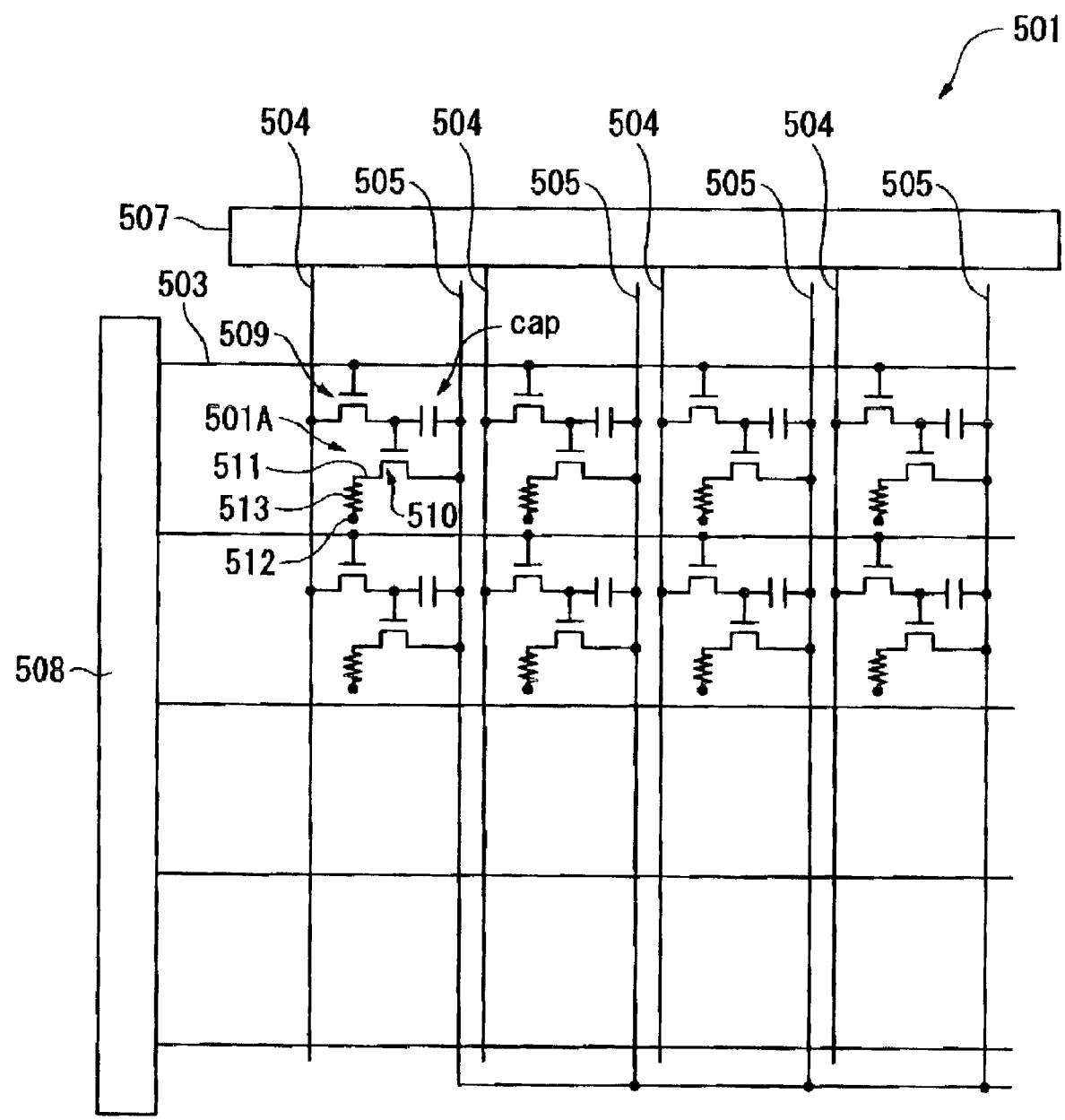
FIG. 35 is a circuit diagram showing a part of the display apparatus which uses the EL displaying element used in the electrooptical apparatus according to the present invention.
Figure 36:
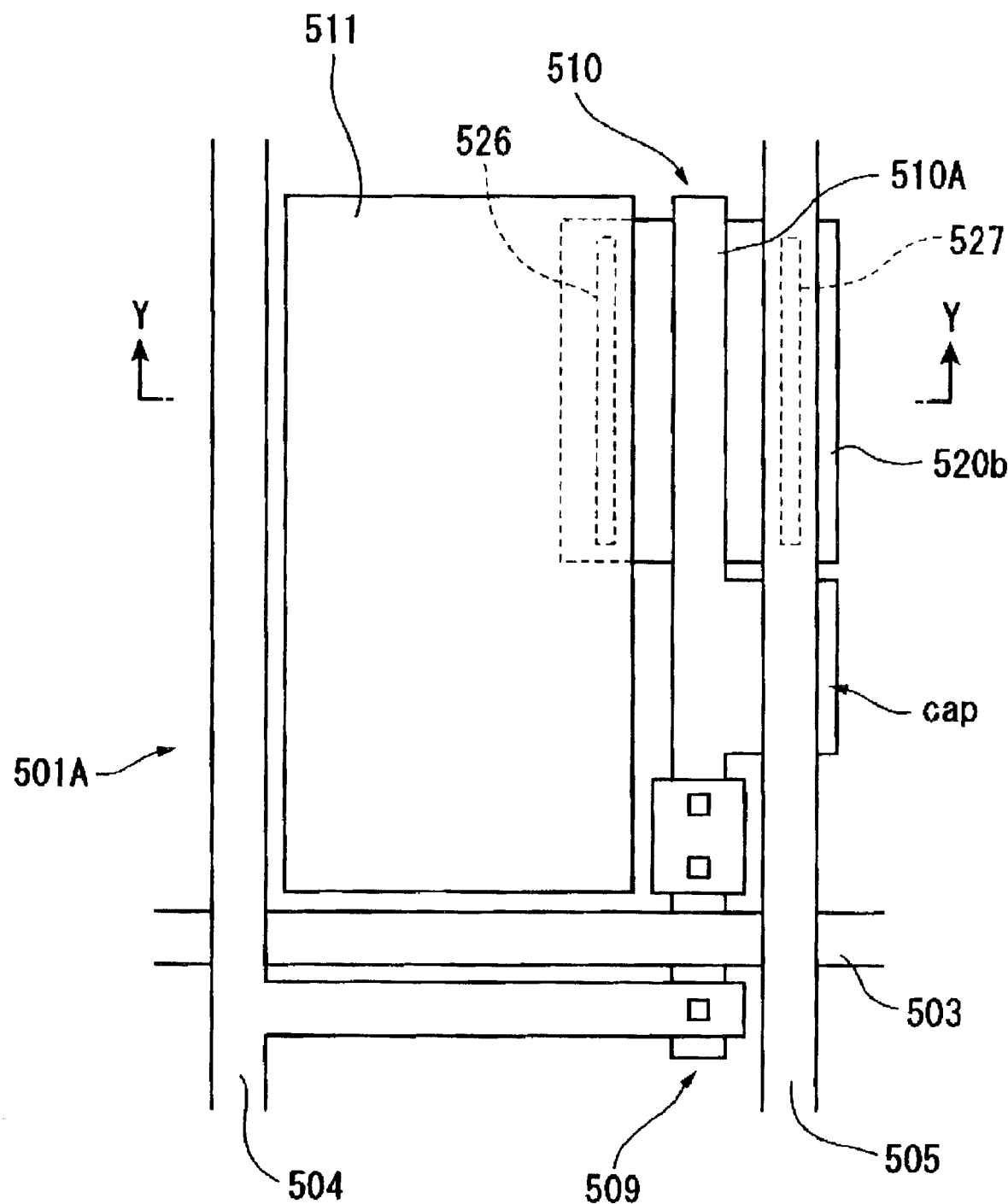
FIG. 36 is an enlarged plan view showing a planar structure of a pixel area of the display apparatus.

FIG. 35 is a view showing a part of a circuit in an organic EL apparatus which is used in the manufacturing apparatus for the electrooptical apparatus according to the present invention. FIG. 36 is an enlarged plan view showing a pixel area of the display apparatus.

That is, in FIG. 35, reference numeral 501 indicates an active matrix display apparatus which uses an EL displaying element as an EL apparatus. On a display base board 502 of the display apparatus 501, a plurality of scanning lines 503, a plurality of signal lines 504 which extend in a direction which crosses these scanning lines 503, and a plurality of common electricity supplying lines 505 are connected to each other. In addition, in each crossing points of the scanning lines 503 and the signal lines 504, pixel areas 501A are provided.

To the signal lines 504, a shift register, a level shifter, video lines, and a data side driving circuit 507 having an analogue switch are connected. Also, to the scan lines 503, a scan side driving circuit 508 having the shift register and a level shifter are connected. Additionally, to each of the pixel areas 501A, a switching thin film transistor 509 to a gate electrode of which the scan signal is supplied via the scan lines 503, an accumulating capacity cap for storing and retaining an image signal which is supplied from the signal line 504 via the switching thin film transistor 509, a current thin film transistor 510 to the gate electrode of which the image signal which is stored in the accumulating capacity cap is supplied, a picture element electrode 511 to which the driving current flows in from the common electricity supplying line 505 when the pixel electrode 511 is connected to the common electricity supplying line 505 electrically via the current thin film transistor 510, and an illuminating element 513 which are sandwiched by the pixel electrode 511 and a reflecting electrode 512 are provided.

By doing this, when the scan line 503 is driven and the switching thin film transistor 509 is turned on, a potential of the signal line 504 at the time is retained in the accumulating capacity cap. On/off condition of the current thin film transistor 510 is determined according to the condition of the accumulating capacity cap. In addition, via channels of the current thin film transistor 510, electric current flows from the common electricity supplying line 505 to the pixel electrode 511 Furthermore, electric current flows to the reflecting electrode 512 via the illuminating element 513. By doing this, the illuminating element 513 is illuminated according to the amount of the electric current which flows therethrough.

Here, in the pixel area 501A, as shown in FIG. 36 which is an enlarged view of pixel area without the reflecting electrode 512 and the illuminating element 513, four members of the pixel electrode 511 in rectangular shape under planar condition are surrounded by the signal line 504, common electricity supplying line 505, scan line 503, and a scan line 503 for the scan line 503 and other pixel electrode 511 which is not shown in the drawing.

(Manufacturing Process for Display Apparatus)

Next, manufacturing process for manufacturing an active-matrix display apparatus which uses the above-explained EL displaying element is explained. FIGS. 37A to 39D are views showing manufacturing processes for an active-matrix display apparatus which uses the EL displaying element.

(Preparatory Processing)

Figure 37A:
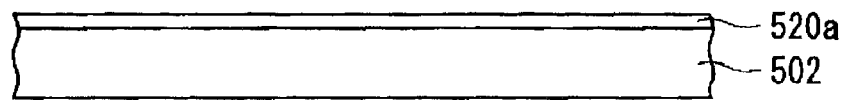
FIGS. 37A to 37E are cross sections showing a preparatory process which is performed before the manufacturing process of the present invention.

First, as shown in FIG. 37A, on a transparent displaying base board 502, a base protecting layer as a silicon oxide layer having a thickness of approximately 2,000 to 5,000 angstroms, which is not shown in the drawing, is formed by plasma CVD (Chemical Vapor Deposition) method using tetraethoxysilane (TEOS) and oxygen gas as a material gas according to necessity. Next, temperature of the displaying base board 502 is set to nearly 350° C., and a semiconductor layer 520a such as an amorphous silicon layer having a thickness of approximately 300 to 700 angstroms is formed on the base protecting layer by a plasma CVD method. After that, crystallizing processes such as laser annealing methods or solid growth methods are performed on the semiconductor layer 520a; thus, the semiconductor layer 520a is crystallized to a polysilicon layer. Here, in a laser annealing method, a line beam having a wavelength of an excimer laser, such as approximately 400 nm is used, and its output intensity is nearly 200 mJ/cm$^2$. The line beam is scanned such that a portion of the line beam which corresponds to 90% of the peak of the laser intensity in the latitudinal direction overlaps in each area.

Figure 37B:
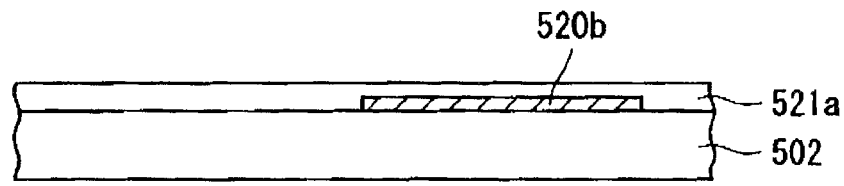

In addition, as shown in FIG. 37B, patterning operation is performed on the semiconductor layer 520a so as to form a semiconductor layer 520b in a manner of an isolated island. On a surface of the displaying base board 502 on which the semiconductor layer 520b is formed, a silicon oxide layer having a thickness of approximately 600 to 1,500 angstroms or a gate insulating layer 521a such as a nitrided layer is formed by plasma CVD method by using TEOS or oxygen gas as a material gas. Here, the semiconductor layer 520b becomes a channel area or a source drain area of the current thin film transistor 510. Also, in a different cross sectional position, a semiconductor layer which becomes the channel area and the source drain area of the switching thin film transistor 509 which is not shown in the drawing is formed. That is, in a manufacturing process as shown in FIGS. 37A to 39D, two types of switching thin film transistors 509 and current thin film transistors 510 are formed simultaneously. Manufacturing process for these transistors are the same; therefore, in the following explanation, only the current thin film transistor 510 is explained, and the explanation for the switching thin film transistor 509 is omitted.

Figure 37C:
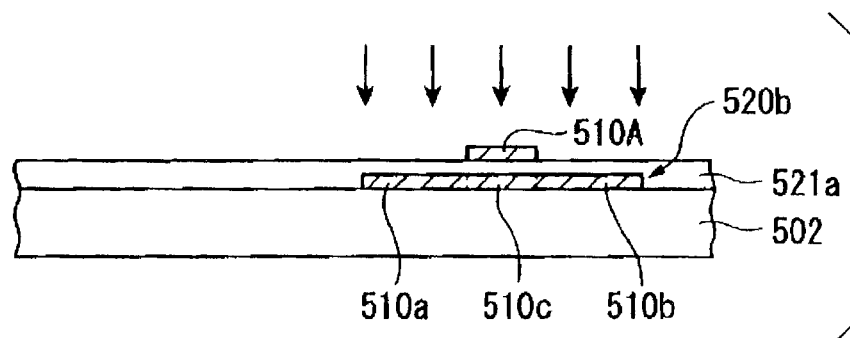

After that, as shown in FIG. 37C, a conductive layer as a metal film such as aluminum, tantalum, molybdenum, titanium, and tungsten is formed by a sputtering method, and a patterning operation is performed thereto; thus, a gate electrode 510A is formed as shown in FIG. 36. Under this condition, a high temperature phosphor ion is shot therein so as to form source drain areas 510a and 510b on a gate electrode 510A on the semiconductor layer 520b in self-automatic manner. Here, a portion in which impurities are not introduced becomes a channel area 510c.

Figure 37D:
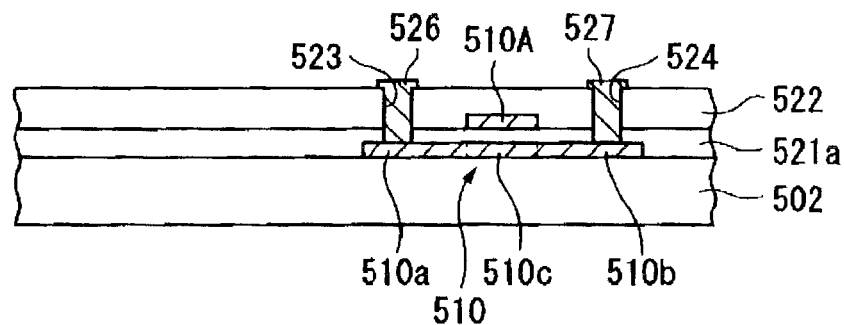

Next, as shown in FIG. 37D, after an inter-layer insulating layer 522 is formed, contact holes 523 and 524 are formed. Furthermore, relay electrodes 526 and 527 are buried in the contact holes 523 and 524.

Figure 37E:
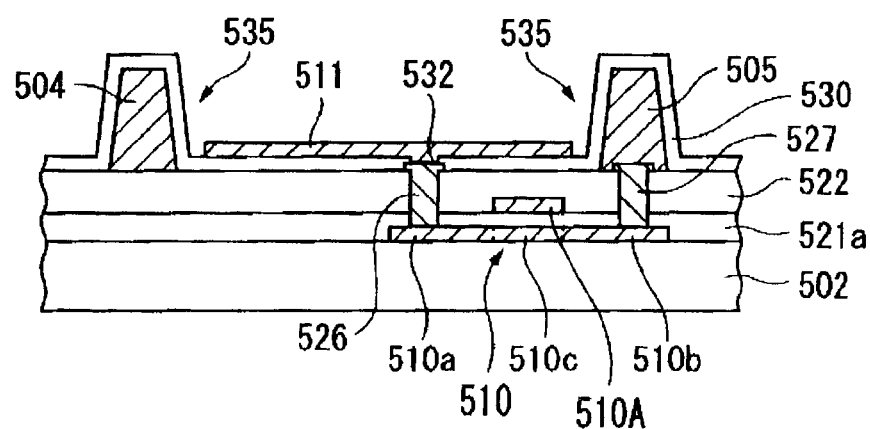

Furthermore, as shown in FIG. 37E, on the inter-layer insulating layer 522, a signal line 504, a common electricity supplying line 505, and a scan line 503 (not shown in FIGS. 37A to 37E) are formed. At this time, wirings such as signal line 504, a common electricity supplying line 505, and a scan line 503 are formed in sufficient thickness with regardless of the necessary thickness for wirings. More specifically, it is preferable that each wiring should be formed in, for example, thickness of 1 to 2 μm. Here, it is acceptable that the relay electrode 527 and each wiring are formed by the same manufacturing process. At this time, the relay electrode 526 is formed by an ITO layer as explained later.

In addition, the inter-layer insulating layer 530 is formed so as to cover a top surface of each wiring, and a contact hole 532 is formed in a corresponding position to the relay electrode 526. An ITO layer is formed so as to bury the contact hole 532. By performing a patterning operation on the ITO layer, a pixel electrode 511 which is connected to the source drain area 510a electrically at a predetermined position which is surrounded by the signal line 504, the common electricity supplying line 505, and the scan line 503 is formed.

Here, in FIG. 37E, an area which is sandwiched between the signal line 504 and the common electricity supplying line 505 is equivalent to the predetermined position to which an optical member is disposed selectively. Furthermore, between the predetermined position and its peripheral region, a gap 535 is formed by the signal line 504 and the common electricity supplying line 505. More specifically, the predetermined position is lower than the peripheral region; thus a gap 535 having a concave section is formed.

(Ejection of EL Illuminating Member)

Figure 38A:
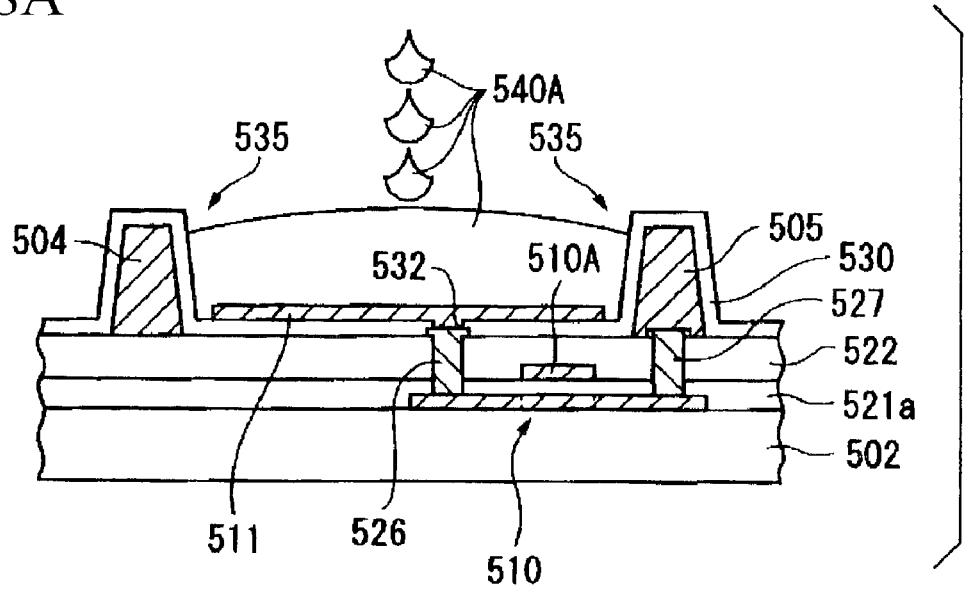
FIGS. 38A to 38C are cross sections showing ejecting process for the EL illuminating member in the manufacturing process for the display apparatus.

Next, an EL illuminating member as a functional liquid material is ejected to the displaying base board 502 to which the preparatory processing was performed by an ink jet method. That is, as shown in FIG. 38A, an optical member 540A, such as a solvent-like precursor which is dissolved by a solvent, as a functional liquid material for forming a positive hole ejection layer 513A which is equivalent to a lower layer of the illuminating element 140 is ejected under condition that a top surface of the displaying base board 502 on which the preparatory processing was performed faces above by using an apparatus according to each embodiment by the ink jet method; thus, the optical member 540A is applied to an area in the predetermined position which is surrounded by the gap 535 selectively.

For an optical member 540A for forming the positive hole ejection layer 513A, polyphenylene vinylene (the polymer precursor for which is polytetrahydrothiophenyl phenylene), 1,1-bis(4-N,N-ditolylaminophenyl)cyclohexane, tris(8-hydroxyquinolinol) aluminium.

Here, at the time of ejection, because the fluidity of the fluid optical member 540A is high, the optical member 540A expands in planar directions as similar to the case in which the filter element member 13 is ejected to the bulkhead according to each embodiment. However, the gap 535 is formed so as to surround the area on which the optical member 540A is applied; therefore, unless ejection amount of the optical member 540A in one time is extremely large, it is possible to prevent the optical member 540A from expanding over the gap 535 outside the predetermined position.

Figure 38B:
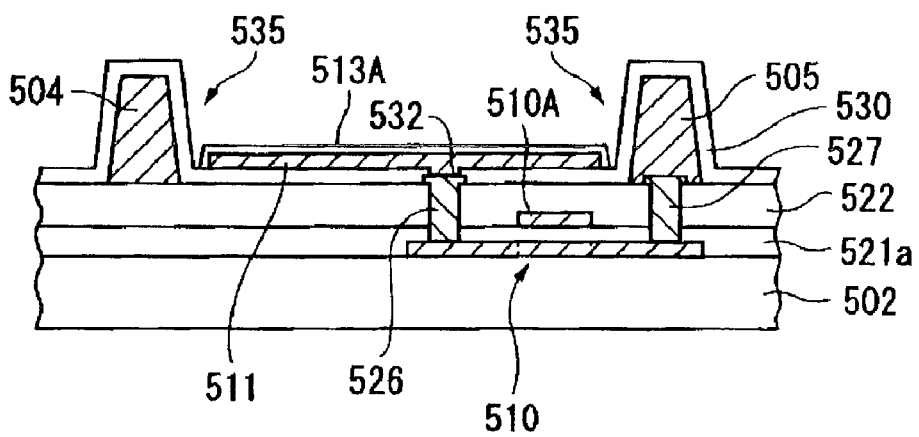
Figure 38C:
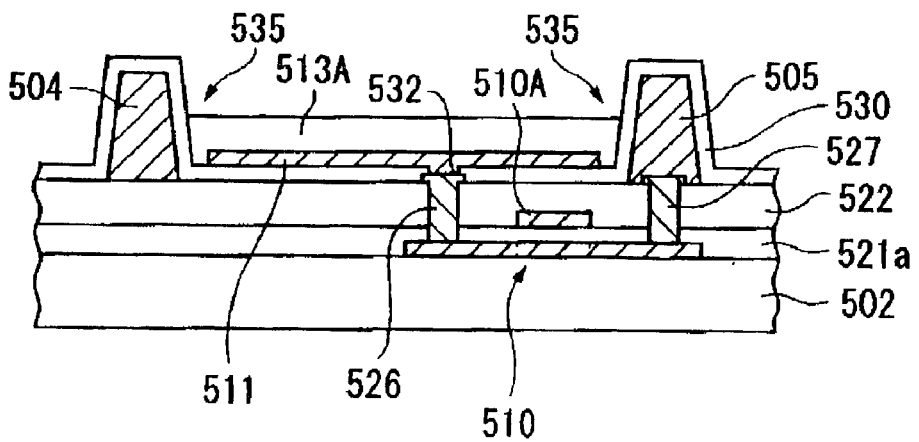

Furthermore, as shown in FIG. 38B, the solvent for the liquid optical member 540A is evaporated by a heating method or a light emitting method so as to form a thin solid positive hole ejection layer 513A on the pixel electrode 511. The processes shown in FIGS. 38A and 38B are repeated a necessary number of times, and as shown in FIG. 38C, a positive hole ejection layer 513A having a sufficient thickness is formed.

Figure 39A:
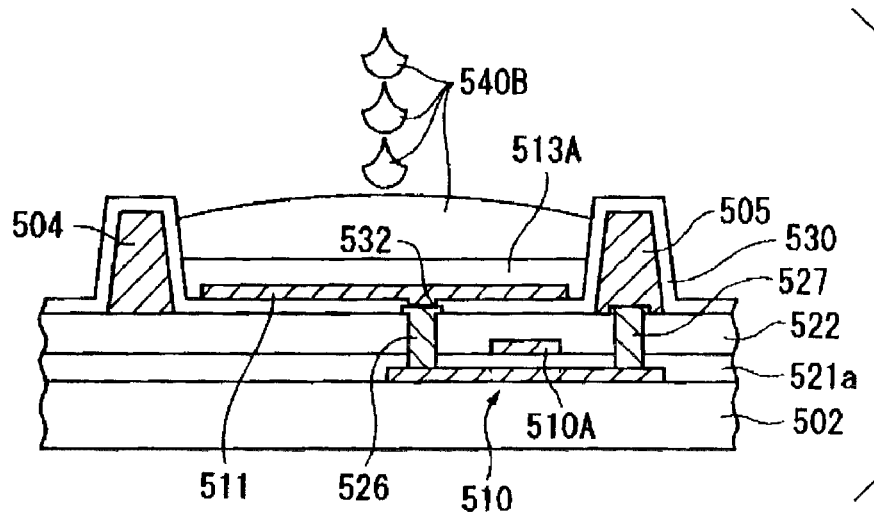
FIGS. 39A to 39D are cross sections showing ejecting process for the EL illuminating member in the manufacturing process for the display apparatus.

Next, as shown in FIG. 39A, the optical member 540B, under condition of a solvent-like organic illuminating member which is dissolved in the solvent, as a functional liquid material for forming the organic semiconductor layer 513B on a surface of the illuminating element 513 is ejected such that the top surface of the displaying base board 502 faces upward by using the apparatus in each embodiment by the ink jet method. The optical member 540B is applied in the area which is equivalent to the predetermined position which is surrounded by the gap 535. Here, as explained above, the optical member 540B is prevented from expanding outside the predetermined position over the gap 535 as similar to a case of the ejection of the optical member 540A.

For an optical member 540B for forming the organic semiconductor layer 513B, a cyano-substituted polyphenylene vinylene, a polyphenylene vinylene, a polyalkyl phenylene, 2,3,6,7-tetrahydro-11-oxo-1H,5H,11H-[1]benzopyrano[6,7,8-ij]-quinolizin-10-carboxylic acid, 1,1-bis-(4-N,N-ditolylaminophenyl)cyclohexane, 2-(3,4'-dihydroxyphenyl)-3,5,7-trihydroxy-1-benzopyrylium perchlorate, tris(8-hydroxyxylenol)aluminium, 2,3,6,7-tetrahydro-9-methyl-11-oxo-1H,5H,11H-[1]benzopyrano[6,7,8-ij]-quinolizin, an aromatic diamine derivative (TDP), an oxadiazole dimer (OXD), an oxadiazole derivative (PBD), a distyrylarylene derivative (DSA), a quinolinol metal complex, a beryllium-benzoquinolinol complex (Bebq), a triphenylamine derivative (MTDATA), a distyryl derivative, a pyrazoline dimer, rubrene, quinacridone, a triazole derivative, a polyphenylene, a polyalkylfluorene, a polyalkylthiophene, an azomethine zinc complex, a porphyrin zinc complex, a benzoxazole zinc complex, a phenanthroline europium complex, and the like are used.

Figure 39B:
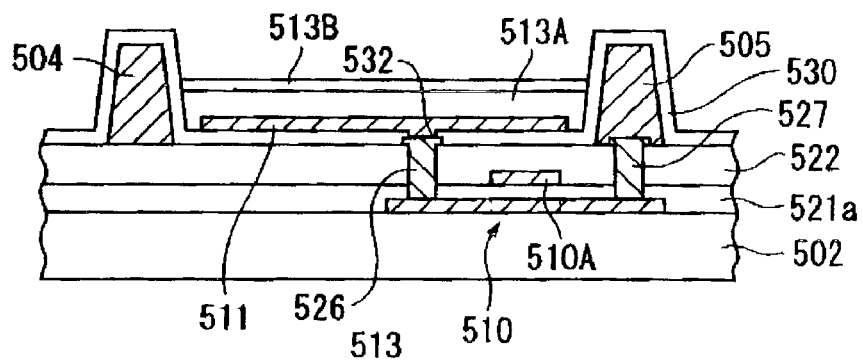
Figure 39C:
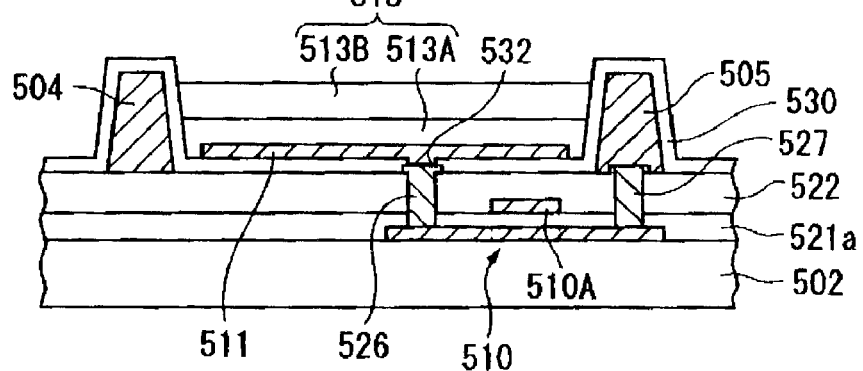
Figure 39D:
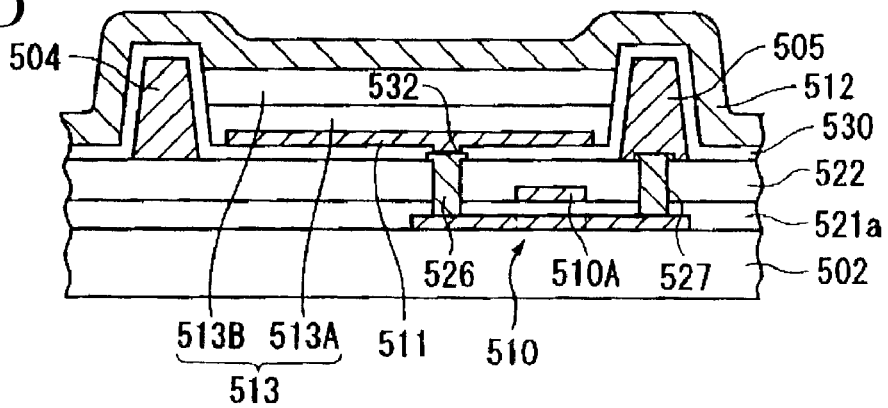
Figure 40:
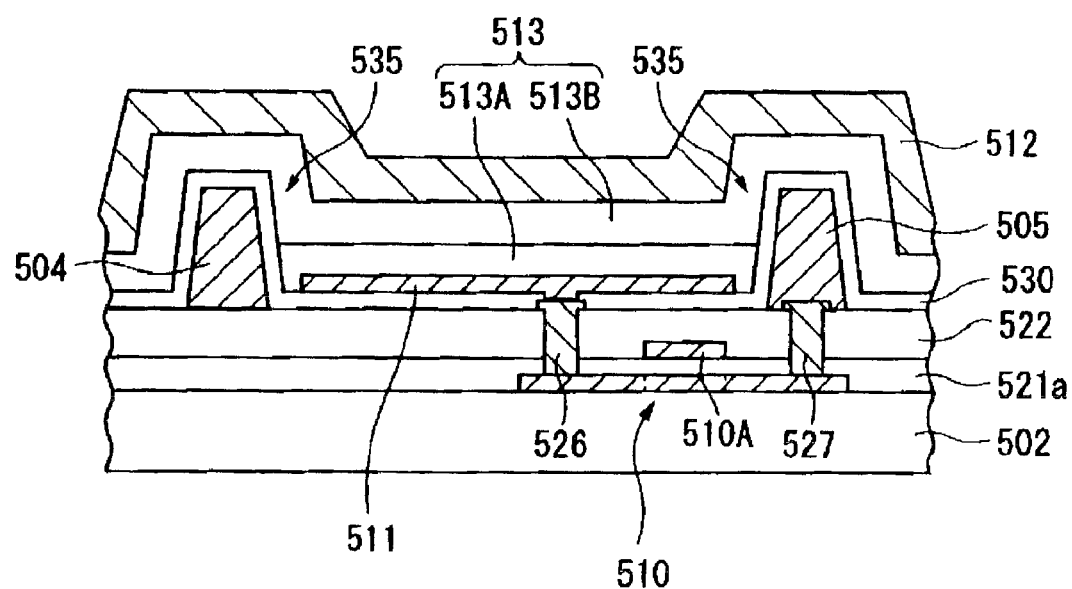
FIG. 40 is an enlarged cross section showing a planar structure of the pixel area in the display apparatus which uses the EL displaying element for the electrooptical apparatus according to the present invention.

Next, as shown in FIG. 39B, the solvent for the liquid optical member 540B is evaporated by a heating method or a light emitting method so as to form a thin solid organic semiconductor layer 513B on the positive hole ejection layer 513A. The processes shown in FIGS. 39A and 39B are repeated a necessary number of times, and as shown in FIG. 39C, a positive hole ejection layer 513B having a sufficient thickness is formed. By the positive hole ejection layer 513A and the organic semiconductor layer 513B, the illuminating element 513 is made. Finally, as shown in FIG. 39D, a reflecting electrode 512 is formed on an entire surface of the displaying base board 502 or in a striped manner; thus, the displaying base board 501 is manufactured.

In each of the embodiments shown in FIGS. 35 to 39D, by performing the same ink jet method as in the each of the above-explained embodiments, it is possible to provide similar operational effects. Furthermore, when the functional liquid material is applied selectively, it is possible to prevent the functional liquid material from flowing therearound; thus, it is possible to perform the patterning operation in high accuracy.

Here, in embodiments shown in FIGS. 35 to 39D, an active-matrix display apparatus using an EL displaying element for color display operation is explained. In addition, as shown in FIGS. 40A to 40D, the structures shown in FIGS. 35 to 39D can be applied to a display apparatus for a single color.

That is, it is acceptable for the organic semiconductor layer 513B to be formed uniformly on an entire surface of the displaying base board 502. However, in this case, the positive hole ejection layer 513A must be disposed selectively according to each of the predetermined positions so as to prevent cross-talk. Therefore, it is quite effective to apply using the gap 111. Hereinafter, in FIG. 40, the same reference numerals are applied to corresponding members as shown in FIGS. 35 to 39D so as to omit the repeated explanation thereof.

Figure 41A:
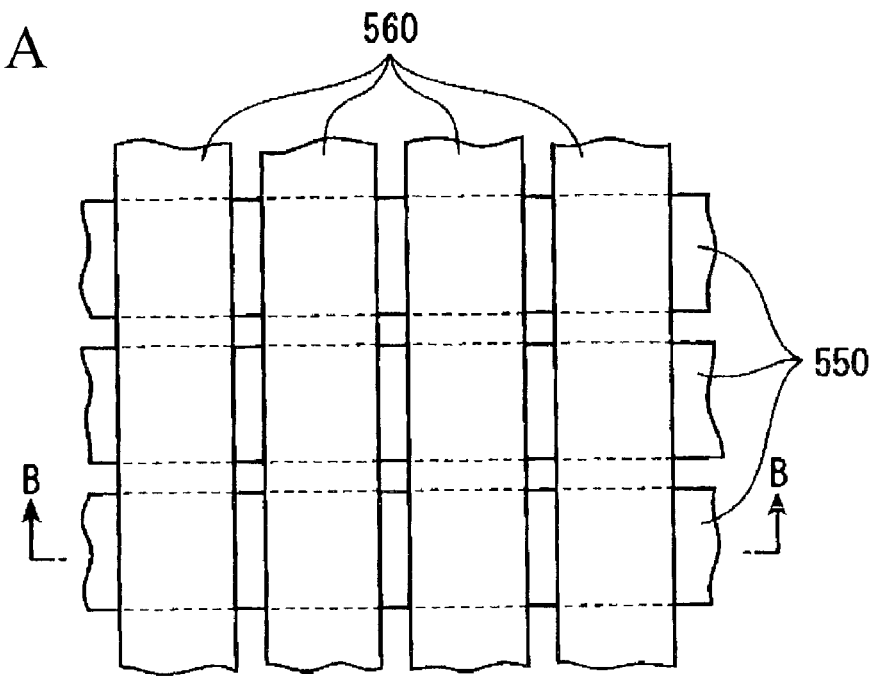
FIGS. 41A and 41B are enlarged cross sections showing a planar structure of the pixel area in the display apparatus which uses the EL displaying element for the electrooptical apparatus according to the present invention.
Figure 41B:
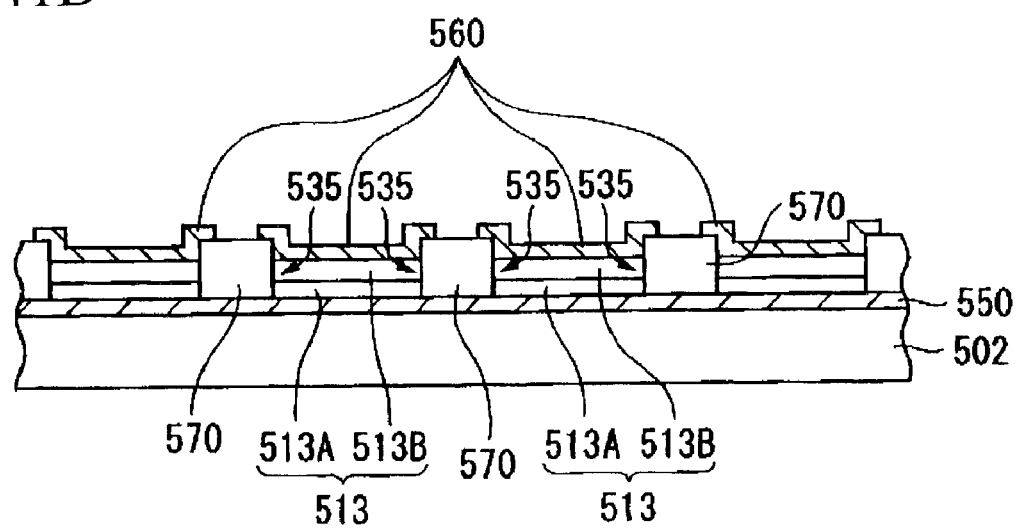

Also, a display apparatus using the EL illuminating element can be provided not only in a form of an active-matrix display apparatus, but also in a form of a passive-matrix display apparatus as shown in FIGS. 41A and 41B. FIGS. 41A and 41B show an EL apparatus in a manufacturing apparatus for an electrical optical apparatus according to the present invention. FIG. 41A is a plan view showing a wiring disposition of a plurality of a first bus wiring 550 and a second bus wiring 560 which are disposed so as to be orthogonal to the first bus wiring 550. FIG. 41B is a cross section viewed along B—B line in FIG. 41A. Hereinafter, in FIGS. 41A and 41B, the same reference numerals are applied to corresponding members as shown in FIGS. 35 to 39D so as to omit the repeated explanation thereof. Also, the details in the manufacturing processes are the same as the embodiments shown in FIGS. 35 to 39D; therefore, explanation with reference to drawings are omitted.

In a display apparatus according to the embodiment shown in FIGS. 41A and 41B, an insulating layer 570 made of, for example, $SiO_2$ are disposed so as to surround the predetermined position to which the illuminating element 513 is located. By doing this, a gap 535 is formed between the predetermined position and the peripheral area. By doing this, it is possible to prevent the functional liquid material from flowing to the peripheral area when the functional liquid material is applied selectively. Also, it is possible to perform a patterning operation in high accuracy.

Furthermore, an active-matrix display apparatus is not limited to embodiments shown in FIGS. 35 to 39D. That is, an active-matrix display apparatus can be provided according to any one of embodiments such as shown in, for example, FIGS. 42,43, 44, 45, 46, or 47.

Figure 42:
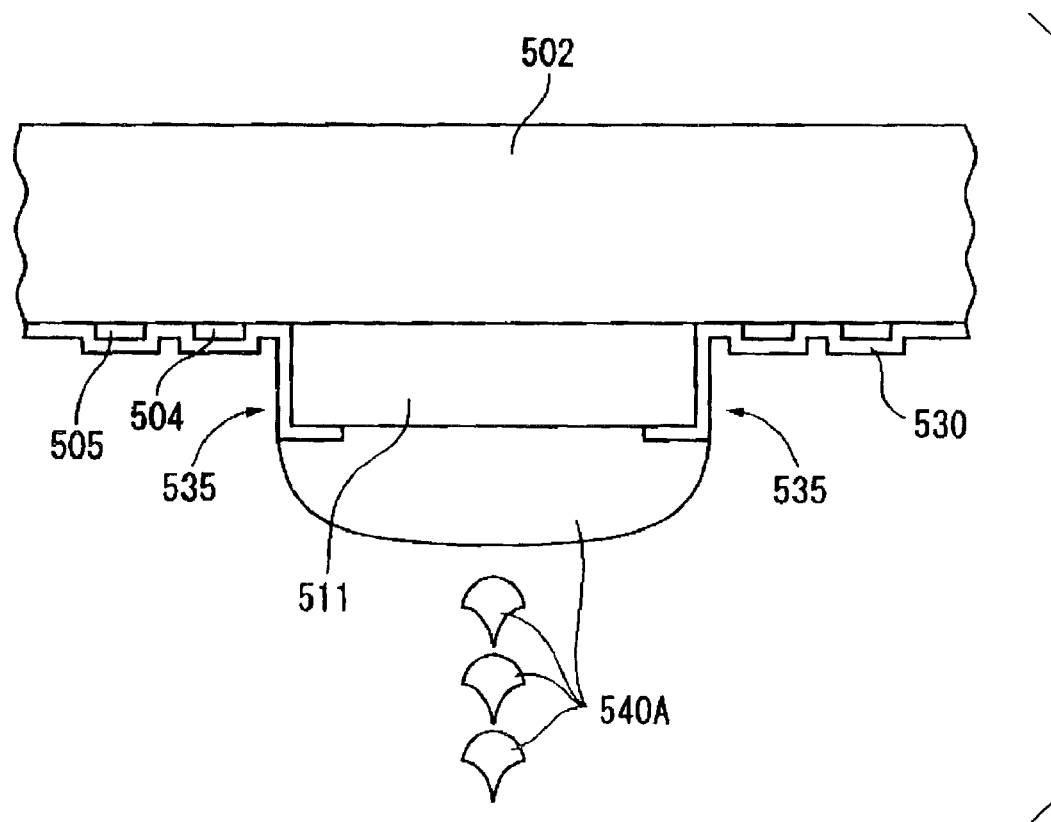
FIG. 42 is a cross section showing the manufacturing process for manufacturing the display apparatus which uses the EL displaying element for the electrooptical apparatus according to the present invention.

In a display apparatus shown in FIG. 42, it is possible to perform a patterning operation in high accuracy by forming a gap 535 by using the pixel electrode 511. FIG. 42 is a cross section showing an intermediate process for manufacturing processes for a display apparatus. The previous and consequent processes are approximately the same as the embodiment shown in FIGS. 39A to 39D; therefore explanation with reference to drawings is omitted.

In the display apparatus shown in FIG. 42, the pixel electrode 511 is formed in larger thickness than an ordinary pixel electrode. By doing this, a gap 535 is formed between the pixel electrode 511 and the peripheral area. That is, in the display apparatus shown in FIG. 42, a pixel electrode 511 to which an optical member is applied later is higher than the peripheral area therearound in convex shape. Furthermore, an optical member 540A as a precursor for forming a positive hole ejection layer 513A which is disposed under the illuminating element 513 is applied on a surface of the pixel electrode 511 by an ink jet method similarly to embodiments shown in FIGS. 35 to 39D.

However, the conditions are different from the embodiments shown in FIGS. 35 to 39D in that the the optical member 540A is ejected by the displaying base board which is disposed vertically reversed, that is, under conditions that the top surface of the pixel electrode 511 to which the optical member 540A is applied is directed downward. By doing this, the optical member 540A remains on a top surface of the pixel electrode 511 (on a downwarded surface in FIG. 42) by gravity and surface tension; therefore, the optical member 540A does not expand to the peripheral area. By doing this, the optical member 540A is solidified by heating processing or light emitting method, and it is possible to form a thin positive hole ejection layer 513A which is similar to the embodiment shown in FIG. 38B. By repeating the above-explained processes, it is possible to form the positive hole ejection layer 513A. The organic semiconductor layer 513B can be formed by a similar method. By doing this, it is possible to perform a patterning operation with high accuracy by using a convex gap. Here, it is acceptable that the ejection amount of the optical members 540A and 540B be adjusted not only by gravity and surface tension, but also by inertia force such as centrifugal force.

Figure 43:
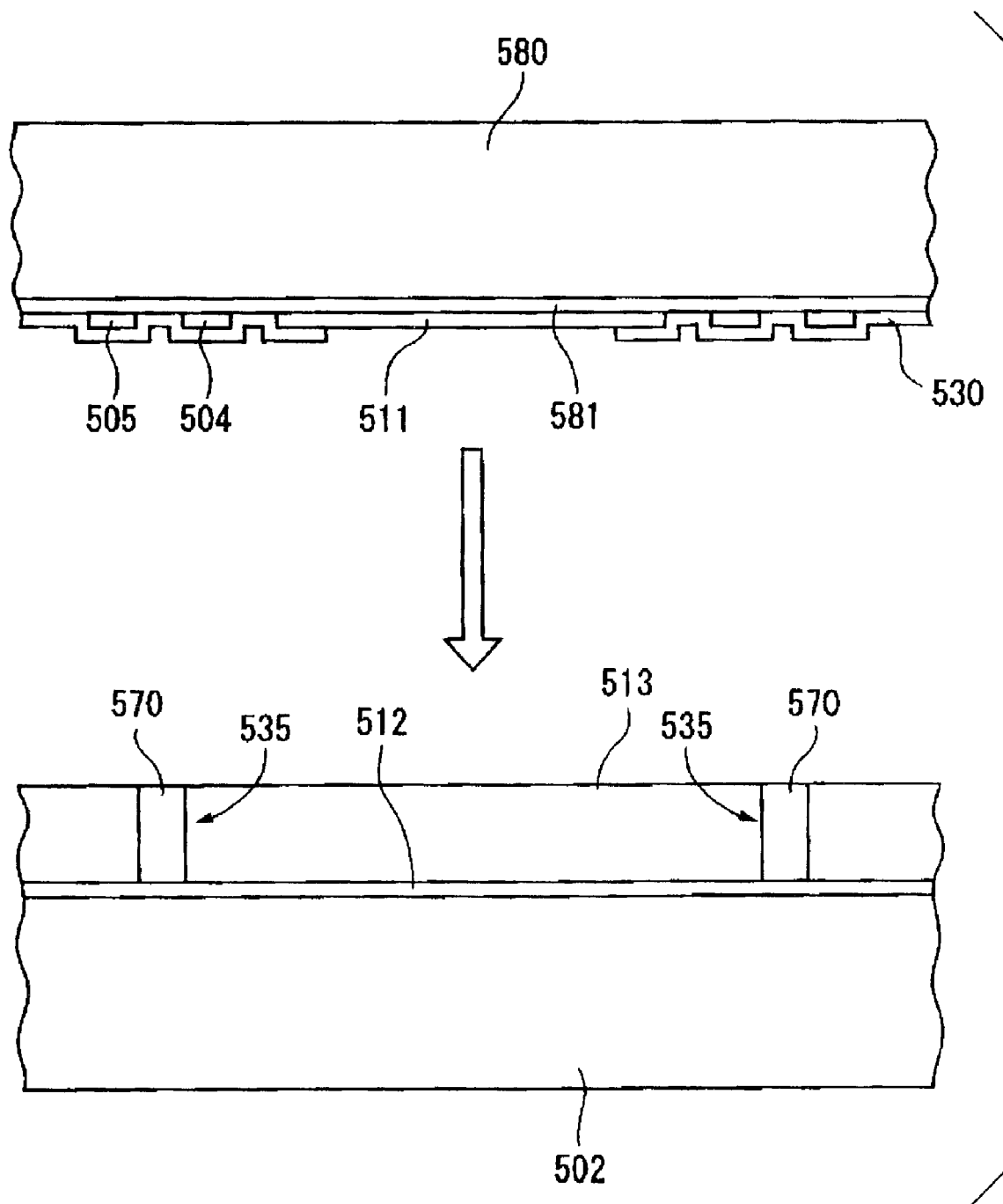
FIG. 43 is a cross section showing the manufacturing process for manufacturing the display apparatus which uses the EL displaying element for the electrooptical apparatus according to the present invention.

A display apparatus shown in FIG. 43 is also an active-matrix display apparatus. FIG. 43 shows a cross section of an intermediate process for manufacturing a display apparatus. The previous and consequent processes are approximately the same as the embodiment shown in FIGS. 35 to 39D; therefore, explanation with reference to drawings is omitted.

In the display apparatus shown in FIG. 43, at first, a reflecting electrode 512 is formed on the displaying base board 502. Then, an insulating layer 570 is formed on the reflecting electrode 512 so as to surround the predetermined position on which the illuminating element 513 is disposed later. By doing this, a gap 535 which is lower than the peripheral area therearound is formed in concave shape.

In addition, similarly to the cases of the embodiments shown in FIGS. 35 to 39D, the illuminating element 513 is formed by ejecting and applying the optical members 540A and 540B as a functional liquid material in the area which is surrounded by the gap 535 by ink jet method.

On the other hand, on the removal base board 580, the scan line 503, ths signal line 504, the pixel electrode 511, the switching thin film transistor 509, the current thin film transistor 510, and the inter-layer insulating layer 530 are formed via a removal layer 581. Finally, a structure which is removed from the removal layer 581 on the removal base board 580 is printed on the displaying base board 502.

In the embodiment shown in FIG. 43, it is possible to reduce damage to the scan line 503, the signal line 504, the pixel electrode 511, the switching thin film transistor 509, the current thin film transistor 510, and the inter-layer insulating layer 530 caused by application of the optical members 540A and 540B. Here, the present embodiment can be applied to the passive-matrix displaying element.

Figure 44:
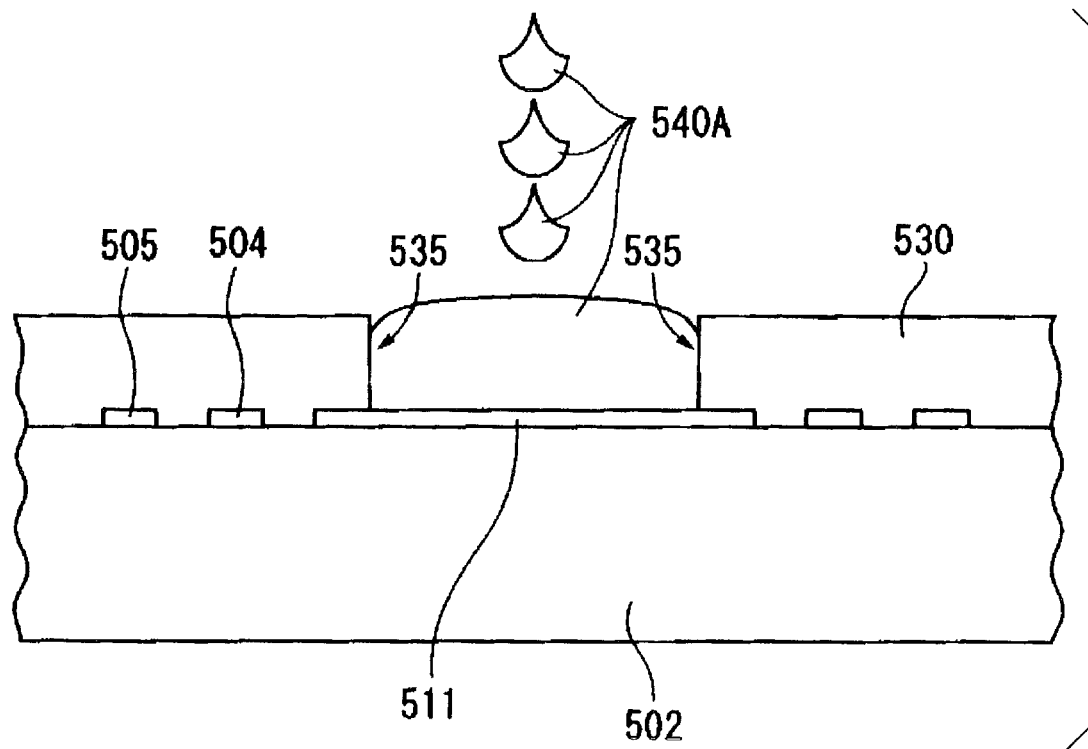
FIG. 44 is a cross section showing the manufacturing process for manufacturing the display apparatus which uses the EL displaying element for the electrooptical apparatus according to the present invention.

A display apparatus shown in FIG. 44 is also an active-matrix display apparatus. FIG. 44 shows a cross section of an intermediate process for manufacturing a display apparatus. The previous and consequent processes are approximately the same as the embodiment shown in FIGS. 35 to 39D; therefore, explanation with reference to drawings is omitted.

In the display apparatus shown in FIG. 44, a concave gap 535 is formed by using the inter-layer insulating layer 530. By doing this, it is possible to use the inter-layer insulating layer 530 without causing new manufacturing processes; thus, it is possible to prevent the manufacturing process from being greatly complicated. Here, it is acceptable for the inter-layer insulating layer 530 to be formed of $SiO_2$, and for ultraviolet light or plasma of $O_2$, $CF_3$, or Ar to be emitted. Furthermore, it is acceptable for a surface of the pixel electrode 511 to be exposed and for liquid optical members 540A and 540B to be ejected and applied selectively. By doing this, a distribution in which volatility is high is formed along a surface of the inter-layer insulating layer 530. Thus, the optical members 540A and 540B tend to be collected in the predetermined position by effects by the gap 535 and the volatility of the inter-layer insulating layer 530.

Figure 45:
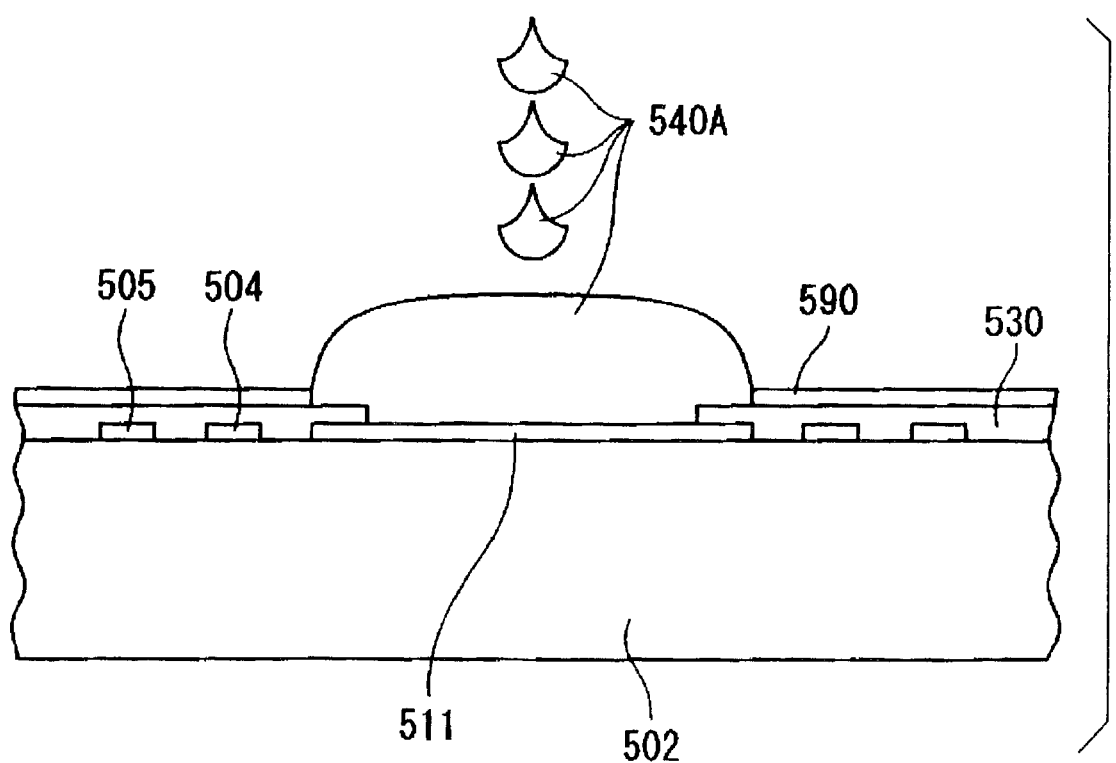
FIG. 45 is a cross section showing the manufacturing process for manufacturing the display apparatus which uses the EL displaying element for the electrooptical apparatus according to the present invention.

In a display apparatus shown in FIG. 45, it is intended that the applied optical members 540A and 540B not expand to the peripheral area by intensify the hydrophilicity in the predetermined position to which the liquid optical members 540A and 540B are applied than the hydrophilicity in the peripheral area. FIG. 45 shows a cross section of an intermediate process for manufacturing a display apparatus. The previous and subsequent processes are approximately the same as the embodiment shown in FIGS. 35 to 39D; therefore, explanation with reference to drawings is omitted.

In a display apparatus shown in FIG. 45, the inter-layer insulating layer 530 is formed, and after that, the amorphous silicon layer 590 is formed on a surface thereof. Volatility of the amouphous silicon layer 590 is higher than volatility of the ITO contained in the pixel electrode 511 relatively. Here, on a surface of the pixel electrode 511, a distribution of which hydrophilic property and volatility is relatively higher than hydrophilicity and volatility in the peripheral area can be formed. In addition, similarly to the embodiments shown in FIGS. 35 to 39D, by ejecting and applying the liquid optical members 540A and 540B toward above the pixel electrode 511 selectively by ink jet method, the illuminating element 513 is formed, and finally, the reflecting electrode 512 is formed.

Here, the embodiment shown in FIG. 45 can be applied to the passive-matrix display apparatus. Furthermore, similarly to the embodiment shown in FIG. 43, it is acceptable that the manufacturing process contain the process in which the structure which is formed on the removal base board 580 via the removal layer 581 is transmitted on the displaying base board 502.

Also, it is acceptable that the distribution of volatility and hydrophilicity be formed by metal or insulating layers such as anode oxide layer, polyimide, or silicon oxide, or other material member. Here, the passive-matrix displaying element can be formed by the first bus wiring 550. The active-matrix displaying element can be formed by the scan line 503, the signal line 504, the pixel electrode 511, the insulating layer 530, or the shielding layer 6b.

Figure 46:
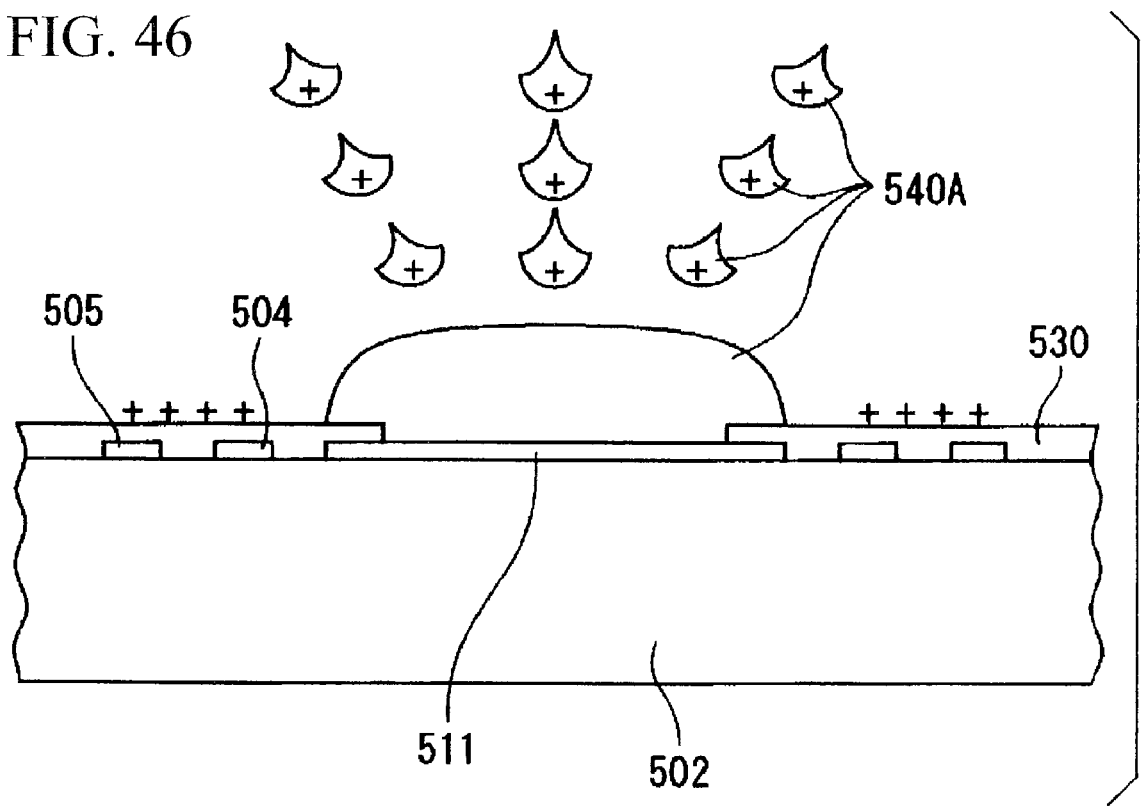
FIG. 46 is a cross section showing the manufacturing process for manufacturing the display apparatus which uses the EL displaying element for the electrooptical apparatus according to the present invention.

In a display apparatus shown in FIG. 46, accuracy of the patterning operation improves not by using the gap 535 of distribution of volatility and hydrophilicity, but by using the gravity due to the electric potential and repulsive force. FIG. 46 shows a cross section of an intermediate process for manufacturing a display apparatus. The previous and consequent processes are approximately the same as the embodiment shown in FIGS. 35 to 39D; therefore, explanation with reference to drawings is omitted.

In a display apparatus shown in FIG. 46, by driving the signal line 504 and the common electricity supplying line 505 and turning on/off the transistor appropriately, which is not shown in the drawing, potential distribution in which a potential of the pixel electrode 511 becomes negative, and a potential of the inter-layer insulating layer 530 becomes positive is formed. Furthermore, the liquid optical member 540A which is electrified in positive potential is ejected and applied to the predetermined position by an ink jet method. By doing this, because the optical member 540A is electrified, it is possible to use not only spontaneous polarization but also electrified charge; thus, it is possible to improve the accuracy in the patterning operation.

Here, the embodiment shown in FIG. 46 can be applied to the passive-matrix display apparatus. Furthermore, similarly to the embodiment shown in FIG. 43, it is acceptable for the manufacturing process to contain a process in which the structure which is formed on the removal base board 580 via the removal layer 581 is transmitted on the displaying base board 502.

Figure 47:
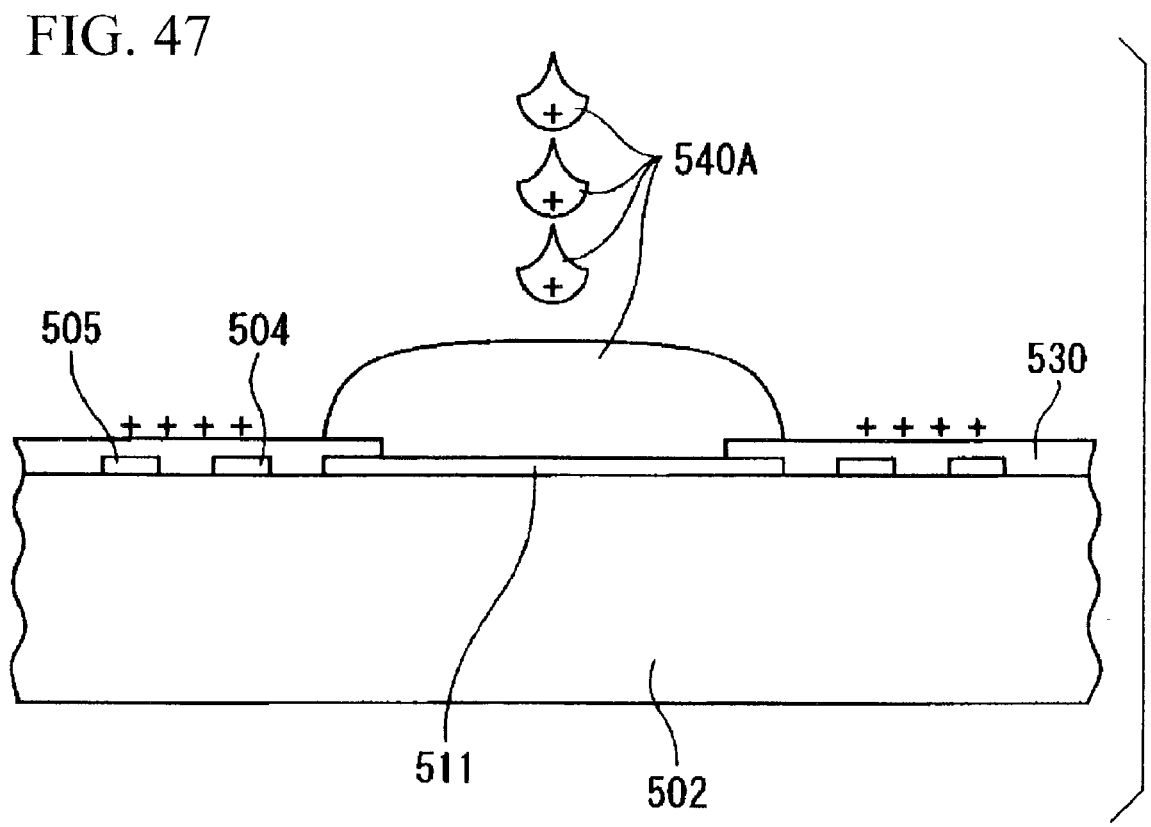
FIG. 47 is a cross section showing the manufacturing process for manufacturing the display apparatus which uses the EL displaying element for the electrooptical apparatus according to the present invention.

Also, in the embodiment shown in FIG. 46, potentials are given to both the pixel electrode 511 and the inter-layer insulating layer 530 which is disposed therearound. However, the present invention is not limited to the embodiment shown in FIG. 46. For example, as shown in FIG. 47, it is acceptable that a potential is not given to the pixel electrode 511 and a potential is given only to the inter-layer insulating layer 530; furthermore, the liquid optical member 540A is electrified in positive potential so as to be applied. According to the embodiment shown in FIG. 47, because the liquid optical member 540A can maintain the positively-electrified condition securely after the applying operation. Therefore, it is possible to prevent the liquid optical member 540A from flowing to the peripheral area securely by the repulsive force between the liquid optical member 540A and the inter-layer insulating layer 530 which is disposed in the peripheral area thereof.

OTHER EMBODIMENTS

The preferable embodiments of the present invention were explained above. However, the present invention is not limited to the embodiments which are explained above. The present invention includes modified embodiments as follows. The invention disclosed herein may be variously modified and have alternative forms as long as they fall within the scope of the present invention as defined by the claims.

That is, for example, in the manufacturing apparatus for the color filter shown in FIGS. 8 and 9, by performing the main scanning of the motherboard 12 by moving the ink jet head 12 in the main scanning direction X and by moving the motherboard 12 by the sub-scanning driving apparatus 21, the sub-scanning operation for the motherboard 12 is performed by the ink jet head 22. In contrast, it is acceptable for the main scanning operation to be performed by the movement of the motherboard 12 and the sub-scanning operation is performed by the movement of the ink jet head 22. Furthermore, it is acceptable for the motherboard 12 to be moved without moving the ink jet head 22, or at least one of them is moved relatively such that the ink jet head 22 moves relatively along the surface of the motherboard 12, that is, both of them are moved relatively in an opposite direction.

Also, in the above-mentioned embodiment, the ink jet head 421 which ejects the ink by using the deflective transformation of the piezoelectric element was used. It is possible to use ink jet heads having any structure such as an ink jet head which ejects the ink by using bubbles which are generated by heating operation.

Furthermore, in the embodiments shown in FIGS. 22 to 32, it was explained that nozzles 466 were disposed at equal interval on nearly a line in two arrays in the ink jet head 421. However, it is acceptable that the nozzles are disposed not only in two arrays but also in a plurality of arrays, for example, more than 3 arrays. Also, it is accepted that the disposition of the nozzles 466 are not in an equal interval nor on a line in an array manner.

In addition, the liquid drop ejecting apparatuses 16 and 401 are not limited to be used in the color filter 1, the liquid crystal apparatus 101, and the EL apparatus 210. The liquid drop ejecting apparatuses 16 and 401 can be used for various electrooptical apparatuses which have a base board (base member) and a process for forming a predetermined layer thereon such as an electron emission apparatus such as an FED (Field Emission Display), a PDP (Plasma Display Panel), an electrophoretic apparatus which ejects the ink as a functional liquid material containing a charged particle to a concave section between the bulkhead of each pixel and charges a voltage between the electrodes which are disposed so as to sandwich each of the pixels vertically and brings the charged particle to either one of the electrodes so as to perform display operation in each of the pixels, thin Braun tube, and a CRT (Cathode-Ray tube) display.

The apparatuses and methods according to the present invention can be used for in manufacturing processes for various devices having a process for ejecting the liquid drop 8 to the base board (base member) of the device such as an electrooptical apparatus having the base board (base member). The apparatuses and methods according to the present invention can be used for, for example, structures in which a liquid metal, a conductive member, and a metal-contained painting member are ejected by an ink jet method so as to form a metal wiring, optical members such as fine microlenses which are formed on the base member by ink jet method, only necessary amount of resist is applied on the base board by ink jet method, concave sections or fine-white patterns for dispersing a light are formed on a transparent base board such as a plastic member by ink jet method so as to form a light dispersing board, samples, antibodies, and DNA (deoxylibonucleic acid) are ejected to a position in a dot manner which are separated on the base member by ink jet method so as to form a bio-tip; that is, RNA (ribonucleic acid) is ejected to a spike spot which is disposed in a matrix manner on a DNA chip by ink jet method so as to form a fluorescent probe such that the DNA chip can hybridize.

The apparatuses and methods according to the present invention can be used for a liquid crystal apparatus 101 such as an active-matrix liquid crystal panel which is provided with a pixel such as a transistor such as a TFT or an active element such as TFD. That is, the apparatuses and methods according to the present invention can be used for a structure for forming the electrooptical system for the liquid crystal apparatus 101, for example, structures in which an ink is ejected by an ink jet method to a bulkhead 6 which is formed so as to surround the pixel electrode so as to form a color filter 1, an ink containing a mixture of color members and conductive member is ejected to the pixel electrode by ink jet method so as to form a color filter 1 as a conductive color filter, a grain for a spacer for holding the gap between the base boards is ejected by ink jet method.

Furthermore, the apparatuses and methods according to the present invention can be used not only for the color filter 1 but also for any kind of electrooptical apparatus such as an EL apparatus 201. Also, the EL apparatus 201 can be realized in various ways such as a stripe displaying appratus in which the ELs corresponding to three colors such as those of R, G, and B are formed in a strip manner, an active-matrix display apparatus which is provided with transistors for controlling the electric current which flows in the illuminating layers with respect to each pixel, and a passive-matrix display apparatus.

Figure 48:
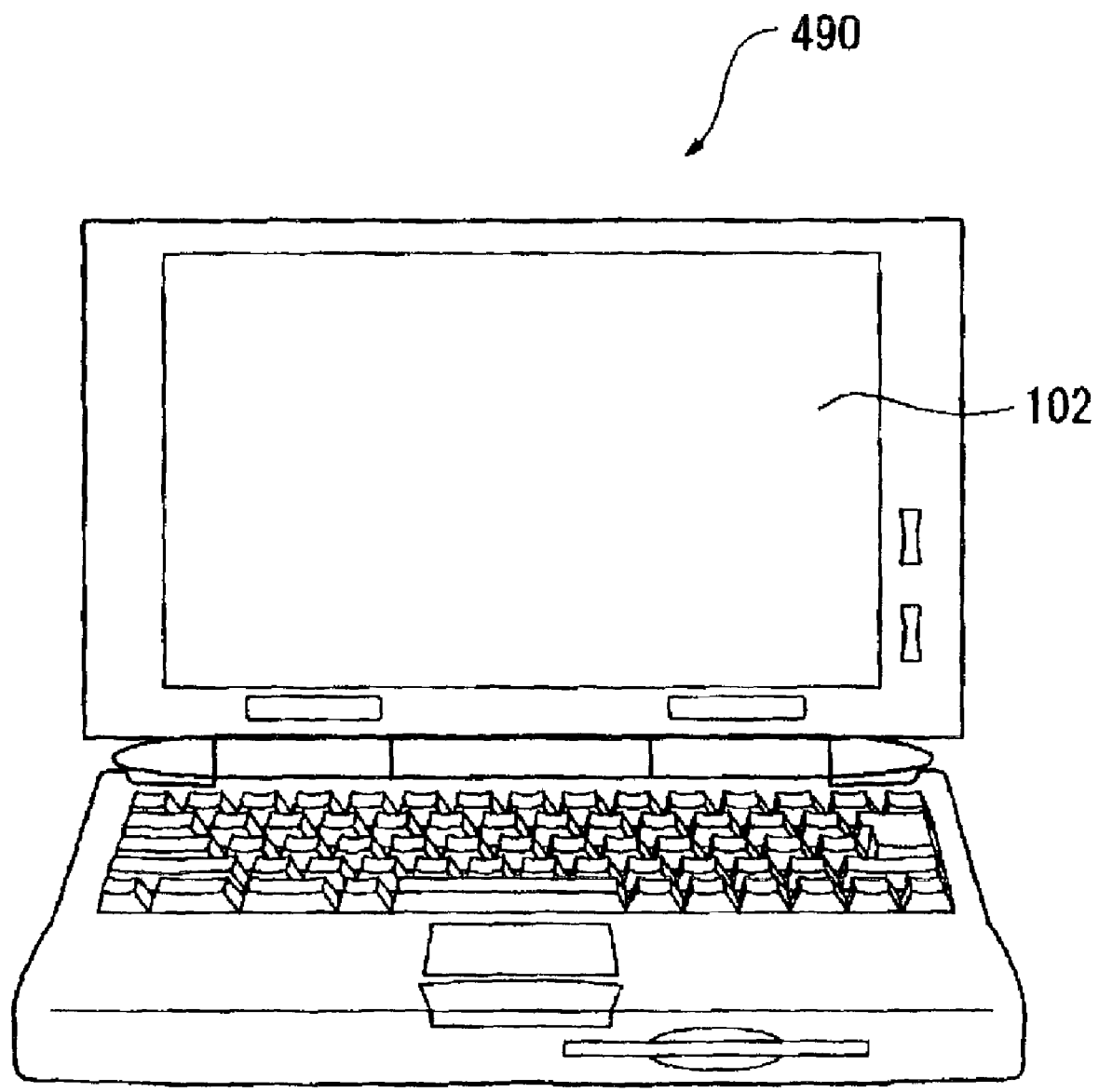
FIG. 48 is a perspective view showing a personal computer as an electric device which is provided with the electrooptical apparatus.
Figure 49:
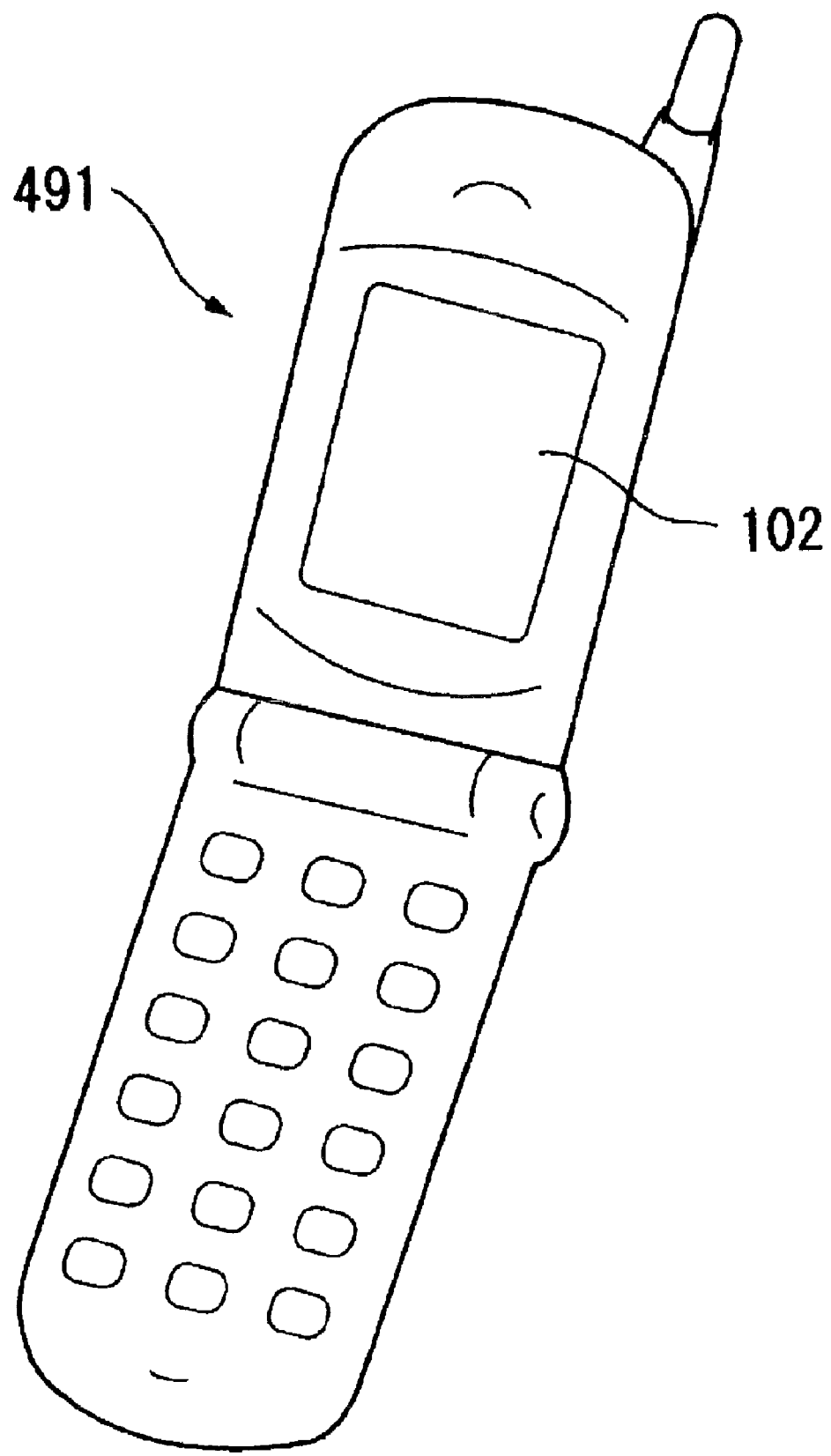
FIG. 49 is a perspective view showing a mobile phone as an electric device which is provided with the electrooptical apparatus.
Figure 50A:
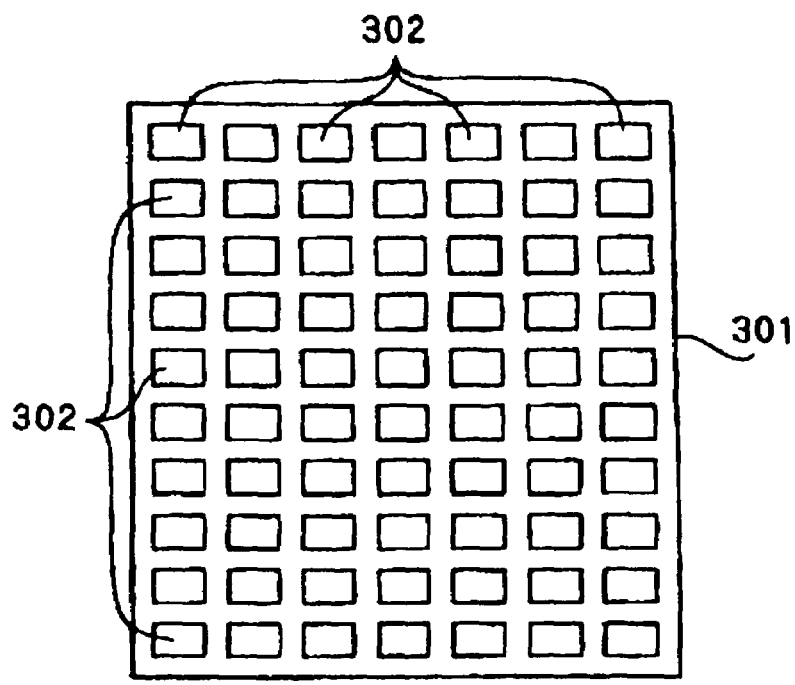
FIGS. 50A to 50C are views showing examples of a manufacturing method for a conventional color filter.
Figure 50B:
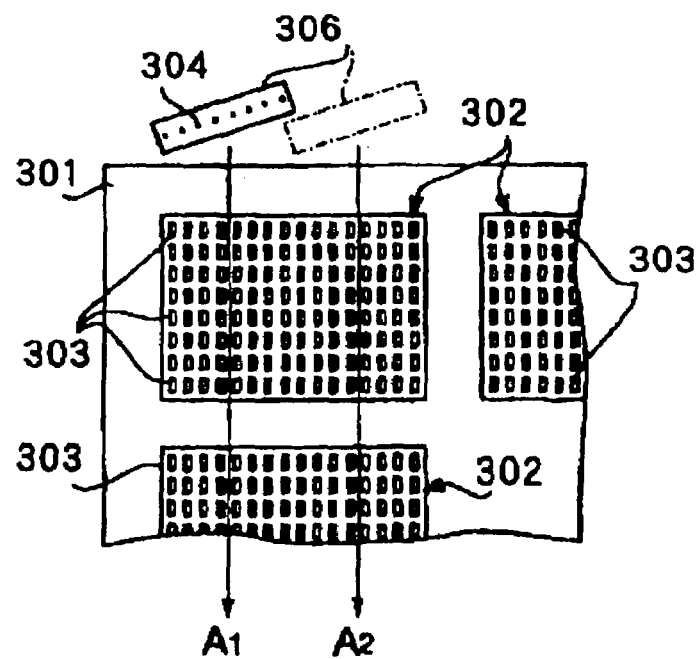
Figure 50C:
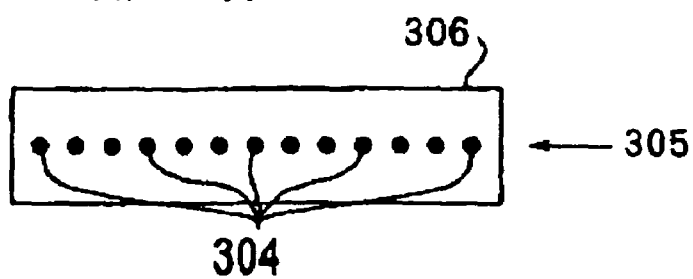
Figure 51A:
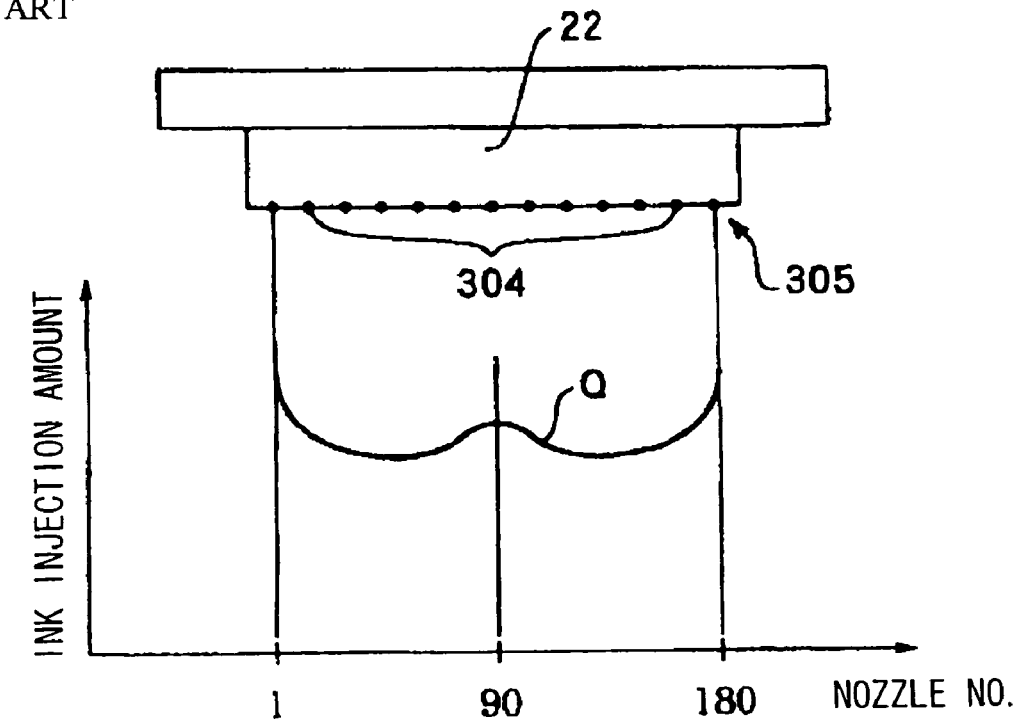
FIGS. 51A and 51B are views for explaining the characteristics of a conventional color filter.
Figure 51B:
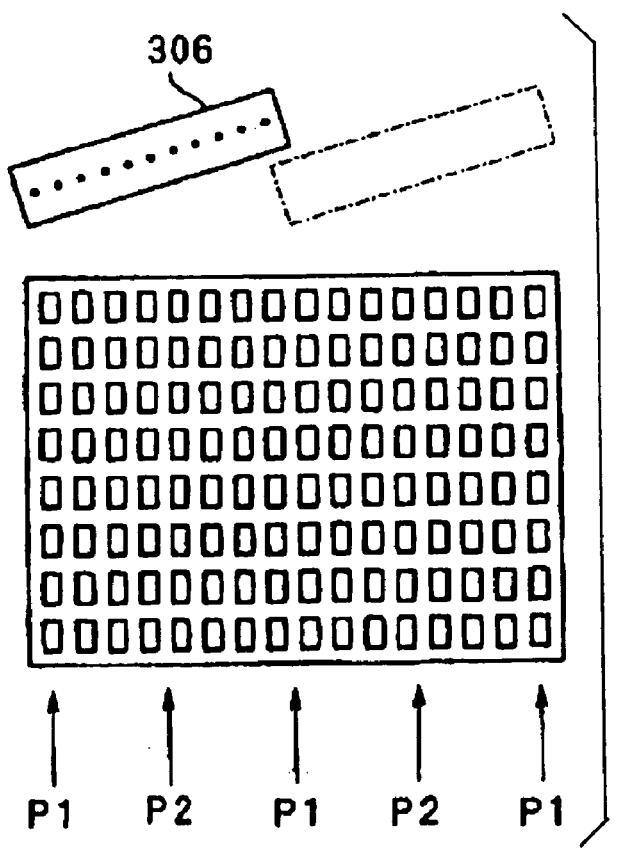

Here, the electronic devices to which an electrooptical apparatus according to the above-explained embodiments is assembled is not limited to a personal computer 490 which is shown in FIG. 48. The electronic devices to which an electrooptical apparatus according to the above-explained embodiments is assembled can be applied to various electronic devices such as a mobile phone device such as a mobile phone 491 or to a PHS (Personal Handyphone System) phonw shown in FIG. 49, an electronic pocketbook device, a pager, a POS (Point of Sales) terminal, an IC card, a mini-disk player, a liquid crystal projector, an EWS (engineering work-station), a word processor, a television, a videotape recorder having a view finder or viewing monitor, an electronic desktop calculator, a car-navigation device, an apparatus having a touch panel, a clock, a game device, or the like.

Additionally, specific structures and process for performing the present invention can be replaced by other structures and processes as long as the objects for the present invention can be achieved. For example, in embodiments shown in FIG. 23, 31, and 32, all of ink jet heads 421 are disposed so as to be directed in one slanted direction. However, it is acceptable that one array among the two arrays be disposed in a direction which is rotated by 90 degrees from slanting angle of the other array. It is acceptable that two arrays of ink jet head are disposed having 90 degrees with respect to each other without crossing each other. It is acceptable for the neighboring head to be disposed so as to be at 90 degrees without crossing each other in each of the ink jet head arrays. As explained above, as long as these modifications do not contradict the purpose of the present invention, it is understood that any modification can be within the scope of the present invention.

What is claimed is:

1. An ejecting apparatus comprising:
    a plurality of liquid drop ejecting heads, each of the heads having a plurality of nozzles aligned with a same interval therebetween for ejecting a fluid liquid material to a substance to cause reception of the ejection, the plurality of nozzles being disposed in a plurality of arrays, each nozzle array having an end-array-nozzle group and a middle-array-nozzle group;
    a holding member for holding the plurality of liquid drop ejecting heads for ejecting the liquid material disposed in line so as to face a surface of the substance to cause reception of the ejection having a space between the surface which has the nozzles and the surface of the substance to cause reception of the ejection;
    a moving member that moves at least one of the holding member or the substance to cause reception of the ejection relatively such that the liquid drop ejecting heads are moved along the surface of the substance to cause reception of the ejection;
    an array of the nozzles being disposed on each of the liquid drop ejecting heads and being disposed in a direction which crosses the substance to cause reception of the ejection diagonally to a direction of relative movement to the substance to cause reception of the ejection, the, plurality of liquid drop ejecting heads being disposed in a staggered manner in a plurality of arrays so that the plurality of liquid drop ejecting heads are disposed in at least two head arrays, the nozzles in the end-array-nozzle group are disposed continuously over a longitudinal length of the head with respect to a direction of each head array, portions of the liquid drop ejecting heads overlap each other in a direction of the head array, and the ejection amount of each nozzle in the end-array-nozzle group, which if not controlled would be greater than an average ejection amount per nozzle by more than 10%, is controlled to be zero: and a controller having a delineating calculating section, the delineating calculating section having: a delineating starting position calculating section; a main scanning controlling calculating section; a sub-scanning control calculating section; and a nozzle ejection control calculating section, the nozzle ejection control calculating section performing calculations so as to control the ejection of the fluid liquid material by determining which nozzle to operate.

2. An ejecting apparatus according to claim 1, a plurality of the liquid drop ejecting heads being disposed in a second direction which crosses the substance to cause reception of the ejection diagonally to a direction of relative movement to the substance to cause reception of the ejection.

3. An ejecting apparatus according to claim 1, the shapes of a plurality of the liquid drop ejecting heads being substantially the same.

4. An ejecting apparatus according to claim 1, each one of a plurality of the liquid drop ejecting heads having the same number of nozzles.

5. An ejecting apparatus according to claim 1, each one of a plurality of the liquid drop ejecting heads having nozzles which are located on the same position as on each other liquid drop ejecting head.

6. An ejecting apparatus according to claim 1, each of a plurality of the liquid drop ejecting heads having nozzles aligned in an array in nearly equal intervals.

7. An ejecting apparatus according to claim 1, the liquid drop ejecting head being formed in nearly a rectangle shape along a direction the nozzles are disposed.

8. An ejecting apparatus according to claim 1, a plurality of the liquid drop ejecting heads being disposed in the second direction which diagonally crosses a direction in which the substance to cause reception of the ejection relatively moves such that the nozzles are disposed nearly parallel with each other.

9. An ejecting apparatus according to claim 1;
the array of nozzles of a plurality of the liquid drop ejecting heads being disposed in a direction which diagonally crosses a direction in which the nozzles move relative to the substance to cause reception of the ejection, and
the array of nozzles of a plurality of the liquid drop ejecting heads being disposed so as to be parallel with each other.

10. An ejecting apparatus according to claim 1, a plurality of the liquid drop ejecting heads neighboring each other being disposed in a direction of a relative movement to the substance to cause reception of the ejection so that portions of the liquid drop ejecting heads overlap each other.

11. An ejecting apparatus according to claim 1 having an ejection detecting device for detecting the liquid material which is ejected from the nozzle.

12. An ejecting apparatus according to claim 11, the ejection detecting device being capable of detecting ejection of the liquid material in at least one of: a step for ejecting the liquid material from the nozzle to the substance to receive the ejection, a previous step, or a subsequent step.

13. An ejecting apparatus according to claim 1, further including
at least one nozzle of the array of nozzles disposed on a first liquid drop ejecting head at an end portion of the array of nozzles being a non-ejecting nozzle that does not eject the fluid liquid material, and at least one nozzle of the array of the nozzles disposed on a second liquid drop ejecting head at an end portion of the array of nozzles being a non-ejecting nozzle that does not eject the fluid liquid material, the non-ejecting nozzles forming a line generally parallel to the direction of relative movement.

14. An ejecting apparatus according to claim 1,
the array of the nozzles on each of the liquid drop ejecting heads being disposed in a line such that when the nozzles cross the substance, the nozzles are capable of ejecting a fluid liquid material at an interval smaller than an interval between the nozzles.

15. An ejecting apparatus according to claim 1, wherein the nozzle ejection control calculating section has an electronic balance for measuring weight of the fluid liquid material ejected from the nozzle.

16. A manufacturing apparatus for an electrooptical apparatus having the ejection apparatus according to claim 1;
the substance to receive the ejection being a base board on which an electroluminescence (EL) layer is formed;
a plurality of the liquid drop ejecting heads being capable of movement relative to the base board;
the liquid material containing the EL member capable of being ejected to the base board from a predetermined nozzle of a plurality of the liquid drop ejecting heads so as to form the EL layer on the base board.

17. A manufacturing apparatus for an electrooptical apparatus having the ejection apparatus according to claim 1;
the substance to cause reception of the ejection being one of a pair of base boards for sandwiching a liquid crystal;
a plurality of the liquid drop ejecting heads capable of movement relative to the one base board;
the liquid material containing a color filter member capable of being ejected to the one base board from a predetermined nozzle of a plurality of the liquid drop ejecting heads so as to form the color filter on the one base board.

18. A manufacturing apparatus for a color filter having the ejection apparatus according to claim 1;
the substance to cause reception of the ejection being a base board on which color filters having different colors are formed;
a plurality of the liquid drop ejecting heads being capable of movement relative to the base board;
the liquid material containing a color filter member capable of being ejected to the base board from a predetermined nozzle of a plurality of the liquid drop ejecting head so as to form the color filter on the base board.

19. A device having a base member and another base member on which a fluid liquid material is ejected, manufactured by an ejection apparatus wherein the ejection apparatus has:
a plurality of liquid drop ejecting heads disposed in a direction which diagonally crosses a direction in which an array of a plurality of the nozzles move relative to the base member, being disposed in a staggered manner in a plurality of arrays, and capable of movement along a surface of the base member relatively such that a surface having the nozzles faces a surface of the base member with a space therebetween, the nozzles being disposed in a plurality of nozzle arrays with a same interval therebetween, each nozzle array having an array-end-nozzle group and a non-array-end-nozzle group, the fluid liquid material capable of being ejected from the nozzles to a predetermined position of the base member, so that the plurality of the liquid drop ejecting heads is disposed in at least two head arrays, the nozzles in the array-end-nozzle group being disposed continuously over a longitudinal length of the heads with respect to a direction of each head array, portions of the liquid drop ejecting heads overlapping each other in a direction of the head array, the ejection amount of each nozzle in the end-array-nozzle group, which if not controlled would be greater than an average ejection amount per nozzle by more than 10%, is controlled to be zero; and a controller having a delineating calculating section, the delineating calculating section having: a delineation starting position calculating section; a main scanning controlling calculating section; a sub-scanning control calculating section; and a nozzle ejection control calculating section, the nozzle ejection control calculating section performing calculations so as to control the ejection of the fluid liquid material by determining which nozzle to operate.

20. A device according to claim 19, further providing the fluid liquid ejection apparatus including at least one nozzle of the array of nozzles disposed on a first liquid drop ejecting head at an end portion of the array of nozzles being a non-ejecting nozzle that does not eject the fluid liquid material, and at least one nozzle of the array of the nozzles disposed on a second liquid drop ejecting head at an end portion of the array of nozzles being a non-ejecting nozzle that does not eject the fluid liquid material, the non-ejecting nozzles forming a line generally parallel to the direction of relative movement.

21. A device according to claim 19, further providing the liquid ejection apparatus including:

the array of the nozzles on each of the liquid drop ejecting heads being disposed in a line such that when the nozzles cross the substance, the nozzles are capable of ejecting a fluid liquid material at an interval smaller than an interval between the nozzles.

22. A device according to claim 19, wherein the nozzle ejection control calculating section has an electronic balance for measuring weight of the fluid liquid material ejected from the nozzle.

23. A manufacturing apparatus for manufacturing a base member having an ejecting apparatus according to claim 1, wherein the substance to cause reception of the ejection is a base member of the device; and the liquid material is capable of being ejected from a plurality of the liquid drop ejecting heads to the base member in a step of forming a predetermined layer on the base member.

* * * * *